US009028959B2

(12) United States Patent
Iwayama et al.

(10) Patent No.: US 9,028,959 B2

(45) Date of Patent: May 12, 2015

(54) COMPOSITE MEMBER

(75) Inventors: Isao Iwayama, Osaka (JP); Yoshihiro Nakai, Osaka (JP); Taichiro Nishikawa, Osaka (JP); Yoshiyuki Takaki, Osaka (JP); Misato Kusakari, Osaka (JP); Toshiya Ikeda, Toyama (JP)

(73) Assignees: Sumitomo Electric Industries, Ltd., Osaka (JP); A. L. M. T. Corp., Tokyo (JP)

( * ) Notice: Subject to any disclaimer, the term of this patent is extended or adjusted under 35 U.S.C. 154(b) by 629 days.

(21) Appl. No.: 13/122,365

(22) PCT Filed: Oct. 2, 2009

(86) PCT No.: PCT/JP2009/005132

§ 371 (c)(1), (2), (4) Date: Jun. 27, 2011

(87) PCT Pub. No.: WO2010/038483

PCT Pub. Date: Apr. 8, 2010

(65) Prior Publication Data

US 2011/0256419 A1 Oct. 20, 2011

(30) Foreign Application Priority Data

| | | | |
|---|---|---|---|
| Oct. 3, 2008 | (JP) | ................................. | 2008-259000 |
| Oct. 8, 2008 | (JP) | ................................. | 2008-261522 |
| Oct. 2, 2009 | (JP) | ................................. | 2009-230338 |
| Oct. 2, 2009 | (JP) | ................................. | 2009-230339 |
| Oct. 2, 2009 | (JP) | ................................. | 2009-230340 |

(51) Int. Cl.

*C04B 41/88* (2006.01)
*B22D 19/14* (2006.01)

(Continued)

(52) U.S. Cl.

CPC ............. *B22D 19/14* (2013.01); *B22F 2998/00* (2013.01); *C22C 1/1068* (2013.01); *C22C 29/065* (2013.01); *C22C 32/0063* (2013.01)

(58) Field of Classification Search

None

See application file for complete search history.

(56) References Cited

U.S. PATENT DOCUMENTS

| | | | | |
|---|---|---|---|---|
| 5,143,795 | A * | 9/1992 | Das et al. | 428/614 |
| 6,186,768 | B1 * | 2/2001 | Schmitt | 425/550 |

(Continued)

FOREIGN PATENT DOCUMENTS

| | | | |
|---|---|---|---|
| CN | 1345467 | A | 4/2002 |
| CN | 101107707 | A | 1/2008 |

(Continued)

OTHER PUBLICATIONS

Chinese Office Action issued in Chinese Patent Application No. 200980139128.3 mailed Sep. 25, 2012.

(Continued)

*Primary Examiner* — Adam Krupicka

(74) *Attorney, Agent, or Firm* — McDermott Will & Emery LLP

(57) ABSTRACT

A composite member suitable for a heat radiation member of a semiconductor element and a method of manufacturing the same are provided. This composite member is a composite of magnesium or a magnesium alloy and SiC, and it has porosity lower than 3%. This composite member can be manufactured by forming an oxide film on a surface of raw material SiC, arranging coated SiC having the oxide film formed in a cast, and infiltrating this coated SiC aggregate with a molten metal (magnesium or the magnesium alloy). The porosity of the composite member can be lowered by improving wettability between SiC and the molten metal by forming the oxide film. According to this manufacturing method, a composite member having excellent thermal characteristics such as a coefficient of thermal expansion not lower than 4 ppm/K and not higher than 10 ppm/K and thermal conductivity not lower than 180 W/m·K can be manufactured.

2 Claims, 10 Drawing Sheets

(I) x 50

100 μm (II) x 500

20 μm

(51) Int. Cl.

| | |
|---|---|
| ***C22C 1/10*** | (2006.01) |
| ***C22C 29/06*** | (2006.01) |
| ***C22C 32/00*** | (2006.01) |

(56) References Cited

U.S. PATENT DOCUMENTS

| | | | | |
|---|---|---|---|---|
| 6,447,894 | B1 * | 9/2002 | Hirotsuru et al. | 428/307.7 |
| 6,933,531 | B1 | 8/2005 | Ishikawa et al. | |
| 2004/0241447 | A1 | 12/2004 | Fukushima | |
| 2008/0122052 | A1 | 5/2008 | Fukui | |
| 2008/0165502 | A1 * | 7/2008 | Furman et al. | 361/709 |

FOREIGN PATENT DOCUMENTS

| | | | |
|---|---|---|---|
| JP | 3-169472 | A | 7/1991 |
| JP | 4-28471 | A | 1/1992 |
| JP | 4-136133 | A | 5/1992 |
| JP | 08-081722 | A | 3/1996 |
| JP | 11-130568 | A | 5/1999 |
| JP | 11-140560 | A | 5/1999 |
| JP | 11-277217 | | 10/1999 |
| JP | 2001-181066 | | 7/2001 |
| JP | 2002-285258 | A | 10/2002 |
| JP | 2003-183748 | | 7/2003 |
| JP | 2006-299304 | | 11/2006 |
| JP | 2007-247058 | | 9/2007 |

OTHER PUBLICATIONS

Japanese Office Action for Japanese Patent Application No. 2008-261522 mailed Aug. 28, 2013, with English translation, 8 pages.

Japanese Office Action issued in Japanese Application No. 2009-230338 mailed Jan. 9, 2014, with English translation, 10 pgs.

Japanese Office Action issued in Japanese Application No. 2009-230339 mailed Jan. 9, 2014, with English translation, 8 pgs.

Chinese Office Action issued in Chinese Application No. 201310279494.7 dated Dec. 5, 2014, with English translation.

* cited by examiner (I) SAMPLE No. I-2-9

500 μm (II) SAMPLE No. I-2-16

500 μm (I) X 50

(II) X 500

X 50

(I) X 50

(II) X 50

(I)

(II)

COMPOSITE MEMBER

RELATED APPLICATIONS

This application is the U.S. National Phase under 35 U.S.C. §371 of International Application No. PCT/JP2009/005132, filed on Oct. 2, 2009, which in turn claims the benefit of Japanese Application No. 2008-259000, filed on Oct. 3, 2008, Japanese Application No. 2008-261522, filed on Oct. 8, 2008, Japanese Application No. 2009-230338, Oct. 2, 2009, Japanese Application No. 2009-230339, filed on Oct. 2, 2009 and Japanese Application No. 2009-230340, filed on Oct. 2, 2009, the disclosures of which Applications are incorporated by reference herein.

TECHNICAL FIELD

The present invention relates to a composite member made of a composite of magnesium (what is called pure magnesium) or a magnesium alloy and a non-metal inorganic material such as SiC and to a method of manufacturing a composite member. In particular, the present invention relates to a composite member suitable for a heat radiation member of a semiconductor element.

BACKGROUND ART

Not only a constituent material composed only of a metal material such as copper but also a composite material made of a metal and a non-metal inorganic material (representatively, ceramics), such as Al—SiC, have been made use of as a constituent material for a heat radiation member (a heat spreader) of a semiconductor element. Mainly aiming to achieve lighter weight of a heat radiation member, a composite material including magnesium (Mg) which is lighter in weight than aluminum (Al) or an alloy thereof as a base material has recently been studied (see Patent Document 1).

Patent Document 1 discloses successful manufacturing with good operability, a composite material excellent in thermal characteristics (high in thermal conductivity and small in difference in coefficient of thermal expansion from a semiconductor element or peripherals thereof) by arranging an aggregate of raw material SiC in a cast (a mold) and infiltrating the aggregate with a molten metal (magnesium) in that state.

PRIOR ART DOCUMENTS

Patent Documents

Patent Document 1: Japanese Patent Laying-Open No. 2006-299304

SUMMARY OF THE INVENTION

Problems to be Solved by the Invention

A composite material made use of as a constituent material for the heat radiation member above is desired to achieve the following:

(1) Further improvement in thermal characteristics;

(2) Improvement in joint characteristics with a cooling apparatus to which a semiconductor element or a heat radiation member is attached; and (3) Larger size.

(1) As to improvement in thermal characteristics

A heat radiation member of a semiconductor element is desired to have excellent thermal conductivity and excellent adaptability in coefficient of thermal expansion with the semiconductor element or peripherals thereof (approximately from 4 ppm/K ($4\times10^{-6}$/K) to 8 ppm/K ($8\times10^{-6}$/K)). Namely, development of a composite material having thermal conductivity equal to or higher than that of the composite material disclosed in Patent Document 1, that has a value further closer to a coefficient of thermal expansion of the semiconductor element or peripherals thereof, such as a value close to approximately 4.5 ppm/K of an insulating substrate or 3.5 ppm/K of a silicon package, has been desired.

Here, pores may be present in the conventional composite material (see paragraph 0003 of Patent Document 1). By decreasing these pores, that is, by lowering porosity of the composite material, improvement in thermal characteristics is expected. Patent Document 1, however, has not sufficiently studied how much porosity should be lowered. In addition, a technique for lowering porosity has not sufficiently been studied either.

Porosity can be lowered by raising an infiltration temperature (a temperature of a molten metal in infiltration). In order to considerably lower porosity (for example, to less than 3%), the infiltration temperature should be set to a temperature exceeding 1000° C., and such a high temperature is highly likely to cause such a defect as a shrinkage cavity or a gas hole at the time of solidification, which leads to deterioration in a casting surface or lowering in thermal characteristics. Therefore, it is difficult to lower porosity and to improve thermal characteristics with a method of raising an infiltration temperature. In addition, the method of raising an infiltration temperature requires a large-scale apparatus for heating in infiltration and a life of a cast (a mold) is also short, which leads to increase in cost.

Alternatively, porosity can be lowered by mixing an infiltration agent such as $SiO_2$ in a raw material. In order to considerably lower porosity (for example, to less than 3%), however, an infiltration agent should be increased. If $SiO_2$ is employed as the infiltration agent, a reaction product such as an Mg—Si compound or an Mg oxide results. Such a product is low in thermal conductivity and hence use of a large amount of $SiO_2$ as the infiltration agent leads to lowering in thermal characteristics attributed to the product above. Therefore, it is again difficult to lower porosity and to improve thermal characteristics with this method.

As another technique for improving thermal characteristics, for example, in further lowering a coefficient of thermal expansion of the composite material above, it is effective to increase a content of a non-metal inorganic material in the composite material. For example, however, with a manufacturing method of filling a cast with non-metal inorganic material powders followed by tapping (providing vibration) or pressing after filling in the cast and infiltrating a gap between particles of the non-metal inorganic material with a molten metal, an amount of powders with which the cast can be filled is limited (see paragraph 0015 of the specification of Patent Document 1). Therefore, the content of the non-metal inorganic material in the composite material obtained with the manufacturing method above is at most 70 volume %.

(2) As to joint characteristics with a semiconductor element or the like

If a semiconductor element should sufficiently be cooled, a heat radiation member and a semiconductor element or a heat radiation member and a cooling apparatus are joined to each other with solder in some cases. The composite material, however, has poor solderability. In addition, Mg or an alloy thereof is poorer than Al in corrosion resistance. Then, one surface (a mount surface on which a semiconductor element is to be mounted) or opposing surfaces (a mount surface and a cooled surface opposed to this mount surface and in contact with a cooling apparatus) of a substrate made of the composite material is (are) plated with nickel (Ni) or the like, in order to enhance solderability or corrosion resistance.

It is difficult, however, to plate the conventional composite material with Ni or the like.

The surface of the composite material has many irregularities because SiC is present in a scattered manner, and it is difficult to uniformly apply plating onto the surface. In order to smoothen the irregularities, the composite material may be subjected to surface polishing or rolling, however, such treatment is also difficult because SiC has high hardness.

In addition, taking into account productivity, electroplating is preferred as plating above, however, SiC present at the surface of the composite material has high electrical insulating property and conduction cannot be achieved. Therefore, electroplating cannot substantially be performed. Though electroless plating can be performed, it is difficult to uniformly apply plating onto the surface because of surface irregularities as described above and in addition cost is increased.

(3) As to a larger size

With more sophisticated functions and higher-density mounting in various electronic devices such as a personal computer and a portable electronic device, the number of semiconductor elements or peripherals thereof mounted on one circuit board tends to increase. A large-sized heat radiation member has accordingly been desired. Though Patent Document 1 discloses a plate member having a size of 50 mm×100 mm as a composite material of Mg or an Mg alloy and SiC or the like, a further larger size has been desired. A method of manufacturing a larger composite material, however, has not conventionally been studied sufficiently. As a result of studies conducted by the present inventors, it was found that a portion where defects are concentrated is formed in a large-sized composite material, which may lead to lowering in grade or lowering in thermal characteristics, as will be described later.

From the foregoing, one object of the present invention is to provide a composite member of Mg or an Mg alloy and SiC, that is low in porosity.

Another object of the present invention is to provide a composite member of Mg or an Mg alloy and SiC, having thermal characteristics suitable for a heat radiation member of a semiconductor element.

In addition, another object of the present invention is to provide a composite member containing an Mg—SiC composite material as a main constituent material, that is readily subjected to electroplating.

Moreover, another object of the present invention is to provide a composite member manufacturing method capable of manufacturing a high-grade composite member of Mg or an Mg alloy and SiC, in spite of its large size.

Additionally, another object of the present invention is to provide a composite member manufacturing method suitable for manufacturing the composite member above.

Means for Solving the Problems

The present inventors found that a magnesium-based composite material having good thermal characteristics is obtained by achieving porosity lower than 3%. In addition, the present inventors found that a magnesium-based composite material low in porosity is obtained by using raw material SiC after it is subjected to a specific treatment or by subjecting a composite solidified substance to a specific treatment, without excessively raising an infiltration temperature and without using $SiO_2$ as an infiltrating agent. The present invention is based on these findings.

A composite member according to the present invention in a first form is a composite member made of a composite of magnesium or a magnesium alloy and SiC, and it is characterized by having porosity lower than 3%.

The composite member according to the present invention in the first form above can be manufactured with a composite member manufacturing method (1-1) or (1-2) according to the present invention shown below.

[Manufacturing Method (1-1)]

The manufacturing method (1-1) is a method of manufacturing a composite member made of a composite of magnesium or a magnesium alloy and SiC, and it includes an oxidation treatment step and a composite step below.

Oxidation treatment step: Heating raw material SiC and forming an oxide film on a surface thereof.

In this oxidation treatment step, the oxide film is formed such that a heating temperature is set to 700° C. or higher and a mass ratio with respect to the raw material SiC above satisfies a ratio not lower than 0.4% and not higher than 1.5%.

Composite step: Arranging coated SiC having the oxide film above formed in a cast and infiltrating an aggregate of the coated SiC in the cast with magnesium or a magnesium alloy molten at a temperature not lower than 675° C. and not higher than 1000° C.

[Manufacturing Method (1-2)]

The manufacturing method (1-2) is a method of manufacturing a composite member made of a composite of magnesium or a magnesium alloy and SiC, and it includes a preparation step and a pressurization step below.

Preparation step: Preparing a composite solidified substance of SiC and magnesium or a magnesium alloy.

Pressurization step: Pressurizing the composite solidified substance above so as to collapse pores present in this composite solidified substance.

In this pressurization step, the composite solidified substance above is pressurized at a temperature not lower than room temperature and lower than a melting point of magnesium or the magnesium alloy above (a liquidus temperature), with a pressure not lower than 1 ton/$cm^2$.

According to the manufacturing method (1-1) in the present invention, the oxide film mainly composed of $SiO_2$ having high magnesium wettability is present on the surface of raw material SiC (powders or molded body). Therefore, as the aggregate of the coated SiC is infiltrated with the molten metal (a melt of magnesium or the magnesium alloy), sufficient contact between the oxide film and the molten metal is achieved and thus the molten metal readily surrounds SiC. Thus, according to the manufacturing method (1-1) in the present invention, pores produced due to insufficient surrounding by the molten metal can effectively be decreased and a composite member having porosity lower than 3% is obtained. In addition, according to the manufacturing method (1-1) in the present invention, by employing coated SiC, $SiO_2$ having high magnesium wettability can be present on the surface of raw material SiC in a concentrated manner and thus $SiO_2$ does not exist excessively in the raw material and a ratio of presence of a reaction product in the obtained composite member can also be lowered. Therefore, according to the manufacturing method (1-1) in the present invention, lowering in thermal characteristics due to presence of the reaction product is suppressed and a composite member having excellent thermal characteristics is obtained.

According to the manufacturing method (1-2) in the present invention, pores can positively be eliminated by pressing the composite solidified substance under a specific condition and hence a composite member low in porosity is obtained. In particular, according to the manufacturing method (1-2) in the present invention, regardless of presence/absence of an infiltration agent ($SiO_2$), a composite member having porosity not higher than 5% and in particular lower than 3% is obtained. In a case where an infiltration agent ($SiO_2$) is not employed in the manufacturing method (1-2) in the present invention, an amount of generated reaction product which becomes a factor of lowering in thermal characteristics can effectively be reduced.

In addition, according to the manufacturing method (1-1), (1-2) in the present invention, since it is not necessary to excessively heat the molten metal, such defects as a shrinkage cavity and a gas hole are less likely in the composite member and deterioration in thermal characteristics attributed to these defects is less likely. Therefore, according to the manufacturing method (1-1), (1-2) in the present invention, a composite member having excellent thermal characteristics is obtained.

The composite member according to the present invention in the first form above has very low porosity and excellent thermal characteristics. In particular, being manufactured with the manufacturing method (1-1) or (1-2) according to the present invention described above, the composite member according to the present invention in the first form is less in lowering in thermal characteristics attributed to a reaction product or presence of a shrinkage cavity or a gas hole, and excellent in thermal characteristics.

Further, the present inventors found that thermal characteristics of a composite material can be improved by satisfying at least one of fabricating a composite material having a network portion, for example, by making use of an SiC aggregate having a network portion bonding SiC to each other, and increasing a content of SiC in the composite material by making use of the SiC aggregate formed with a specific method. The present invention is based on the finding above.

The composite member according to the present invention in a second form is a composite member made of a composite of magnesium or a magnesium alloy and SiC, and it has a coefficient of thermal expansion (a coefficient of linear thermal expansion) not lower than 4 ppm/K and not higher than 8 ppm/K. In particular, the composite member according to the present invention has a network portion containing 50 volume % or more SiC above and bonding SiC above to each other. Other forms of the composite member having a coefficient of thermal expansion not lower than 4 ppm/K and not higher than 8 ppm/K include a form having no network portion and containing more than 70 volume % SiC above.

The composite member according to the present invention in which the SiC aggregate in the composite member has the network portion above or the composite member containing a very large amount of SiC such as more than 70 volume % (hereinafter referred to as a high SiC composite member) can be lower in coefficient of thermal expansion than a conventional composite material, and it can substantially be equal in coefficient of thermal expansion to a semiconductor element or peripherals thereof (approximately from 4 ppm/K to 8 ppm/K). In particular, as these composite members are mainly composed of a material such as SiC higher in thermal conductivity than Mg, they are high in thermal conductivity and in addition a continuous pathway (path) for heat conduction is formed therein by such a metal as magnesium. Thus, they are excellent in heat radiation characteristics. The composite member according to the present invention, which is a composite of a non-metal inorganic material such as SiC and a metal material, or a high SiC composite member described above has a low coefficient of thermal expansion adapted to a semiconductor element or the like, and also has excellent heat radiation characteristics and can suitably be made use of for a heat radiation member of a semiconductor element.

Meanwhile, there is normally a pore (air) in a gap between non-metal inorganic materials in a member composed only of a non-metal inorganic material and there are fewer continuous paths for thermal conduction above. In contrast, in the composite member according to the present invention or in the high SiC composite member described above, since the gap above is filled with such a metal as magnesium higher in thermal conductivity than air, the entire composite member serves as a continuous path for heat conduction and it is excellent in thermal conductivity. In addition, there is a dense sintered body having relative density of approximately 99% as a member composed of a non-metal inorganic material. Even though such a dense sintered body is compared with the composite member according to the present invention or with the high SiC composite member described above, however, a composite member containing such a metal as magnesium is advantageous in that (1) there are many continuous paths for heat conduction and thermal conductivity is high, (2) a coefficient of thermal expansion can be adjusted by adjusting a content or composition of magnesium or the like, (3) plating with Ni or the like is readily applied or chipping is readily prevented because of ease in obtaining a smooth surface, as described above, and in addition (4) manufacturing cost is low.

Moreover, the composite member according to the present invention in the second form or the high SiC composite member described above is excellent in adaptability in coefficient of thermal expansion to a semiconductor element or peripherals thereof. Therefore, since thermal stress caused in a portion of joint to a semiconductor element or the like is small and prescribed joint strength can be maintained, reliability of a semiconductor device including a heat radiation member can be enhanced. Further, since the composite member according to the present invention in the second form or the high SiC composite member described above is excellent in thermal conductivity as described above, it enhances reliability as a heat radiation member and in addition the heat radiation member can be reduced in size, thus contributing also to reduction in size of a semiconductor device.

The high SiC composite member above can be manufactured, for example, with the following composite member manufacturing method. This composite member manufacturing method is a method for manufacturing a composite member made of a composite of magnesium or a magnesium alloy and SiC, and it includes a molding step and a composite step below. This manufacturing method will be referred to as an SiC high-density filling method hereinafter.

Molding step: Step of forming an SiC aggregate by using any one of slip casting, pressure forming and a doctor blade method.

Composite step: Step of forming the composite member containing more than 70 volume % SiC above by infiltrating the SiC aggregate above accommodated in a cast with molten magnesium or magnesium alloy in an atmosphere at a pressure not higher than an atmospheric pressure.

The composite member according to the present invention in the second form above can be manufactured, for example, with the following composite member manufacturing method according to the present invention. A composite member manufacturing method according to the present invention is a method for manufacturing a composite member made of a composite of magnesium or a magnesium alloy and SiC, and it includes a molding step, a sintering step and a composite step below. This manufacturing method will be referred to as a sintering method hereinafter.

Molding step: Step of forming an SiC powder molded body.

Sintering step: Step of sintering the powder molded body to form an SiC aggregate having a network portion bonding SiC to each other.

Composite step: Step of forming the composite member having the network portion above and containing 50 volume % or more SiC above by infiltrating the SiC aggregate accommodated in a cast with molten magnesium or magnesium alloy in an atmosphere at a pressure not higher than an atmospheric pressure.

Alternatively, as a method of manufacturing the composite member according to the present invention in the second form above, a composite member manufacturing method of manufacturing a composite member made of a composite of magnesium or a magnesium alloy and SiC, including a molding step, a bonding step and a composite step below is exemplified. This manufacturing method will be referred to as a sol-gel method hereinafter.

Molding step: Step of forming an SiC powder molded body.

Bonding step: Step of impregnating the powder molded body above with a solution of a precursor of a non-metal inorganic material followed by heating, generating a non-metal inorganic material based on the precursor above, and forming an SiC aggregate in which SiC above is bonded to each other by a network portion composed of the generated non-metal inorganic material.

Composite step: Step of forming the composite member having the network portion above and containing 50 volume % or more SiC above by infiltrating the SiC aggregate above accommodated in a cast with molten magnesium or magnesium alloy in an atmosphere at a pressure not higher than an atmospheric pressure.

Alternatively, as another manufacturing method of manufacturing the composite member according to the present invention in the second form above, a composite member manufacturing method of manufacturing a composite member made of a composite of magnesium or a magnesium alloy and SiC, including a molding step and a composite step below is exemplified. This manufacturing method will be referred to as a reaction bonding method hereinafter.

Molding step: Step of forming a powder molded body by using a powder mixture of SiC powders and powders for reaction containing at least one of boron and oxygen.

Composite step: Infiltrating the powder molded body above accommodated in a cast with molten magnesium or magnesium alloy in an atmosphere at a pressure not higher than an atmospheric pressure. In addition, generating a product composed of a new non-metal inorganic material through reaction between the powders for reaction above and a molten magnesium component so as to bond SiC above to each other. Then, a step of forming a composite member having a network portion composed of this new product and containing 50 volume % or more SiC above.

Alternatively, as another manufacturing method of manufacturing the composite member according to the present invention in the second form above, a composite member manufacturing method of manufacturing a composite member made of a composite of magnesium or a magnesium alloy and SiC, including a molding step, a sintering step and a composite step below is exemplified. This manufacturing method will be referred to as a reaction sintering method hereinafter.

Molding step: Step of forming a powder molded body by using a powder mixture of SiC powders and precursor powders for generating an oxide or a nitride through reaction to nitrogen or oxygen.

Sintering step: Sintering the powder molded body above in a nitrogen atmosphere or in an oxygen atmosphere and generating the nitride or the oxide above through reaction between the precursor powders above and nitrogen or oxygen. Then, a step of forming an SiC aggregate in which SiC above is bonded to each other by a network portion composed of this product.

Composite step: Step of forming the composite member having the network portion above and containing 50 volume % or more SiC above by infiltrating the SiC aggregate above accommodated in a cast with molten magnesium or magnesium alloy in an atmosphere at a pressure not higher than an atmospheric pressure.

By forming an SiC aggregate with a specific method or by forming an SiC aggregate of which SiC filling rate was increased, such as a sintered body, as described above, a high-density SiC aggregate can readily be manufactured. Then, by making a composite of such a high-density SiC aggregate and molten magnesium or magnesium alloy (hereinafter referred to as molten Mg), a composite member containing more than 70 volume % SiC can readily be manufactured. In addition, by forming an SiC aggregate having a network portion bonding SiC to each other or by forming the network portion above during infiltration, the composite member according to the present invention in the second form in which the network portion above is present can readily be manufactured. The obtained composite member has a coefficient of thermal expansion satisfying 4 ppm/K to 8 ppm/K.

In particular, as compared with the SiC high-density filling method above, the sintering method or the sol-gel method above is advantageous in that (1) a composite member low in coefficient of thermal expansion and high in thermal conductivity is obtained because the composite member having the network portion above is obtained, (2) a composite member containing more SiC can readily be manufactured, and (3) the SiC aggregate having the network portion above has high strength and arrangement thereof in a cast or the like is easy. Moreover, by forming the powder molded body in the sintering method or the sol-gel method above with a method predefined in the SiC high-density filling method above, a dense SiC aggregate is obtained. By making use of such an SiC aggregate, a composite member further higher in SiC content and excellent in thermal characteristics is obtained.

In particular, in the sintering method above, sintering is carried out such that SiC is directly bonded to each other, that is, the network portion is composed of SiC. Then, the non-metal inorganic material present in the composite member is substantially SiC alone. Since SiC is particularly high in thermal conductivity, this composite member has high thermal conductivity.

In particular, in the sol-gel method above, though a solution of a precursor is necessary, a network portion can be formed by heating to a temperature lower than a sintering temperature in the sintering method above or a network portion can be formed at room temperature without any heating depending on a type of a solution. Alternatively, by making use of a precursor with which SiC particularly high in thermal conductivity among non-metal inorganic materials is generated and by forming a network portion with SiC, a composite member high in thermal conductivity is obtained as described above.

Meanwhile, with the reaction bonding method above, a composite member having the network portion above can readily be manufactured without including a sintering step or a separate heating step, and in addition, a network portion can be generated simultaneously with making a composite of the SiC aggregate and molten Mg. Therefore, the reaction bonding method is excellent also in manufacturability of a composite member. With the reaction sintering method above, a network portion can be generated even if a sintering temperature is lower than in a case where sintering is performed such that SiC is directly bonded to each other. With the reaction bonding method or the reaction sintering method, a network portion may be composed of a non-metal inorganic material lower in thermal conductivity than SiC. Therefore, considering improvement in thermal conductivity, the sintering method or the sol-gel method above is preferred.

Alternatively, the composite member according to the present invention in the second form can be formed also by preparing a commercially available SiC sintered body and infiltrating this SiC sintered body with molten Mg. An SiC sintered body having an SiC content in the composite member not lower than 50 volume % and having a network portion that can be present in the composite member and open pores for infiltration with molten Mg should be selected as appropriate as the SiC sintered body above.

In addition, the present invention proposes, as a composite member to which electroplating is readily applied, a form including a metal coating layer on at least one surface of a substrate composed of a composite material. A composite member according to the present invention in a third form includes a substrate composed of a composite material made of a composite of magnesium or a magnesium alloy and SiC and a metal coating layer covering at least one surface of this substrate. The substrate above contains 50 volume % or more SiC.

According to the composite member in the present invention in the third form, one surface of the substrate composed of the composite material is covered with the metal coating layer having conductivity, and hence conduction is achieved. Therefore, electroplating can be applied. In addition, at least one surface of the substrate including the metal coating layer will have less irregularities attributed to presence of SiC, and thus uniform plating is more likely to be achieved. Moreover, since uniform plating can be applied, this composite member can achieve enhanced solderability and also enhanced corrosion resistance. Therefore, the composite member according to the present invention in the third form can suitably be made use of as a heat radiation member.

The composite member according to the present invention in the third form above can be manufactured, for example, with the following manufacturing method. This manufacturing method is a method of manufacturing a composite member including a substrate composed of a composite material made of a composite of magnesium or magnesium alloy above and SiC by infiltrating an SiC aggregate accommodated in a cast with molten magnesium or magnesium alloy. In particular, in this manufacturing method, an unfilled region not filled with SiC is provided between the cast above and the SiC aggregate above and a metal is caused to be present in this unfilled region, so that this metal forms the metal coating layer covering at least one surface of the substrate above. This manufacturing method is hereinafter referred to as a composite integration method.

Alternatively, the following method is exemplified as another manufacturing method of manufacturing the composite member according to the present invention in the third form above. The composite member manufacturing method according to the present invention is a method of manufacturing a composite member including a substrate composed of a composite material made of a composite of magnesium or magnesium alloy above and SiC by infiltrating an SiC aggregate accommodated in a cast with molten magnesium or magnesium alloy. In particular, this manufacturing method according to the present invention includes a metal coating layer formation step of stacking a metal plate on the substrate above and pressurizing this stack with a pressure not lower than 0.5 ton/$cm^2$ while this stack is heated to a temperature not lower than 300° C. This manufacturing method is hereinafter referred to as a hot pressing method.

The composite member according to the present invention in the third form including the metal coating layer can readily be manufactured with the manufacturing method above (the composite integration method, the hot pressing method).

Additionally, in order to study problems arising in manufacturing a large-sized heat radiation member, the present inventors fabricated an infiltrated plate by infiltrating a plate-shaped composite member having such a size as exceeding 50 mm×100 mm, specifically, a sufficient size from which a circular region having a diameter exceeding 50 mm can be taken, and made of a composite of Mg or an Mg alloy and a non-metal inorganic material, with the use of an infiltration method as described in Patent Document 1 (a method of infiltrating a non-metal inorganic material, with which a cast is filled, with molten Mg or Mg alloy (hereinafter referred to as molten Mg) and thereafter solidifying molten Mg), and gradually cooled the infiltrated plate in an atmosphere furnace. Then, the obtained plate-shaped composite member was cut in a direction of thickness thereof and the cross-section was observed. Then, defects were present in a concentrated manner in a central portion of the composite member and substantially no defect was observed in a peripheral portion. More specifically, a large void (pore) caused by a shrinkage cavity (an internal shrinkage cavity) was observed in the inside of the central portion above. In addition, external shrinkage cavities or irregularities were also observed on a surface of the central portion of the composite member above. The reason why defects were locally caused as such is estimated as follows.

By gradually cooling the infiltrated plate above, solidification of molten Mg proceeds in such a manner as converging from a periphery thereof toward the central portion and from the surface to the inside. Then, a hot spot (a region of an unsolidified metal surrounded by a solidified metal) may be produced in the inside of the central portion above. Here, Mg or the Mg alloy decreases in volume by approximately 4% when it solidifies. Therefore, solidification proceeds in such a manner that unsolidified Mg or Mg alloy compensates for decrease in volume caused by solidification. Then, when the metal not in a solid solution state in the hot spot in the central portion above is solidified, a state is such that Mg or the Mg alloy is short due to compensation above and thus compensation as described above is not carried out. Consequently, it is considered that defects are less likely in the peripheral portion of the plate-shaped composite member but a large void is likely to be formed in the central portion. In addition, even though molten Mg at a surface portion in the central portion above has already solidified, pulling toward the inside occurs due to decrease in volume at the time of solidification of the unsolidified portion inside. Therefore, it is considered that an external shrinkage cavity is caused at the surface of the central portion above or irregularities conforming to an outer geometry of a non-metal inorganic material used as a raw material are produced due to the shrinkage at the surface. Then, if large defects as described above are present in a concentrated manner in the inside of the composite member, such mechanical characteristics as strength or thermal characteristics such as thermal conductivity are lowered. Here, in a case where a plate-shaped composite member is made use of as a heat radiation member of a semiconductor element, normally, a semiconductor element or the like is mounted on the central portion of the composite member. Therefore, a composite member in which defects are concentrated in a portion where a semiconductor element is to be mounted is not suitable for a heat radiation member. Meanwhile, presence of such a surface defect as an external shrinkage cavity as described above in an outer portion of the composite member leads to deterioration in surface property or lowering in dimension accuracy. In particular, since the composite material of such a non-metal inorganic material as SiC and a metal contains SiC cooled more readily than the molten metal, an internal defect or a surface defect above is more likely than in a case where only the molten metal is used to form a cast member composed only of metal.

The present inventors found that, in order to decrease local defects above, cooling in one direction from one peripheral portion of the infiltrated plate toward the other opposing peripheral portion instead of convergent cooling of the infiltrated plate from the periphery toward the central portion is effective. The present invention is based on the finding above.

A composite member manufacturing method according to the present invention is a method of manufacturing a composite member made of a composite of magnesium or a magnesium alloy and SiC, and it includes an infiltration step and a cooling step below. This manufacturing method is hereinafter referred to as a one-direction cooling method.

Infiltration step: Step of forming an infiltrated plate by infiltrating an SiC aggregate accommodated in a cast with molten magnesium or magnesium alloy.

Cooling step: Step of cooling the infiltrated plate above in one direction from a side of the infiltrated plate above opposite to a side of supply of the molten magnesium or magnesium alloy above so as to solidify the molten magnesium or magnesium alloy above.

Representatively, in the infiltration step above, the molten magnesium or magnesium alloy above is supplied to the aggregate above in a direction of gravity by its own weight, that is, from an upper side in a vertical direction toward a lower side in the vertical direction. Then, in the cooling step above, cooling of the infiltrated plate above in one direction from the lower side of the infiltrated plate in the vertical direction toward the upper side thereof in the vertical direction, to thereby solidify the molten magnesium or magnesium alloy above, is exemplified.

The composite member manufacturing method according to the present invention above can naturally be made use of for manufacturing a small-sized composite member from which a circular region having a diameter not greater than 50 mm can be taken, however, in particular, it can suitably be made use of for a case of manufacturing a composite member having a sufficient size from which a circular region having a diameter exceeding 50 mm can be taken. In this case, the infiltrated plate above should only have a sufficient size from which a circular region having a diameter exceeding 50 mm can be taken.

In addition, according to the composite member manufacturing method in the present invention above, for example, a composite member according to the present invention in a fourth form below is obtained. This composite member is a plate member made of a composite of magnesium or a magnesium alloy and SiC, and it has a sufficient size from which a circular region having a diameter exceeding 50 mm can be taken. Then, with a straight line passing through the center of gravity when the composite member is two-dimensionally viewed being defined as a section line, a cross-section in a direction of thickness of the composite member is taken. A range in this cross-section extending over up to 10% of a length of the section line along a longitudinal direction of the section is defined as a central region (this central region will hereinafter be referred to as a central region (defect)), with the center of gravity serving as a center. Any small region of 1 mm×1 mm is taken from this central region (defect), and when a ratio of an area of a defect portion with respect to an area of the small region is defined as an area ratio, the composite member has the area ratio above not higher than 10%.

As the direction of supply of molten Mg is set, for example, to the direction of gravity as described above in the manufacturing method according to the present invention above (the one-direction cooling method), molten Mg not in a solid solution state in the infiltrated plate above unexceptionally moves from the upper side in the vertical direction (representatively, an open side of a cast) toward the lower side in the vertical direction (representatively, a bottom surface side of the cast) by its own weight. When the infiltrated plate above is cooled in one direction from the lower side in the vertical direction toward the upper side in the vertical direction in this state, unsolidified Mg on the upper side is successively supplied to the lower side as molten Mg on the lower side solidifies. Namely, solidification proceeds toward the upper side in the vertical direction while volume decrease at the time of solidification of molten Mg on the lower side in the vertical direction above is successively compensated for by unsolidified molten Mg present on the upper side in the vertical direction above. Therefore, with this manufacturing method, as in convergent cooling from the periphery of the infiltrated plate toward the central portion as described above, concentration of large defects in the central portion (a portion including the central region (defect) above) of the composite member is unlikely. Thus, according to the composite member in the present invention in the fourth form obtained by setting the cooling direction to one specific direction, large defects are not present in a concentrated manner and the composite member is of high grade. In addition, the composite member according to the present invention in the fourth form above manufactured with the manufacturing method according to the present invention (the one-direction cooling method) has a small defect portion such as a void attributed to an internal shrinkage cavity in the central portion including the central region (defect) above, in spite of being a large-sized plate member having a sufficient size from which a circular region having a diameter exceeding 50 mm can be taken. Thus, the composite member according to the present invention in the fourth form in which no large defect is locally present is excellent in such mechanical characteristics as strength or such thermal characteristics as thermal conductivity, and additionally it can sufficiently have an area for mounting a semiconductor element or peripherals thereof. Therefore, this composite member can suitably be made use of for a heat radiation member in the semiconductor element above.

The present invention will be described hereinafter in further detail.

[Composite Member]

As a form of the composite member according to the present invention, a form including a substrate alone composed of a composite material made of a composite of magnesium or a magnesium alloy and a non-metal inorganic material (mainly SiC) and a form including the substrate above and a metal coating layer covering at least one surface of this substrate are exemplified. Initially, the substrate above will be described.

(Substrate)

<Metal Component>

What is called pure magnesium composed of 99.8 mass % or more Mg and an impurity or a magnesium alloy composed of an added element and remainder Mg and an impurity is adopted as a metal component in the substrate above. A case where pure magnesium is adopted as the metal component above is more advantageous than a case where an alloy is adopted in that (1) thermal conductivity of the composite member is enhanced and (2) the composite material having a uniform texture is readily obtained because such a disadvantage as non-uniform precipitation of a crystallized product at the time of solidification is less likely. In a case where the magnesium alloy is adopted as the metal component above, a liquidus temperature becomes lower and thus a temperature in melting can be lowered, and in addition corrosion resistance and mechanical characteristics (such as strength) of the composite member can be enhanced. At least one of Li, Ag, Ni, Ca, Al, Zn, Mn, Si, Cu, and Zr is exemplified as the added element. Increase in content of these elements leads to lowering in thermal conductivity, and therefore these elements are preferably not more than 20 mass % in total (assuming the metal component as 100 mass %; to be understood similarly hereinafter as to the content of the added element). In particular, preferably, Al is not more than 3 mass %, Zn is not more than 5 mass %, and each of other elements is not more than 10 mass %. Addition of Li is effective for lighter weight of the composite member and improvement in workability. A known magnesium alloy such as AZ-type, AS-type, AM-type, ZK-type, ZC-type, or LA-type may be employed. A metal raw material is prepared so as to attain a desired composition.

<Non-Metal Inorganic Material>

<<Composition>>

A non-metal inorganic material lower in coefficient of thermal expansion than Mg, excellent in thermal conductivity, and less likely to react to Mg is exemplified as a non-metal inorganic material in the substrate above. Such ceramics as SiC is representative of such non-metal inorganic materials. Other than the above, at least one of $Si_3N_4$, Si, MgO, $Mg_3N_2$, $Mg_2Si$, $MgB_2$, $MgCl_2$, $Al_2O_3$, AlN, CaO, $CaCl_2$, $ZrO_2$, diamond, graphite, h-BN, c-BN, $B_4C$, $Y_2O_3$, and NaCl can be exemplified. In particular, SiC is adopted in the present invention, because SiC (1) has a coefficient of thermal expansion approximately from 3 ppm/K to 4 ppm/K which is close to a coefficient of thermal expansion of a semiconductor element or peripherals thereof, (2) has particularly high thermal conductivity among non-metal inorganic materials (single crystal: approximately from 390 W/m·K to 490 W/m·K), (3) is commercially available as powders or sintered bodies in various shapes and sizes, and (4) has high mechanical strength. The present invention permits non-metal inorganic materials listed above other than SiC to be contained. Namely, the composite member according to the present invention may contain a plurality of types of non-metal inorganic materials above.

The non-metal inorganic material other than SiC is present, for example, as a network portion.

<<Shape>>

SiC in the composite member according to the present invention is present representatively in a form randomly dispersed in magnesium or a magnesium alloy (hereinafter referred to as a dispersed form) or in a form bonded by the network portion (hereinafter referred to as a bonded form). In particular in the bonded form having the network portion, such a form that SiC as a whole is continuous as being bonded by the network portion and a gap between SiC and SiC is filled with magnesium or a magnesium alloy, that is, a porous body which will have open pores if magnesium or the magnesium alloy should be removed, is preferred. In particular, this porous body is preferably has fewer closed pores. Specifically, preferably, a ratio of closed pores to the total volume of the non-metal inorganic material in the composite member is not higher than 10 volume % and preferably not higher than 3 volume %.

Regarding the non-metal inorganic material such as SiC in the composite member, the non-metal inorganic material used as the raw material is present substantially as it is. For example, in a case where powders of the non-metal inorganic material are made use of as the raw material, they are in the dispersed form above. In a case where a molded body of the non-metal inorganic material above, in particular, a porous molded body having a network portion bonding particles to each other through heating or the like of the powder molded body, is made use of as the raw material, the non-metal inorganic material is in the bonded form above or in the dispersed form above due to collapse or the like of the network portion in the molded body above at the time of infiltration. By adjusting a sintering condition or the like as appropriate, a state of presence of the non-metal inorganic material in the substrate can be varied.

For example, when a porous body having few closed pores as described above is made use of as the raw material SiC aggregate, a path for impregnation with molten Mg can sufficiently be ensured and the obtained composite member itself has fewer pores because the open pores above are filled with molten Mg. Fewer pores lead to higher thermal conductivity of this composite member. A shape of a mold to be filled with raw material powders or a shape of the porous body above as a whole to be made use of as the raw material is preferably selected as appropriate such that the composite member (substrate) has a prescribed shape. Presence of a network portion or a ratio of closed pores in the composite member can be checked or measured, for example, by observing a cross-section of the composite member with an optical microscope or a scanning electron microscope (SEM).

<<Content>>

If the content of SiC in the substrate above is not less than 20 volume % with this substrate being assumed as 100 volume %, a substrate high in thermal conductivity $\kappa$ and low in coefficient of thermal expansion (a coefficient of linear thermal expansion) $\alpha$ can be obtained. As the content of SiC in the substrate is greater, thermal conductivity $\kappa$ tends to become higher and coefficient of thermal expansion $\alpha$ tends to be lower, and hence adaptability in coefficient of thermal expansion to a semiconductor element (approximately from 4 ppm/K to 8 ppm/K (for example, Si: 4.2 ppm/K, GaAs: 6.5 ppm/K)) or peripherals thereof (an insulating substrate: approximately 4.5 ppm/K, a silicon package: approximately 3 ppm/K, an alumina package: 6.5 ppm/K, a metal package (stainless steel (around 20 ppm/K), steel (11 to 12 ppm/K))) is likely to be obtained. Therefore, the SiC content is preferably not lower than 50 volume % in any form of the bonded form and the dispersed form above. More preferably, the SiC content is not lower than 55 volume %, particularly preferably not lower than 70 volume %, further preferably not lower than 75 volume %, preferably not lower than 80 volume % among others, and still further preferably not lower than 85 volume %. The upper limit of the SiC content is not particularly provided. If the SiC content exceeds 90 volume %, large pressurization force is required in forming a high-density SiC aggregate to be used as the raw material or formation of closed pores is more likely in a subsequent step such as sintering, which may lead to an SiC aggregate in which closed pores occupy more than 10 volume %. Therefore, taking into account industrial productivity and infiltration performance with molten Mg, the SiC content approximately from 80 volume % to 90 volume % is considered as practical. In the bonded form having a network portion, the SiC content is set to 50 volume % or higher. In the high SiC composite member in the dispersed form not having a network portion, the SiC content is set to more than 70 volume %.

The composite member (substrate) containing more than 50 volume % SiC has high thermal conductivity κ satisfying 180 W/m·K. Although depending on the SiC content, the form of a network portion, composition of the metal component, or the like, the composite member having thermal conductivity κ not lower than 200 W/m·K, particularly not lower than 250 W/m·K and further not lower than 300 W/m·K can be obtained.

In addition, if the SiC content in the composite member (substrate) is not lower than 50 volume % and not higher than 80 volume %, it is likely that a coefficient of thermal expansion from $4\times10^{-6}$ to $10\times10^{-6}$/K (4 to 10 ppm/K) is satisfied. If the content exceeds 80 volume %, it is likely that the coefficient of thermal expansion is lower than 4 ppm/K and such a composite member is likely to well adapt to a semiconductor element or the like further lower in coefficient of thermal expansion.

Since the content of a non-metal inorganic material in the composite member is substantially equal to an amount of a raw material, an amount of a raw material is preferably selected as appropriate such that the composite member (substrate) has desired thermal characteristics.

<<Purity>>

If high-purity SiC is used as raw material SiC and purity of SiC present in the composite member is high such as 95% or higher and particularly 99% or higher, characteristics of SiC can sufficiently be made use of. In addition, use of highly crystalline SiC is likely to bring about higher thermal conductivity of the composite member.

<<Material for Network Portion>>

In a case where the non-metal inorganic material in the composite member has a network portion, a metal material such as Mo in addition to the non-metal inorganic material such as SiC is exemplified as a constituent material for the network portion. In a case where the network portion is also composed of SiC, this composite member is substantially composed of SiC and magnesium (or the magnesium alloy), and it has excellent heat radiation characteristics as described above. A silicon nitride ($Si_3N_4$), a magnesium compound (such as $MgB_2$, MgO or $Mg_3N_2$), other nitrides (such as BN and AlN), and oxides (such as CaO) are exemplified as other non-metal inorganic materials forming a network portion. In particular, $Si_3N_4$ has a low coefficient of thermal expansion and a composite member low in coefficient of thermal expansion can be obtained.

<<Thickness of Network Portion>>

The present inventors examined a composite member including a network portion. Then, even though the SiC content in the composite member was equivalent, thermal characteristics were different. As a result of investigation of the cause, the form of the network portion in the composite member was different. Specifically, with any line segment having a prescribed length being taken in a cross-section of the composite member, a length of a portion where a contour line of an SiC aggregate constituted of SiC and the network portion crosses the line segment above, that is, a length between adjacent intersections, that are intersections between the contour line above and the line segment above, was different. A composite member longer in length between the intersections above, that is, a composite member having a thick network portion, tends to be excellent in thermal characteristics and in particular low in coefficient of thermal expansion. A composite member shorter in length between the intersections above, that is, a composite member having a thin network portion, tends to be excellent in mechanical characteristics and in particular high in tensile strength or bending strength. Then, a thick network portion is defined as a construction excellent in thermal characteristics. Specifically, as the network portion becomes thicker, the number of intersections in the line segment above decreases. Therefore, taking any line segment having a length of 1 mm with respect to an actual dimension of the composite member in the cross-section of the composite member, a composite member in which the number of intersections between the contour line of the SiC aggregate constituted of SiC above and the network portion above and the line segment above satisfies a value not larger than 50 is proposed. Since it is expected that a smaller number of intersections above leads to further superior thermal characteristics, the lower limit of the number of intersections above is not particularly set. Meanwhile, when the number of intersections above exceeds 50 and particularly it is 100 or more, further superior mechanical characteristics are expected. In order to change a thickness of the network portion above, for example, adjustment of a manufacturing condition or the like which will be described later is exemplified.

<Thickness of Substrate>

A thickness of the substrate above can be selected as appropriate. In a case where this substrate is made use of as a heat radiation member of a semiconductor element, the thickness is preferably not larger than 10 mm and particularly preferably not larger than 5 mm. When the substrate has a thickness approximately not larger than 10 mm, a substrate not including a metal coating layer which will be described later, in particular a substrate containing a large amount of SiC such as more than 70 volume % or a substrate having a network portion, can have a coefficient of thermal expansion approximately from 4 ppm/K to 6 ppm/K.

<Texture>

<<Porosity>>

The composite member according to the present invention in the first form obtained with the manufacturing method (1-1) according to the present invention in which wettability between a molten metal and SiC has been enhanced or with the manufacturing method (1-2) according to the present invention in which pores are collapsed and eliminated has low porosity. Specific porosity is lower than 3%, preferably lower than 1%, and further preferably lower than 0.5%. Desirably, no pore is present, and ultimately porosity of 0% is desired. A method of measuring porosity will be described later.

<<Oxygen Concentration>>

An oxide film was positively formed on raw material SiC and a thickness of the oxide film effective for lowering porosity was studied. Then, the thickness was more than 60 nm and approximately 320 nm. In the composite member according to the present invention in the first form manufactured with the use of such coated SiC, it is considered that Mg oxide (such as MgO) generated as a result of reaction between a molten metal and the oxide film is present in a large amount in the vicinity of SiC, specifically, in a region within 100 to 300 nm from the contour line of SiC. Therefore, in magnesium or the magnesium alloy present around SiC in the composite member, with a region in a shape similar to SiC extending from the contour line of SiC outward by 150 nm or shorter being assumed as an SiC outer peripheral region and a region extending from the contour line of SiC outward by 1 μm or more being assumed as a main region, a composite member in which oxygen concentration in the SiC outer peripheral region is higher than in the main region is exemplified as one form of the composite member according to the present invention. When coated SiC above is employed as the raw material, in a cross-section at any portion of the composite member, any SiC outer peripheral region is higher in oxygen concentration than the main region. Therefore, oxygen concentration can be examined for any SiC outer peripheral region at any portion of the composite member. In a case where the composite member is used for a heat radiation member, however, the central portion of the composite member is involved with heat radiation performance, and hence oxygen concentration in the SiC outer peripheral region present in this central portion is preferably examined. Namely, assuming a region inside relative to a region extending over up to 1/10 of a minimal length of the composite member from an outer periphery in the cross-section of the composite member as a central region (this central region hereinafter referred to as a central region (oxygen)), oxygen concentration is examined for this central region (oxygen).

For example, in a case where the composite member (substrate) is a plate-shaped member having a lateral width of 50 mm and a thickness of approximately 5 mm, the thickness of the composite member corresponds to the minimal length above. Therefore, in this composite member, a region inside relative to a region extending over 5 mm×1/10=0.5 mm (500 μm) from the outer periphery of the composite member is assumed as the central region (oxygen). Specifically, a plane passing through a portion corresponding to 1/2 of a thickness is defined as a central plane, a center line in a direction of a lateral width of this central plane is taken, and a region extending from this center line in each direction of the lateral width by 24.5 mm and from the central plane in each direction of thickness by 2 mm is defined as the central region (oxygen). Alternatively, for example, in a case where the composite member is a plate-shaped member having a thickness not greater than 1 mm as well, the thickness of the composite member corresponds to the minimal length. Therefore, a region inside relative to a region extending over up to 1/10 of the thickness should only similarly be defined as the central region (oxygen). In particular, when a thickness is small, by defining a plane passing through a portion corresponding to 1/2 of the thickness as the central plane, a region extending from this central plane in each direction of thickness by approximately 100 μm, that is, a region having a thickness of approximately 200 μm, may be defined as the central region (oxygen).

In a case of a composite member in the dispersed form in which SiC is present in a dispersed manner in the composite member, one or more piece of SiC is selected in the central region (oxygen) above, the outer peripheral region and the main region are selected for selected SiC, and oxygen concentration is measured for comparison. More specifically, for example, SiC is selected by using an EDX analyzer attached to a TEM apparatus, an outer peripheral region and a main region are further taken for each selected piece of SiC, and measurement points are selected in each of the outer peripheral region and the main region. As a measurement point in the outer peripheral region, a point at a distance by 150 nm outward from the contour line of SiC (any point on an periphery of the outer peripheral region) can be selected, and as a measurement point in the main region, a portion on magnesium or a magnesium alloy at a distance by 3 μm outward from the contour line of SiC, not including other SiC outer peripheral regions, can be selected. For one piece of SiC, five or more measurement points in the outer peripheral region and five or more measurement points in the main region are selected for observation. Preferably, three or more (preferably five) pieces of SiC are selected, and one or more (preferably five or more) measurement point(s) in the outer peripheral region and one or more (preferably five or more) measurement point(s) in the main region are selected for observation. In the case of the bonded form described above, the outer peripheral region and the main region above are preferably selected for a contour line at any portion of SiC in the composite member.

Difference in oxygen concentration between the SiC outer peripheral region and the main region can be checked, for example, by making use of characteristic X-ray spectrochemical analysis, Auger electron spectrochemical analysis, or the like with the use of an EDX analyzer attached to an SEM apparatus or an EDX analyzer attached to a TEM apparatus.

<Internal Defect>

One of features of the composite member (substrate) according to the present invention in the fourth form is that defects are not present in a concentrated manner in the central region (defect) above in spite of its large size as described above. Specifically, an area ratio of a defect portion in the small region above selected in the central region (defect) above is not higher than 10%. The defect portion above refers to a component in the small region above except for Mg or the Mg alloy and a non-metal inorganic material (mainly SiC), and a void is exemplified as a representative.

By adjusting as appropriate a cooling condition as will be described later, a composite member satisfying the area ratio above not higher than 5% and particularly not higher than 2% can be obtained. Since a defect is desirably absent, the lower limit of the area ratio is not particularly set. In a case where cooling in one specific direction as described above is not performed, a composite member (substrate) having the area ratio above exceeding 10% is obtained. Namely, this substrate has many defects in the central region (defect) and these defects are very large. More specifically, this substrate has a defect having a size to such an extent as visually recognizable, and such a large defect is present in the central region (defect) in an uneven manner. In contrast, the composite member (substrate) according to the present invention in the fourth form has few defects in the central region (defect) and this defect has a size to such an extent that visual recognition is difficult (a largest length of the defect being not larger than approximately 0.1 mm (100 μm)). In the composite member (substrate) according to the present invention in the fourth form, a large defect is not locally present, and even though a defect is present, it is very small. Therefore, this composite member (substrate) is superior in such mechanical characteristics as strength and such thermal characteristics as thermal conductivity to a case where large defects are present in a concentrated manner in a part. In addition, in this composite member, defects are not present in a concentrated manner not only in the central region (defect) above but also over substantially the entire region of the cross-section above. Namely, this composite member has a uniform texture, without uneven presence of defects in its entirety. If the composite member is in such a form as including a metal coating layer on the surface of the substrate made of the composite material above, the central region (defect) above is extracted only from the substrate except for the metal coating layer.

<Surface State>

The composite member (substrate) according to the present invention in the fourth form is free from uneven presence of internal defects as described above and in addition, it has few surface defects such as external shrinkage cavities. Therefore, this composite member (substrate) has less irregularities in the surface and it can satisfy surface roughness Ra, for example, not greater than 2.5 μm. In addition, since the substrate itself has less surface roughness, even if the metal coating layer is formed on the substrate by using molten Mg simultaneously with making a composite, in particular even if a thin metal coating layer having a thickness not greater than 1 mm is formed, the surface of the metal coating layer is also smooth and the metal coating layer can satisfy surface roughness Ra not greater than 2.5 μm. The surface of the metal coating layer can be smoothened also by forming a thick metal coating layer and performing such machining as polishing. Meanwhile, since the metal coating layer may be thin as will be described later, polishing above or the like will lead to lower yield and increase in polishing cost.

In addition, the composite member (substrate) according to the present invention in the fourth form is less likely to deform because of fewer surface defects as described above and it is superior also in dimension accuracy. For example, this composite member (substrate) can satisfy a difference between a largest thickness and a smallest thickness of the composite member in the cross-section of the central region (defect) described above not larger than 0.2 mm and in particular not larger than 0.05 mm (50 μm). In a case of including a metal coating layer on the surface of the substrate as well, surface defects are few as described above and hence the difference above can satisfy 0.2 mm or smaller and in particular 0.05 mm (50 μm) or smaller.

<Size and Shape>

One of the features of the composite member (substrate) according to the present invention in the fourth form is its relatively large size. As one form, a rectangular shape having a short side having a length exceeding 50 mm and a long side having a length exceeding 100 mm is exemplified. As the composite member (substrate) has a large size as such, for example in making use of this composite member for a constituent material for a heat radiation member of a semiconductor device, a large number of semiconductor elements or peripherals thereof can be mounted.

A size and a shape of a substrate can be selected as appropriate and they are not particularly specified. For example, other than the rectangular shape above, a square shape or a circular shape may be adopted. A cast is prepared such that a substrate has a desired size and a shape.

<Thermal Characteristics>

Although depending on a content of a non-metal inorganic material such as SiC in the composite member or a form of presence of the non-metal inorganic material, composition of a metal component, porosity, a state of presence of a defect, or the like, the composite member (substrate) according to the present invention has excellent thermal characteristics as described above. Specifically, for example, the composite member can have such high thermal conductivity as satisfying thermal conductivity κ not lower than 180 W/m·K, in particular not lower than 200 W/m·K, further not lower than 250 W/m·K, and not lower than 300 W/m·K among others. In addition, a substrate relatively low in coefficient of thermal expansion as satisfying a coefficient of thermal expansion not lower than 3.5 ppm/K ($3.5\times10^{-6}$/K) and not higher than 20 ppm/K ($20\times10^{-6}$/K), in particular not lower than 4.0 ppm/K ($4.0\times10^{-6}$/K) and not higher than 12 ppm/K ($12\times10^{-6}$/K), and further not lower than $4\times10^{-6}$/K (4 ppm/K) and not higher than $10\times10^{-6}$/K (10 ppm/K), can be obtained. Such a composite member according to the present invention is not only excellent in thermal conductivity but also excellent in adaptability in coefficient of thermal expansion to a semiconductor element and peripherals thereof, and hence it can suitably be made use of for a heat radiation member of the semiconductor element.

(Metal Coating Layer)

<Composition, Texture>

By providing a metal coating layer on at least one surface of the substrate above and making use of this metal coating layer as a base for electroplating as described above, plating with Ni or the like can readily be applied to a substrate composed of the composite material above.

The metal coating layer mainly functions as the base for electroplating with Ni or the like, and hence a constituent metal of the metal coating layer should only be a metal having conductivity sufficient for being able to achieve conduction required for electroplating, and it may have composition different from or the same as a metal component (Mg or the Mg alloy) of the substrate made of the composite material above. In particular, when the composition is the same, in making a composite of the SiC aggregate and molten Mg in the manufacturing method described above, a part of molten Mg is made use of for forming the metal coating layer so that the metal coating layer is formed simultaneously with making a composite. Then, the composite member having the metal coating layer can be manufactured with good productivity. In this case, in the obtained composite member, the metal component in the substrate above and the metal forming the metal coating layer above have a continuous texture (a cast texture).

In particular in a case where the metal coating layer is made of pure magnesium, Young's modulus of Mg is low and hence a large thickness of the metal coating layer is less likely to change a coefficient of thermal expansion of the entire composite member. Therefore, a composite member having a low coefficient of thermal expansion is readily obtained.

When the metal component of the substrate above and the constituent metal of the metal coating layer above are different from each other in composition, the constituent metal for the metal coating layer may be, for example, an Mg alloy different in composition from the metal component of the substrate above, or a metal other than Mg and the Mg alloy, such as aluminum (Al), copper (Cu), silver (Ag), gold (Au), zinc (Zn), nickel (Ni), and an alloy thereof. In particular, one metal selected from the group consisting of Mg, Al, Cu, and Ni of which purity is 99% or higher and an alloy mainly composed of Mg, Al, Cu, and Ni (an alloy containing 50 mass % or more Mg, Al, Cu, and Ni; to be understood similarly hereinafter) is preferred as the constituent metal for the metal coating layer. The metal above is close in solidus temperature to Mg or the Mg alloy representing the metal component of the substrate, and hence it is excellent in adhesiveness to the metal component or excellent in corrosion resistance. Thus, the metal above can effectively suppress corrosion of the substrate made of the composite material.

<Portion of Formation>

The metal coating layer above should only be present on a surface at least requiring plating, among surfaces of the substrate above. Specifically, the metal coating layer is provided on at least one of a mount surface on which a semiconductor element is to be mounted and a cooling surface opposed to this mount surface and coming in contact with a cooling apparatus. A form in which the metal coating layer is provided on each of the mount surface and the cooling surface, that is, a form having two metal coating layers, may be adopted, and the metal coating layer may be provided on the entire surface including an end surface (a surface coupling the mount surface and the cooling surface above to each other) of the substrate above. Not only electroplating can be applied to the composite member including the metal coating layer, but also corrosion resistance thereof is enhanced, the surface thereof becomes smooth, and its appearance is excellent. Therefore, commercial values of the composite member can be enhanced.

<Thickness>

Too large a thickness of the metal coating layer will lead to lowering in thermal conductivity of the composite member and increase in a rate of thermal expansion. Therefore, each metal coating layer preferably has a thickness not larger than 2.5 mm, further not larger than 1 mm, and among others not larger than 0.5 mm. In a case where the metal coating layer is provided on each of the two opposing surfaces of the substrate as described above, if the sum of thicknesses of two metal coating layers is not larger than 2.5 mm, the entire composite member including the substrate and the metal coating layer in particular in the bonded form having a network portion is more likely to have a coefficient of thermal expansion not higher than 8 ppm/K. In addition, if the sum of thicknesses of the two metal coating layers above is not larger than 0.5 mm, the entire composite member including the substrate and the metal coating layer even in the dispersed form in particular is more likely to have a coefficient of thermal expansion not higher than 8 ppm/K. Further, if each metal coating layer has a thickness not smaller than 1 μm and among others not smaller than 0.05 mm (50 μm) and not larger than 0.1 mm (100 μm), it is considered that the metal coating layer sufficiently functions as the base for plating, and in addition the metal coating layer is less likely to be damaged during transportation, mounting or the like of the composite member. The metal coating layer may be formed to a large thickness and then it may be set to a desired thickness through polishing or the like. In this case, a composite member having excellent appearance is obtained.

A coefficient of thermal expansion of the composite member including the metal coating layer can easily be found by fabricating a test piece from the composite member and conducting measurement using a commercially available apparatus. Alternatively, a coefficient of thermal expansion of the composite member including the metal coating layer may be calculated based on mixture rules in consideration of rigidity or the like of each material forming the composite member above.

Alternatively, in a case of making use of the manufacturing method according to the present invention in which cooling in one specific direction is performed as described above, even though the metal coating layer has a small thickness, the metal coating layer having excellent surface property can be formed.

In a case where the substrate has a thickness not larger than 10 mm and a substrate alone has a low coefficient of thermal expansion as described above, even though each metal coating layer above is formed to a large thickness around 1 mm (the total thickness around 2 mm), a coefficient of thermal expansion of the entire composite member including the substrate and the metal coating layer above can be not higher than 8 ppm/K.

[Application]

The composite member above can suitably be made use of for a heat radiation member. This heat radiation member is not only excellent in adaptability in coefficient of thermal expansion to a semiconductor element and peripherals thereof but also high in thermal conductivity, and therefore it can suitably be made use of for a heat radiation member of the semiconductor element.

In particular, the composite member obtained by using coated SiC (powders or molded body) is low in porosity and of high grade, and its commercial value is high. A heat radiation member including the metal coating layer is readily subjected to electroplating, and in addition it has excellent surface property and it is high in commercial value. Even though the heat radiation member obtained with the one-direction cooling method described above is a large-sized composite member, it is free from locally present defects, it has few large internal defects and also has few surface defects, and it is also excellent in surface property. Therefore, this heat radiation member is expected to be of high grade and to have high commercial values. In addition, since this heat radiation member has fewer defects as described above, it is excellent in such mechanical strength as strength and thermal characteristics as well as large. Therefore, the heat radiation member can mount a large number of semiconductor elements or peripherals thereof.

A semiconductor device including the heat radiation member above and a semiconductor element mounted on this heat radiation member can suitably be made use of as various parts of electronic devices.

[Manufacturing Method]

The composite member according to the present invention can be manufactured by forming an SiC aggregate and making a composite of this SiC aggregate and molten Mg (infiltration→solidification).

In manufacturing a composite member low in porosity in particular, SiC having an oxide film formed thereon is used as a raw material. Alternatively, in manufacturing a composite member in a bonded form having a network portion, the network portion is formed with an appropriate method. In manufacturing a composite member including a metal coating layer, the metal coating layer is formed in the composite step or the like described above, or the metal coating layer is separately formed after the substrate made of the composite material is manufactured. In manufacturing a large-sized composite member in particular, molten Mg is solidified through cooling in one specific direction.

<Raw Material>

SiC powders are mainly made use of as a raw material for the SiC aggregate above. In the case of a form in which a silicon nitride is generated in sintering in the sintering method described above, not only the SiC powders but also Si powders and powders of a compound containing Si are prepared so that this powder mixture can be made use of. In the reaction sintering method described above, not only the SiC powders but also precursor powders described above (for example, $SiCl_4$, organic Si compound) are prepared so that this powder mixture can be made use of. In the reaction bonding method described above, not only the SiC powders but also powders for reaction described above (for example, powders of a simple substance element such as boron, BN, $TiB_2$, boric acid ($B_2O_3$), and sodium tetraborate ($Na_2B_4O_5(OH)_4.8H_2O$)), powders of an oxide, a boride, and a boroxide are prepared so that this powder mixture can be made use of.

These powders may be particulate or fibrous. When a powder has an average particle size (in a fibrous case, an average short diameter) not smaller than 1 μm and not larger than 3000 μm and in particular not smaller than 10 μm and not larger than 200 μm, the SiC aggregate is readily manufactured, which is preferred. In the case of the dispersed form, SiC is readily uniformly dispersed in Mg or the Mg alloy, which is preferred.

In addition, use of a plurality of types of powders different in average particle size as combined is likely to further enhance a filling rate of SiC or the like. In using SiC powders different in size, a large powder having an average particle size not smaller than 50 μm and not larger than 1/10 of a shortest inner dimension of a cast and a small powder having an average particle size not smaller than 1/20 and not larger than ½ of the average particle size of the large powder are more likely to enhance the filling rate as described above. A size or a shape of SiC in the composite member can be checked, for example, by observing a cross-section of the composite member with an SEM, an optical microscope, or the like. Use of SiC powders different in size can be checked, for example, as follows. In a cross-sectional micrograph of the composite member (for example, ×100 magnification), regarding a field of view including approximately 50 these pieces of SiC each having a particle size not smaller than 3 μm, a particle size of each piece of SiC having a particle size not smaller than 3 μm present in this field of view is measured, for example, with an intercept method. An average and a standard deviation of the particle size of approximately 50 pieces of SiC are found. Then, when a value obtained by dividing the standard deviation by the average is not smaller than 0.5, it can be determined that SiC different in size was used. Magnification in observation above is preferably adjusted as appropriate in accordance with a particle size of SiC such that approximately 50 SiC particles are viewed in the field of view.

<Molding Step: Formation of Powder Molded Body>

In the SiC high-density filling method described above, a powder molded body not having a network portion is formed with any one of slip casting, pressure forming and a doctor blade method which will be described later. The powder molded body obtained with these methods has strength sufficient for handling. In the sintering method, the sol-gel method, the reaction sintering method, and the reaction bonding method described above, the powder molded body is formed with tapping or the like in addition to the method described above. In the case of the dispersed form, the SiC aggregate can readily be formed by tapping.

<<Slip Casting>>

The powder molded body can be formed with slip casting, by fabricating slurry using raw material powders described above as well as water and a dispersant and by molding this slurry followed by drying. A common surfactant can be made use of as the dispersant. Slip casting has such advantages that a molded body in a complicated shape can readily be molded, a molded body high in filling rate (density) is obtained even with the use of fine powders, even a large-sized molded body can readily be molded, and increase in cost for facilities is less.

<<Pressure Forming>>

Pressure forming includes dry pressing, wet pressing, single-shaft pressure forming, CIP (cold isostatic press), and extrusion. In the case of molding with dry pressing, the powder molded body can be formed by subjecting raw material powders described above to pressure forming. In the case of molding with wet pressing, the powder molded body can be formed by subjecting a powder mixture in which raw material powders and a liquid such as water are mixed to pressure forming so as to press out a liquid. A pressure (molding pressure) at the time of pressure forming is preferably selected as appropriate. In any case of dry pressing and wet pressing, a binder made use of in powder molding can be made use of as appropriate. Pressure forming has such advantages that a grain size of raw material powders is readily made uniform, the number of steps is smaller than in slip casting, and hence productivity is excellent.

<<Doctor Blade Method>>

The powder molded body can be formed by fabricating slurry with the use of raw material powders described above, a solvent, an antifoaming agent, a resin, and the like, pouring this slurry into an inlet port of a doctor blade, forming a sheet-shaped body, and thereafter evaporating the solvent. The doctor blade method can suitably be made use of in forming a plate-shaped molded body.

In the SiC high-density filling method described above, a powder molded body formed with slip casting or the like described above may be adopted as the SiC aggregate or a sintered body obtained by further sintering this powder molded body may be adopted as the SiC aggregate, and then a composite of the SiC aggregate and molten Mg may be made. For example, (1) a vacuum atmosphere, a heating temperature: 800 to less than 1300° C., and a holding time: approximately 2 hours, and (2) an atmosphere, a heating temperature: 800 to 1500° C., and a holding time: approximately 2 hours are exemplified as sintering conditions here. By performing sintering under the sintering condition above, advantageously, (1) strength higher than the powder molded body above is achieved, chipping or the like is less likely at the time of accommodation in a cast, or the like, and handling is easy, (2) a porous body can readily be fabricated, and (3) an SiC filling rate can be improved by adjusting a sintering temperature or a holding time so as to make the sintered body dense, and thus a composite member of which SiC content is not lower than 70 volume % is readily obtained. In addition, through heating during sintering, a binder or the like used for fabricating the powder molded body can be evaporated and removed. These advantages of the sintered body are also similar in a sintered body having a network portion which will be described later. Under the sintering condition (1), (2) above, however, a composite member in the dispersed form not having a network portion tends to be obtained. Therefore, in obtaining a composite member having a network portion and a low coefficient of thermal expansion, sintering under a sintering condition which will be described later is preferably performed.

<<Tapping>>

The powder molded body having a shape in conformity with a cast can readily be formed by filling the cast (mold) with the raw material powders described above and applying constant vibration. It is difficult to form a high-density SiC aggregate with tapping, and tapping can be made use of in a case where an SiC content in the composite member is approximately 50 to 70 volume %. If the SiC content exceeds 70 volume %, such a method as slip casting described above is preferred.

The powder molded body containing such components as Si, a precursor and boric acid described above is formed with various methods above with the use of the powder mixture described above, and in addition, it can be fabricated by fabricating an SiC powder molded body consisting only of SiC powders, thereafter impregnating the SiC powder molded body with a liquid mixture (for example, an aqueous solution) in which the Si powders, the precursor powders, the powders for reaction (boric acid or sodium tetraborate), and the like above that are separately prepared are mixed in a solvent such as water, and thereafter drying the solvent above. By making use of the liquid mixture above, a desired substance such as Si can readily uniformly be dispersed in the powder molded body, and in addition, the powder molded body is formed without using powders other than the SiC powders. Therefore, an amount of addition of the SiC powders is not decreased and the SiC filling rate in the powder molded body is likely to increase.

<Sintering Step: Formation of Sintered Body>

In the sintering method described above, the powder molded body obtained in the molding step above is sintered to fabricate an integrated SiC aggregate (sintered body) and to generate a network portion. In particular, with the sintering method described above, a network portion in the sintered body, that can be present also in the composite member, is positively formed as the network portion above.

A vacuum atmosphere, a heating temperature not lower than 1300° C. and not higher than 2500° C., and a holding time for approximately 2 hours are exemplified as the sintering condition above. By performing sintering under this condition, SiC can directly be bonded to each other. Namely, a network portion can be formed of SiC. By directly bonding SiC to each other, strength of the sintered body is further increased and in addition, a composite member having a low coefficient of thermal expansion and high thermal conductivity is likely to be obtained by using this sintered body. Moreover, a dense sintered body is obtained under the sintering condition as described above, and the SiC content (filling rate) in the composite member can be improved. In particular, when a sintering temperature is set to 2000° C. or higher, a network portion can have a greater thickness (satisfy the number of intersections described above not greater than 50). When the sintering temperature is lower than 2000° C., a network portion tends to be thinner. The heating temperature or the holding time above is preferably selected as appropriate in accordance with a form of the network portion.

In the case of forming the powder molded body containing the Si component described above, in the sintering step, the powder molded body above is sintered in a nitrogen atmosphere to generate $Si_3N_4$ and the network portion above can be formed with $Si_3N_4$ above. In the case of thus forming the network portion, even if the heating temperature at the time of sintering is as low as approximately 800 to 1800° C., SiC can sufficiently be bonded to each other and the network portion can have a large thickness (satisfy the number of intersections described above not greater than 50).

The powder molded body containing Si above can also be formed by using an oxide containing Si, such as an additive composed of ceramics, for example, $SiO_2$, $H_2SiO_3$, and $Na_2SiO_3$ and by reducing this oxide. Specifically, for example, the powder molded body is formed of a powder mixture of the SiC powders and powders of the oxide above and the powder molded body above is reduced by using carbon powders or a carbon-containing gas, to thereby obtain the powder molded body containing Si. Alternatively, the powder molded body containing Si is obtained by preparing the powder molded body formed of the SiC powders and an aqueous solution of the oxide containing Si above, impregnating the powder molded body with the aqueous solution, and thereafter reducing the powder molded body as described above. In this case, as in the case of making use of the liquid mixture described above, Si is more likely to uniformly be dispersed and the SiC filling rate is readily increased. Commercially available carbon powders can suitably be made use of as the carbon powders above, and carbon monoxide (CO) or hydrocarbon such as methane ($CH_4$) high in reduction capability can suitably be made use of as the carbon-containing gas above.

If a compound containing Si is made use of as a raw material, it is considered that an element except for Si is vaporized during infiltration or remains in a composite member as a compound with Mg or other compounds.

<<Bonding Step>>

In the sol-gel method described above, the powder molded body obtained in the molding step above is impregnated with a solution of the precursor described above followed by heating, so as to generate a non-metal inorganic material (for example, SiC, MgO, CaO) from the precursor, and a network portion is formed of this non-metal inorganic material and an integrated SiC aggregate is fabricated. For example, polycarbosilane, metal alkoxide and the like are exemplified as the precursor above. A heating temperature is preferably selected as appropriate in accordance with the precursor above. The sol-gel method is excellent in manufacturability of the SiC aggregate as compared with the case of sintering described above, because a network portion can be formed at a lower heating temperature. In addition, in the case of making use of polycarbosilane, SiC can newly be generated and hence SiC density is increased and a composite member high in SiC content is obtained.

<Formation of Oxide Film>

In addition, by making use of an SiC aggregate having an oxide film formed on its surface as the SiC aggregate to be used together with molten Mg, wettability between the SiC aggregate and molten Mg is enhanced, which is preferred. By preparing the SiC aggregate including the oxide film, even when the SiC content is high and a gap between SiC and SiC is very small, molten Mg readily penetrates owing to capillarity. In obtaining a composite member having a network portion, preferably, an oxidation step of forming an oxide film is provided after fabrication of the SiC aggregate such as the sintered body, so as to form a coated SiC molded body. In obtaining a composite member not having a network portion, representatively in using the SiC powder molded body together with molten Mg, an oxide film is formed on a raw material powder such as an SiC powder and then the powders including the oxide film are preferably used to form the SiC aggregate (coated SiC powder molded body).

When a ratio of the oxide film to the SiC powders in the SiC molded body such as the sintered body is low (an amount of oxide film is small), an effect of improvement in wettability with a molten metal achieved by the oxide film is not sufficient. If the ratio is high (an amount of oxide film is large), an amount of Mg oxide which is a reaction product becomes large, which leads to lowering in thermal characteristics. The oxide film is formed such that a mass ratio of the oxide film to the SiC powders or the SiC molded body is not lower than 0.4% and not higher than 1.5%. Preferably, the oxide film is formed such that a mass ratio is not lower than 0.4% and not higher than 1%. More specifically, the oxide film is formed so as to have a thickness approximately from 50 nm to 300 nm. As the oxide film is larger in amount (thicker), infiltration with a molten metal at a lower temperature in a shorter period of time is allowed. Therefore, for example, if such effects as simplification of a heating apparatus for a cast during infiltration, reduction in an infiltration time period (cycle time), and a longer life of a cast are desired more than improvement in thermal characteristics, the SiC powders or the SiC molded body including the oxide film of which mass ratio exceeds 1.5% can be made use of.

If a temperature for heating the SiC powders or the SiC molded body such as the sintered body is lower than 700° C. in forming the oxide film above, the oxide film cannot sufficiently be formed on the surface of SiC and it is not sufficiently wetted with the molten metal, which leads to higher porosity of the composite member. Therefore, a heating temperature for forming the oxide film is set to 700° C. or higher. Oxidation reaction at the surface of SiC becomes active at 800° C., and as the heating temperature is higher, a rate of formation of the oxide film increases. Therefore, the heating temperature above is preferably not lower than 800° C., in particular not lower than 850° C., and further not lower than 875° C. If the heating temperature is too high, however, the rate of formation of the oxide film becomes too fast and control of an amount (thickness) or uniformity of the oxide film becomes difficult. Increase in amount of oxide film or non-uniform thickness of the oxide film may lead to lowering in thermal conductivity due to presence of a large amount of reaction product or partially insufficient wetting with the molten metal. Therefore, the upper limit temperature is preferably set to 1000° C. The amount of oxide film is also affected by a heating time period, and it tends to increase as the heating time period is longer. A preferred heating time period is approximately 2 hours. In addition, the amount of oxide film is also affected by a size of raw material SiC. When the SiC powders are used as the raw material, the amount of oxide film tends to increase as a particle is finer. Therefore, a heating temperature, a heating time period, a size of raw material SiC, and the like are preferably adjusted as appropriate such that the amount of oxide film attains to a desired amount (mass ratio). In addition, when change in size of raw material SiC is desired while the total amount of oxide film is maintained at a prescribed amount, a heating temperature and a heating time period at the time of formation of the oxide film are preferably adjusted in correspondence with a size of SiC after change thereof. When the oxide film is formed, a portion in the vicinity of SiC in the composite member described above (a region within 100 to 300 nm from the contour line of the SiC aggregate) tends to be high in oxygen concentration than a portion other than the portion in the vicinity.

<Composite Step: Formation of Substrate>

The composite member (substrate) is obtained by accommodating the SiC aggregate in a cast as described above, infiltrating the SiC aggregate with molten Mg, and thereafter solidifying molten Mg. In the reaction bonding method described above, simultaneously with making a composite of the SiC aggregate (powder molded body) above and molten Mg, boron or oxygen in the powder molded body above and molten Mg are caused to react to each other, so as to generate a new product (boride or oxide) and thus a network portion can be formed of this product.

If the composite step of infiltrating the SiC aggregate above with molten Mg is performed in an atmosphere at a pressure not higher than an atmospheric pressure (approximately 0.1 MPa (1 atm)), a gas in the atmosphere is less likely to be taken in and pores attributed to take-in of the gas are less likely to be caused in the composite member. Since Mg is high in vapor pressure, handling of molten Mg becomes difficult if a high vacuum state is set. Therefore, in a case where a pressure of the atmosphere in the composite step above is set lower than the atmospheric pressure, a pressure not lower than $0.1\times10^{-5}$ MPa is preferred. Alternatively, if the composite step above is performed in an inert atmosphere such as Ar, reaction between an Mg component and an atmospheric gas in particular can be prevented and deterioration in thermal characteristics attributed to presence of a reaction product can be suppressed.

An infiltration temperature not lower than 650° C. is preferred. As the infiltration temperature is higher, wettability between the SiC aggregate and molten Mg is enhanced, and hence an infiltration temperature not lower than 700° C., in particular not lower than 800° C., and further not lower than 850° C. is preferred. If the infiltration temperature exceeds 1000° C., however, such a defect as a shrinkage cavity or a gas hole may be caused or Mg may boil. Therefore, the infiltration temperature not higher than 1000° C. is preferred. In addition, in order to suppress generation of an excessive oxide film or generation of a crystallized product, an infiltration temperature not higher than 900° C. is preferred.

In using the SiC aggregate including the oxide film, the infiltration temperature is dependent on the amount (thickness) of oxide film. If the amount of oxide film is small in a range of the amount of oxide film described above, a high infiltration temperature is preferred. If the amount of oxide film in the range above is large, the infiltration temperature may be low. Specifically, when the amount of oxide film is not lower than 0.4 mass % and not higher than 0.65 mass %, the infiltration temperature not lower than 800° C. and not higher than 1000° C. is preferred. When the amount of oxide film is higher than 0.65 mass % and lower than 1.5%, the infiltration temperature may be not lower than 675° C. and not higher than 875° C. and naturally it may be higher than 875° C.

More specifically, for example, when pure magnesium is employed as a molten metal and an amount of oxide film is set to approximately 0.4 mass % with respect to the total amount of raw material SiC, a temperature for infiltration with the molten metal exceeding 750° C. enhances wettability between the molten metal and the SiC aggregate including the oxide film and thus infiltration can be carried out. As the infiltration temperature is higher as described above, wettability is enhanced and porosity is lowered. Therefore, the infiltration temperature is preferably not lower than 800° C. and in particular not lower than 850° C. Alternatively, for example when pure magnesium is employed as a molten metal and an amount of oxide film is set to approximately 0.8 mass % with respect to the total amount of raw material SiC, a temperature for infiltration with the molten metal set to 675° C. or higher enhances wettability between the molten metal and the SiC aggregate including the oxide film and thus infiltration can be carried out. In this case as well, as in the case of the amount of oxide film above around 0.4 mass %, as the infiltration temperature is higher, wettability is enhanced and porosity is lowered. Therefore, the infiltration temperature is preferably not lower than 700° C. and in particular not lower than 725° C. If the amount of oxide film is greater (not higher than 1.5 mass %), it is considered that even a temperature for infiltration with the molten metal lower than 700° C. will allow good infiltration. In making use of pure magnesium, however, in order to prevent occurrence of defects or boiling as described above, the infiltration temperature is preferably not higher than 1000° C.

Meanwhile, if the magnesium alloy is employed as the molten metal, a liquidus temperature is lower than a melting point of pure magnesium and infiltration at a lower temperature can be carried out. For example, if AZ31 or AZ91 is employed as the molten metal, infiltration can be carried out even though the amount of oxide film above is small or even though the infiltration temperature is not higher than 800° C. If AZ91 is employed as the molten metal, a temperature allowing infiltration is not lower than 650° C. In making use of the magnesium alloy as well, as in the case of pure magnesium above, as the infiltration temperature is higher, wettability is enhanced and porosity is lowered. Therefore, the infiltration temperature is preferably not lower than 700° C. In the case of the magnesium alloy, as compared with pure magnesium, a vapor pressure is lowered and a boiling point is raised. Therefore, the infiltration temperature can slightly be higher and it can be set to 1000° C. or higher. Even so, the infiltration temperature is preferably lower than 1100° C.

Solidification (cooling step) of the molten metal in the composite such as an infiltrated plate is also preferably carried out in an inert atmosphere. A pressure of the atmosphere may be set to an atmospheric pressure, however, in order to suppress generation of defects at the time of solidification, it may be set to a pressure not lower than an atmospheric pressure. The composite is preferably cooled rapidly in order to suppress growth of a crystallized product. By employing a cast formed of carbon, graphite, stainless steel, or the like excellent in thermal conductivity or by performing forced cooling such as water cooling, air cooling using a fan or the like in addition to leaving for cooling, a cooling rate can be increased. In particular, in forming a large-sized composite member, cooling in one specific direction is preferably performed. In forming a small-sized composite member, however, uniform cooling over the entirety may be carried out.

<Formation of Metal Coating Layer>

In forming the metal coating layer on the surface of the substrate composed of the composite material above, a cast including a composite member formation portion in a desired shape is made use of as the cast. A cast integrally including a composite member formation portion and a portion of placement of Mg or the Mg alloy representing a metal component of the substrate (which may hereinafter be referred to as a base material metal) may be employed so that the base material metal is molten by heating this cast. In the composite integration method described above, in particular, an unfilled region where filling with SiC is not performed is provided between the cast (composite member formation portion) and the SiC aggregate, and a metal present in this unfilled region forms a metal coating layer on at least one surface of the substrate.

A molten base material metal (molten Mg) and a separately prepared metal plate are exemplified as a metal caused to be present in the unfilled region. In the case of the former base material metal, the obtained composite member is made of the constituent metal of the metal coating layer and the metal component of the substrate having the same composition and the same texture. In the case of the latter metal plate, the obtained composite member is made of the constituent metal of the metal coating layer and the metal component of the substrate different in composition or texture.

In the case of the former base material metal, the following methods (1) to (3) are exemplified as a method of forming a metal coating layer by having the molten base material metal (molten Mg) exist in the unfilled region.

(1) SiC powders are used to form a molded body smaller in volume than a cast (this molded body is employed as the SiC aggregate). This molded body is arranged in the cast and a gap is provided between the cast and the molded body (this gap serves as the unfilled region). Then, in making a composite of the molded body and molten Mg, molten Mg is poured also into the gap above. Molten Mg or Mg alloy above poured into this gap forms the metal coating layer.

(2) A spacer is arranged in the composite member formation portion in the cast (this spacer serves as the unfilled region). After the SiC aggregate above is arranged in the composite member formation portion of the cast above where the spacer has been arranged, the spacer above is heated and vaporized for removal. As a result of removal of this spacer, a gap is produced between the cast (composite member formation portion) and the SiC aggregate. Then, in making a composite of the SiC aggregate and molten Mg, molten Mg is poured also into the gap above (a space where the spacer has been present). Molten Mg or Mg alloy above poured into this gap forms the metal coating layer.

Alternatively, (2') a form in which a spacer is not removed by vaporization, sublimation or the like can be adopted. In this case, a molded body such as a sintered body is preferably made use of as the SiC aggregate. Specifically, for example, the following is exemplified as the manufacturing method according to the present invention of manufacturing a composite member having a metal coating layer.

SiC powders are used to form a molded body smaller in volume than the cast above, this molded body is adopted as the SiC aggregate above, the molded body above is arranged in the composite member formation portion in the cast above, and a spacer is arranged to maintain a gap between the molded body and the cast above (this gap serves as the unfilled region above). The metal coating layer above is formed of molten Mg or Mg alloy above poured into the gap above.

In the form above, a composite member in which the spacer and the metal coating layer are integrated is obtained. A spacer may remain as it is so that a composite member including the spacer may be made, or a composite member from which a spacer portion is removed by such machining as cutting may be made. If a spacer is allowed to remain, a removal step is not necessary, which leads to excellent manufacturability. Since a spacer is present at the time of formation of the metal coating layer in the form above, the metal coating layer can be formed in a stable manner while reliably maintaining the gap above. As a constituent material for the spacer, a material excellent in heat resistance, that is not removed by a melt of Mg or Mg alloy, representatively a material less likely to be vaporized, sublimated, or molten, such as carbon and such metal materials as Fe, stainless steel (SUS), Nb, Ta, and Mo, is exemplified. Though stainless steel satisfying any standard can be used as the stainless steel, a standard not containing Ni such as SUS430 is further preferred, for the purpose of being able to maintain purity of the melt above and enhancing thermal conductivity.

A size and a shape of a spacer can be selected as appropriate in consideration of a thickness or the like of the metal coating layer. For example, a plate-shaped body or a linear body (wire) is exemplified. In making use of a linear body, a linear body slightly smaller in diameter than the metal coating layer to be formed may be prepared, and a gap may be provided between the molded body and the cast by fixing the molded body to the cast with this linear body. In this case, most part of the linear body is buried in the metal coating layer, and hence a composite member having good appearance is obtained even though the linear body remains.

(3) A cast including a surface of contact with the SiC aggregate and a thermal expansion portion made of a material higher in coefficient of thermal expansion than SiC is employed as the cast (in particular, the composite member formation portion). The SiC aggregate above is arranged in this cast, and the thermal expansion portion above expands by heat generated at the time of infiltrating this SiC aggregate with molten Mg or Mg alloy above. As a result of this thermal expansion, a gap is produced between the contact surface of the cast and the SiC aggregate (this gap serves as the unfilled region). Then, molten Mg or Mg alloy above poured into this gap forms the metal coating layer.

In the technique (1), (2') above, for example, a powder molded body formed with slip casting, a powder molded body formed with pressure forming, a sintered body obtained by further sintering any powder molded body above, a sintered body obtained by sintering SiC with which the mold was filled with such a method as tapping, as well as a commercially available sintered body, and the like can be made use of as the molded body. In the technique (2), (3) above, any of various molded bodies described above and a material obtained by tapping the SiC powders above may be employed as the SiC aggregate.

In the technique (2), in a case where a spacer is made of a sublimable substance such as naphthalene (sublimation temperature: 218° C.), dry ice (sublimation temperature: −78.5° C.), and anthracene (sublimation temperature: 342° C.), deformation of the SiC aggregate due to liquefaction of the spacer can be prevented and in addition a residue (for example, soot or the like) is less likely to remain in the cast, which is preferred.

In addition, when the spacer above is composed of a substance vaporized at a temperature not higher than a liquidus temperature (melting point) of Mg or the Mg alloy serving as the metal component of the composite member (substrate), by heating the cast to a temperature not lower than the melting point of the spacer and not higher than a solidus temperature of Mg or the Mg alloy above, the spacer above arranged in the cast can be removed through this heating. Further, in this case, Mg or the Mg alloy above is arranged in a metal placement portion of the cast above, and the SiC aggregate above, the spacer above, and the cast in which Mg or the Mg alloy above has been arranged are heated to a temperature not lower than the solidus temperature (melting point) of Mg or the Mg alloy above to thereby melt Mg or the Mg alloy above. Thus, the SiC aggregate arranged on the composite member formation portion of the cast above is infiltrated and this heating can be made use of for vaporization and removal of the spacer. In this case, since melting of Mg or the Mg alloy above and removal of the spacer can be performed in a single heating step, a heating step for removing the spacer does not have to be provided separately, and thus excellent manufacturability of the composite member is achieved. On the other hand, if the heating step for removing the spacer is provided separately, the spacer can reliably be removed and a residue or the like is unlikely. In addition, since a spacer can be selected without taking into account a melting point or a boiling point of a constituent material for the spacer, a degree of freedom in selecting a spacer is enhanced.

A size and a thickness of the spacer above are adjusted such that the metal coating layer having desired size and thickness can be formed on one surface of the substrate. By making use of such a spacer, a metal coating layer having a uniform thickness is readily formed and a composite member having a desired dimension can accurately be manufactured. The spacer above may be arranged such that the metal coating layer is formed on each of opposing surfaces of the substrate.

Unless excessive vibration is provided to the cast after removal of the spacer above, even the SiC aggregate formed by tapping described above can be free-standing, of which shape is kept to such an extent as not collapsing, and a gap created in a space where the spacer has been present can sufficiently be maintained.

In the technique (3), it is assumed that the cast is formed by combining divided pieces, and a cast formed such that each divided piece forming a cast main body is made of a material having low coefficient of thermal expansion α (such as carbon (α: approximately 3.0 to 4.8 ppm/K)) and a coupling member such as a screw or a bolt for coupling the divided pieces to each other is made of a material higher in coefficient of thermal expansion α than SiC (α: approximately 3.0 to 6 ppm/K) such as stainless steel can be made use of. In using a coupling member high in coefficient of thermal expansion α, a part of a screw hole or the like provided in a bolt, a screw or a cast may be cut in order to avoid breakage of the cast due to expansion of the coupling member. By thus making use of members different in coefficient of thermal expansion, when the cast itself is heated or the cast comes in contact with molten Mg in infiltrating the SiC aggregate with molten Mg or Mg alloy (molten Mg), the cast main body low in coefficient of thermal expansion is less likely to experience thermal expansion but the coupling member serving as the thermal expansion portion expands, so that a small gap can be formed between the divided pieces. In addition, since the cast main body is less likely to deform by heat (an amount of expansion and shrinkage is small), a composite member having a desired size can accurately be formed.

For example, it is assumed that the SiC aggregate (preform) has a coefficient of thermal expansion $\alpha_S$ (ppm/K) and a thickness $t_S$ (mm), the cast (divided piece) has a coefficient of thermal expansion $\alpha_M$ (ppm/K), the screw coupling the divided pieces of the cast to each other has a coefficient of thermal expansion $\alpha_N$ (ppm/K), a portion of the screw buried in the cast (divided piece) has a length $t_N$ (mm), the base material metal (magnesium here) has a melting point of 650° C., and a room temperature before heating the cast is set to 25° C. Here, as the SiC aggregate is infiltrated with molten Mg and the metal coating layer is concurrently formed, an approximate thickness $t_f$ (μm) of the metal coating layer formed in the gap between the divided pieces above is expressed with Equation (1) below.

$$t_f=(650-25)\times(\alpha_N\times t_N-\alpha_M(t_N-t_S)-\alpha_S\times t_S)\times 10^{-3}\ (\mu m) \qquad \text{Equation (1)}$$

For example, when it is assumed that $\alpha_S$=3 (ppm/K), $t_S$=4.5 (mm), $\alpha_M$=4 (ppm/K), $\alpha_N$=17.3 (ppm/K), and $t_N$=10 (mm), thickness $t_f$ of the metal coating layer is calculated as $t_f$=85 (μm) based on Equation (1) above.

A material for the thermal expansion portion and a length buried are preferably selected in consideration of the composition of the metal component of the substrate, the SiC content, a material for the cast, a thickness of the substrate, and the like, such that the metal coating layer has a desired thickness, that is, a desired gap is formed. For example, in forming a metal coating layer approximately from 1 μm to 100 μm on the substrate having a size of approximately 4.5 mm×100 mm×200 mm, a constituent material different in coefficient of thermal expansion from SiC by not less than 1 ppm/K and preferably not less than 3 ppm/K in consideration of certainty can suitably be made use of as the constituent material for the coupling member serving as the thermal expansion portion.

In particular, in forming a composite member having a large size and including a metal coating layer, when a gap is provided between the SiC aggregate and the cast as described above so as to allow flow-in of molten Mg also in the gap in making a composite above and the metal coating layer is formed simultaneously with formation of the infiltrated plate, excellent productivity of the composite member is achieved. Here, by performing cooling in one specific direction as described above, a high-grade substrate can be formed even though the infiltrated plate has a large size. Therefore, in the metal coating layer formed on the surface thereof as well, such a defect as shrinkage at the surface can be lessened. In particular, even when the metal coating layer is thin, according to the manufacturing method in the present invention in which cooling in one specific direction is performed, a metal coating layer excellent in surface property can be formed. In this form, a metal coating layer having a thickness in accordance with a size of the gap above can be formed. Therefore, a size of the gap above is preferably adjusted such that the metal coating layer has a desired thickness.

Meanwhile, in making use of a metal plate as a metal to be present in the unfilled region, the metal coating layer can be formed as follows. Initially, the metal plate is arranged in the cast (this metal plate serves as the unfilled region). Then, the SiC aggregate above is arranged in the cast where the metal plate above has been arranged. In making a composite of this SiC aggregate and molten Mg or Mg alloy, the metal plate is joined to the SiC aggregate by means of this molten Mg or Mg alloy to thereby form the metal coating layer. A metal plate having desired composition and desired size and thickness is preferably prepared as appropriate as the metal plate. In order to further enhance adhesiveness between the metal plate and the substrate, a low-melting layer lower in solidus temperature (melting point) than a constituent metal of the metal plate may be provided on a surface of the metal plate to be joined to the substrate. In employing the metal plate, the metal component in the substrate and the constituent metal of the metal coating layer may be different from each other in composition, or the metal coating layer having a smooth surface can readily be formed. In this form, any of various molded bodies described above and a material obtained by tapping SiC powders can be made use of as the SiC aggregate above.

Alternatively, the composite member according to the present invention including a metal coating layer can be manufactured separately also by joining a metal plate having a metal coating layer formed after the substrate is fabricated. For example, a hot pressing method among the manufacturing methods according to the present invention described above can be made use of. In this form, since the substrate made of a composite material can separately be fabricated, the substrate can be fabricated through basic steps without arranging a spacer or a metal plate in a cast or making use of a cast having a special construction, and manufacturability of the substrate is excellent. In addition, the hot pressing method has such various advantages that (1) it can be performed at a temperature not higher than the melting point of Mg and therefore a wide choice of constituent materials for the metal coating layer is available and thus a composite member in which a metal component of the substrate made of the composite material and a constituent metal of the metal coating layer are metals different in type can be formed in a simplified manner, (2) since the metal plate deforms along a shape of the surface of the substrate above through plastic deformation and it is joined in an adhesive manner, joint strength between the substrate above and the metal coating layer is excellent, (3) since the metal plate plastically deforms, the metal coating layer can be formed in spite of presence of a surface defect (such as an external shrinkage cavity) in the substrate above, and in addition the defect above can be closed and a composite member having excellent surface property is obtained, (4) even if there are pores in the substrate above, the pores can be decreased as they are collapsed by pressurization and thus thermal characteristics of the composite member can be improved owing to fewer pores, (5) since such an inclusion (solder) as in brazing is not necessary, a composite member excellent in thermal conductivity is obtained, and (6) a metal plate having a small thickness can be joined and a composite member including a thin metal coating layer is obtained, and in addition a coefficient of thermal expansion of the composite member as a whole including the metal coating layer can be suppressed because of a small thickness of the metal coating layer. In manufacturing a substrate, various SiC molded bodies described above may be made use of or the cast may directly be filled with SiC powders.

A heating temperature or an applied pressure for a stack of the substrate above and the metal plate can be selected as appropriate, depending on composition of a metal component of the substrate, composition of the metal plate, and the like. If the heating temperature is lower than 300° C. and the applied pressure is lower than 0.5 ton/cm$^2$, sufficient joint of the stack above is difficult. As the heating temperature above is higher or the applied pressure above is higher, joint characteristics tend to be excellent. If the heating temperature above is not lower than 500° C., sufficient joint can be achieved even though the applied pressure is slightly low. If the heating temperature is too high, however, the metal component in the substrate or the metal plate is molten and the substrate or the metal plate deforms or flows out of the gap in a pressure mold. Therefore, the heating temperature is preferably not higher than the solidus temperature (melting point) of the metal component of the substrate or the metal plate. If the applied pressure is too high, crack of SiC occurs and hence the applied pressure is preferably approximately not higher than 9 ton/cm$^2$. In addition, if the applied pressure exceeds 5 ton/cm$^2$, deterioration of the pressure mold is accelerated. Therefore, taking into account life of the pressure mold, it seems that the applied pressure is further preferably not higher than 5 ton/cm$^2$.

In performing hot pressing above, if a joint atmosphere is set to an inert atmosphere, generation of an oxide film on the surface of a metal plate or a substrate can be suppressed. As compared with a case where a joint atmosphere is set to atmosphere, joint can be achieved at a lower heating temperature or with a lower applied pressure. For example, an Ar atmosphere, a He atmosphere, an $N_2$ atmosphere, and a vacuum atmosphere are exemplified as the inert atmosphere. In the case of the atmosphere, joint can be achieved through sufficient heating and pressurization, and facilities can be simplified more than in the case of an inert atmosphere.

When the metal plate above is composed of one metal selected from the group consisting of Mg and Al of which purity is not lower than 99% and an alloy mainly composed of Mg or Al, the heating temperature not lower than 300° C. can allow sufficient joint of the stack above. In particular in the atmosphere, the heating temperature is preferably not lower than 400° C. When the heating temperature is not lower than 400° C. and lower than 500° C., the applied pressure is preferably not lower than 5 ton/cm$^2$. When the heating temperature is not lower than 500° C., the applied pressure is preferably not lower than 0.5 ton/cm$^2$. In the inert atmosphere, when the heating temperature is not lower than 300° C. and lower than 500° C., the applied pressure is preferably not lower than 3 ton/cm$^2$. When the heating temperature is not lower than 500° C., the applied pressure is preferably not lower than 0.5 ton/cm$^2$.

When the metal plate above is composed of one metal selected from the group consisting of Cu and Ni of which purity is not lower than 99% and an alloy mainly composed of Cu or Ni, the heating temperature not lower than 500° C. can allow sufficient joint of the stack above. In particular in the atmosphere, the heating temperature is preferably not lower than 600° C. When the heating temperature is not lower than 600° C. and lower than 645° C., the applied pressure is preferably not lower than 3 ton/cm$^2$. When the heating temperature is not lower than 645° C., the applied pressure is preferably not lower than 0.5 ton/cm$^2$. In the inert atmosphere, when the heating temperature is not lower than 500° C., the applied pressure is preferably not lower than 0.5 ton/cm$^2$.

Further, in performing the hot pressing method, by restraining a side surface of the substrate made of the composite material as appropriate, deformation of the substrate is suppressed and a composite member particularly excellent in dimension accuracy can be produced. Furthermore, upper and lower punching surfaces made use of in the hot pressing method are made as appropriate curved surfaces (a convex surface and a concave surface), so that prescribed warp can be provided to the substrate above.

In addition to the hot pressing method above, for example, at least one technique of brazing, ultrasonic bonding, enveloped casting, rolling (clad rolling), oxide soldering, and joint with an inorganic adhesive can be made use of as a method of joining a metal plate to a substrate made of a composite material.

<Formation of Large-Sized Composite Member>

<<Cast>>

For example, in fabricating a plate-shaped composite member such as a rectangular plate, a cast made use of in infiltration representatively includes a bottom surface portion and a sidewall portion erected from the bottom surface portion, and a box-shaped cast having an opening on a side opposed to the bottom surface portion can be made use of. In fabricating a composite member in a rectangular plate shape, a box having a parallelepiped shape can suitably be made use of as the cast. An SiC aggregate is accommodated in this box-shaped cast. After accommodation, representatively, the cast is arranged such that a side of the bottom surface portion of the cast is located on a lower side in the vertical direction and a side of opening of the cast is located on an upper side in the vertical direction. Then, for example, by making use of weight of molten Mg itself, molten Mg flows in from the side of opening of this cast (a side of supply of molten Mg) toward the side of the bottom surface portion (the side opposite to the supply side above) so as to infiltrate the aggregate above therewith. Thus, without pressurizing molten Mg or the like, the infiltrated plate can be manufactured in a simplified manner, for example, at an atmospheric pressure.

Alternatively, infiltration with molten Mg can also be carried out from the side of the bottom surface portion of the cast toward the side of the upper opening. Namely, the side of the bottom surface portion of the cast can be set as the supply side of molten Mg and the side of opening of the cast can be set as the side opposite to the supply side above. For example, such a construction that a teeming port for molten Mg is provided at the bottom surface portion of the cast and molten Mg is pushed up from the teeming port by means of a pump, a piston, capillarity, or the like is exemplified. Alternatively, such a construction that a cast and a separate vessel are prepared, the bottom surface portion of the cast and the bottom surface portion of the vessel are connected to each other through a coupling pipe such as a hose, molten Mg is supplied to the vessel, and molten Mg is supplied from the side of the bottom surface portion of the cast by making use of pressure applied to molten Mg or such a construction as suctioning molten Mg from the side of opening of the cast is exemplified. In this form of supplying molten Mg from the side of the bottom surface portion of the cast, it is considered that making of a composite proceeds with decrease in volume being compensated for while unsolidified Mg or Mg alloy is supplied from the side of the bottom surface portion of the cast. In addition, in this form, it is expected that air in the SiC aggregate readily escapes because the upper side is open. Moreover, in this form, by cooling the infiltrated plate in one direction from the upper side in the vertical direction toward the lower side in the vertical direction, a composite member having fewer defects described above can be fabricated in spite of an infiltrated plate having a large size. It is considered, however, that the form making use of the weight of molten Mg itself above is superior in productivity.

<<Cooling>>

In forming a large-sized composite member in particular, the infiltrated plate above is cooled in one direction from the side of the infiltrated plate opposite to the supply side of molten Mg. For example, in a case where the side of supply of molten Mg is defined as the upper side in the vertical direction and the side opposite to the supply side is defined as the lower side in the vertical direction, that is, in a case of supplying molten Mg in the direction of gravity, the infiltrated plate is cooled in one direction from the lower side in the vertical direction toward the upper side in the vertical direction. Alternatively, in a case where the side of supply of molten Mg is defined as the lower side in the vertical direction and the side opposite to the supply side is defined as the upper side in the vertical direction, that is, in a case of supplying molten Mg in a direction opposite to the direction of gravity, cooling is performed in one direction from the upper side in the vertical direction toward the lower side in the vertical direction, that is, in the direction of gravity. More specifically, for example, in a case of manufacturing a composite member in a rectangular plate shape, with one end side in a longitudinal direction of the infiltrated plate being defined as the lower side in the vertical direction and the other end side being defined as the upper side in the vertical direction, cooling is performed from the one end side in the longitudinal direction toward the other end side (or from the other end side toward the one end side). For thus cooling the infiltrated plate in one direction, for example, forced cooling of the side opposite to the side of supply of molten Mg in the infiltrated plate above (hereinafter referred to as a cooling start side) is exemplified. Liquid cooling making use of a liquid coolant, air cooling forcibly sending air, and the like are exemplified as forced cooling. In using a coolant such as a liquid coolant, the coolant may be in direct contact with the bottom surface portion of the cast (or the opening portion of the cast) arranged on the cooling start side, or the bottom surface portion of the cast (or the opening portion of the cast) arranged on the cooling start side may be arranged closer to the coolant. Alternatively, covering a portion other than a portion to forcibly be cooled, such as the bottom surface portion of the cast, with a heat-insulating material, or moving the cast from the cooling start side, from a high temperature region to a low temperature region, is exemplified. Any cooling method can be made use of and various cooling methods above may be used as combined.

<<Temperature Gradient>>

In the cooling step above, by cooling the infiltrated plate such that a temperature gradient along the direction of cooling of the infiltrated plate above (for example, a temperature gradient from the lower side in the vertical direction toward the upper side in the vertical direction) is within a specific range below, an area ratio of the defect portion above can further be lowered and a higher-grade composite member having fewer defects can more readily be obtained in spite of the infiltrated plate having a large size. Specifically, temperature difference of a prescribed magnitude is provided between a precedingly cooled one side (for example, the lower side in the vertical direction) and subsequently cooled the other side (for example, the upper side in the vertical direction). More specifically, a plurality of temperature measurement points are taken along the direction of cooling of the infiltrated plate above. When each temperature measurement point attains to a prescribed temperature, temperature difference $\Delta T_P$ between one temperature measurement point $P_u$ and the other temperature measurement point $P_d$ adjacent to a temperature measurement point $P_s$ is calculated and a value $\Delta T_p/l$ obtained by dividing this temperature difference $\Delta T_P$ by a distance $l$ between two temperature measurement points $P_u$, $P_d$ is adopted as a temperature gradient of that temperature measurement point. Here, the infiltrated plate above is cooled such that the temperature gradient at each temperature measurement point above is not less than 0.01° C./mm. As the temperature gradient is greater, the area ratio of the defect portion above tends to be lower and a temperature gradient not less than 0.1° C./mm and in particular not less than 0.5° C./mm is further preferred.

Though any temperature measurement point can be selected, a plurality of temperature measurement points at regular intervals in the longitudinal direction of the infiltrated plate above are preferably selected. In addition, too small an interval between adjacent temperature measurement points makes it difficult to provide sufficient temperature difference, and too large an interval therebetween leads to too great temperature difference. Therefore, although depending on a size of the infiltrated plate above in the longitudinal direction, an interval approximately from 5 to 10 mm seems to be preferred.

<<Cooling Rate>>

In the cooling step above, when cooling is performed such that a rate of cooling along the direction of cooling of the infiltrated plate above (for example, a rate of cooling from the lower side in the vertical direction toward the upper side in the vertical direction) is within a specific range below, an area ratio of the defect portion above can further be lowered and a higher-grade composite member having fewer defects can more readily be obtained in spite of the infiltrated plate having a large size. Specifically, a plurality of temperature measurement points are taken along the direction of cooling of the infiltrated plate above. A time period t required for each temperature measurement point to decrease from a prescribed high temperature $T_H$ to a prescribed low temperature $T_L$ is counted and a value $(T_H-T_L)/t$ calculated by dividing difference $T_H-T_L$, between temperatures $T_H$ and $T_L$ above by time period t above is defined as a cooling rate at each temperature measurement point above. Here, cooling is performed such that a cooling rate at each temperature measurement point above is not less than 0.5° C./min. As the cooling rate is greater, the area ratio of the defect portion above tends to be lower, and the cooling rate not less than 3° C./min, in particular not less than 10° C./min, and further not less than 50° C./min is further preferred. As the cooling rate is greater, a crystal particle of Mg or the Mg alloy becomes finer and a composite member having good appearance is obtained.

The temperature gradient or the cooling rate above can be varied depending on a temperature of the coolant or an amount of the coolant (an amount of blown air or the like) above, a distance between the coolant and the cast, a state of arrangement of the heat-insulating material, a moving speed of the cast, or the like. In the case of the constant temperature gradient above, as the cooling rate above is greater, the area ratio of the defect portion above is more readily lowered and deformation is less, or in the case of the constant cooling rate above, as the temperature gradient above is greater, the area ratio of the defect portion above is more readily lowered and deformation is less. In addition, if the cooling rate above is high and the temperature gradient above is great, an extremely high-grade composite member having very few defects is readily obtained.

In realizing the temperature gradient or the cooling rate above, direct measurement of a temperature of molten Mg or Mg alloy with such temperature measurement means as a thermocouple will lead to serious damage of the temperature measurement means. Therefore, a cast or the like that can realize the temperature gradient or the cooling rate above is preferably prepared for use.

<Pressurization>

In addition, as one step in the composite member manufacturing method described above, porosity can further be lowered by including the pressurization step of pressurizing the obtained composite solidified substance so as to collapse pores present in this composite solidified substance as in the manufacturing method (1-2) described above.

In the pressurization step above, pressurization may be performed at room temperature. If pressurization is performed while the composite solidified substance is heated, however, ease in plastic working of the metal component composed of Mg or the Mg alloy can be enhanced and pores can be collapsed with lower pressure. Alternatively, if a pressure during pressurization is constant, by performing pressurization while the composite solidified substance is heated, pores can more effectively be collapsed than in a case at room temperature. An applied pressure is preferably not lower than 1 ton/cm$^2$. Since pores are readily collapsed as the applied pressure is greater, a pressure not lower than 3 ton/cm$^2$ and further not lower than 5 ton/cm$^2$ is preferred. In order to avoid damage of SiC by pressurization, an applied pressure not higher than 9 ton/cm$^2$ is preferred. An applied pressure is preferably varied in accordance with a heating temperature. For example, in a case where a heating temperature is as high as exceeding 240° C., pores can effectively be collapsed by setting the applied pressure to 1 ton/cm$^2$ or higher. In a case where the heating temperature is set to a relatively low temperature not lower than 150° C. and not higher than 240° C., pores can effectively be collapsed by setting the applied pressure to 3 ton/cm$^2$ or higher. In a case where the heating temperature is set to a temperature not lower than room temperature and lower than 150° C., pores can effectively be collapsed by setting the applied pressure to 5 ton/cm$^2$ or higher. Though pores are readily collapsed as the temperature is higher as described above, in order not to melt solidified Mg or Mg alloy, the upper limit of the heating temperature is set to the melting point (liquidus temperature) of Mg or the Mg alloy in the composite member. In particular, when the heating temperature is not lower than 600° C., pores can sufficiently be decreased even though the applied pressure is slightly low. A heating temperature and an applied pressure are preferably selected as appropriate in such a range that the composite solidified substance is not broken or excessive strain is not introduced. Taking into account prevention of breakage or lowering in strain, the heating temperature is preferably not lower than 300° C. and in particular not lower than 400° C. and not higher than 600° C. For example, pressurization with pressure not lower than 1 ton/cm$^2$ while heating the substrate above or the composite member including the metal coating layer above to a temperature not lower than 300° C. and lower than a solidus temperature (melting point) of the metal component of the substrate and the constituent metal of the metal coating layer is exemplified. If a pressurization time period is too long, strain or the like is applied to Mg or the Mg alloy in the composite member above and hence the pressurization time period for approximately 10 minutes is preferred. If several mass % Li is added to magnesium, a crystal structure of magnesium becomes a bcc structure which is readily plastically deformed, and pores can effectively be collapsed with a relatively low pressure not higher than 5 ton/cm$^2$ even at a temperature from room temperature to less than 150° C.

After the pressurization step, in particular for removing strain caused in the metal component (Mg or the Mg alloy) in the composite member above, annealing may be performed. The upper limit of an annealing temperature is set to a melting point (liquidus temperature) of the metal component (Mg or the Mg alloy) in the composite member.

A method of manufacturing the composite solidified substance above which is an object to be pressurized is not particularly specified. A composite solidified substance manufactured with the manufacturing method (1-1) according to the present invention as described above or a product manufactured with the infiltration method with the use of SiC not having an oxide film formed as a raw material may be adopted. Alternatively, a composite member low in porosity is obtained by applying the pressurization step above to a product manufactured with a powder metallurgy method in which many pores are generally present (a method of mixing powders of a base material metal and raw material powders of a non-metal inorganic material such as SiC and molding and firing the powder mixture) or to a product manufactured with melting method (a method of solidifying a melt mixture in which a raw material of a non-metal inorganic material such as SiC is mixed in a molten metal).

The pressurization step above or the step of removing strain is applicable not only to a form including only a substrate composed of a composite material but also to a form including a metal coating layer on at least one surface of the substrate. In a case of forming a metal coating layer with the hot pressing method described above as well, it is expected that pores can further be decreased by further adding the pressurization step. By including such a pressurization step, a dense substrate having porosity not higher than 5% and in particular lower than 3% or a composite member including a metal coating layer on a dense substrate is obtained, and variation in characteristics such as thermal characteristics as described above can be lowered.

Effects of the Invention

The composite member according to the present invention in the first form has excellent thermal characteristics because a content of a phase low in thermal conductivity derived from use of an infiltration agent or porosity is low. According to the manufacturing method (1-1), (1-2) in the present invention, a composite member low in porosity can be manufactured without raising an infiltration temperature to a very high temperature or without using an infiltration agent.

The composite member according to the present invention in the second form is excellent not only in adaptability in coefficient of thermal expansion to a semiconductor element and the like but also in thermal conductivity. According to the composite member manufacturing method in the present invention (the sintering method), the composite member according to the present invention excellent in thermal characteristics above can be manufactured with high productivity.

Plating by electroplating can be applied to the composite member according to the present invention in the third form by including the metal coating layer. According to the composite member manufacturing method in the present invention (the composite integration method, the hot pressing method), the composite member including the metal coating layer above can be manufactured.

The composite member according to the present invention in the fourth form is of high grade in spite of its large size, because defects are not present in a concentrated manner. According to the composite member manufacturing method in the present invention (the one-direction cooling method), a composite member of high grade in spite of its large size can be manufactured.

MODES FOR CARRYING OUT THE INVENTION

Figure 1:
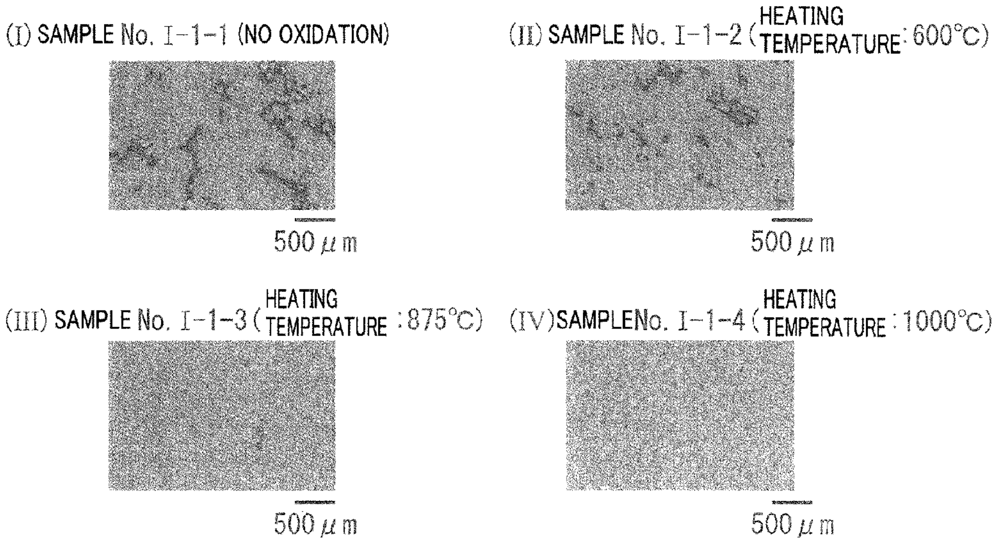
FIG. 1 is a micrograph (×50 magnification) of a composite member fabricated in a Test Example I-1, (I) showing a sample No. I-1-1, (II) showing a sample No. I-1-2, (III) showing a sample No. I-1-3, and (IV) showing a sample No. I-1-4.

In the drawings below, the same reference character refers to an element having the same denotation.

First Form

Lowering in Porosity

Test Example I-1

A composite member made of a composite of pure magnesium or a magnesium alloy and SiC was fabricated, and porosity and thermal characteristics were examined.

A composite member was fabricated as follows. A base material shown in Table 1 (Mg: pure magnesium composed of 99.8 mass % or more Mg and an impurity (denoted as "Mg" in Table 1), AZ31 and AZ91: magnesium alloy containing Al, Zn), SiC powders different in average particle size (average particle size: #120 (approximately 150 μm), #600 (approximately 25 μm), #1000 (approximately 15 μm), and an SiC sintered body were prepared as raw materials. All raw materials used were commercially available.

The raw material SiC powders and the SiC sintered body were subjected to oxidation treatment at a temperature (° C.) shown in Table 1. A heating time period was set to 2 hours for any sample. After the oxidation treatment, an amount of oxide film was measured. Table 1 shows the results. The amount of oxide film was measured with an ICP-AES (inductively coupled plasma atomic emission spectroscopy) apparatus. It is noted that a sample not subjected to oxidation treatment is denoted as "No Oxidation" in Table 1.

A mixture in which coated SiC powders, a coated SiC sintered body that had been subjected to oxidation treatment, and untreated SiC powders were mixed at a mixture ratio (volume ratio) shown in Table 1 was poured into a cast (50 mm×30 mm×6 mm) in a parallelepiped shape, to which vibration was applied subsequently as appropriate for leveling (tap filling). Then, a molten metal to serve as the base material was introduced in the cast and the cast was held at an infiltration temperature (° C.) for an infiltration time period (hour) shown in Table 1, so that the SiC aggregate in the cast was infiltrated with the molten metal. After the infiltration time period above elapsed, the cast was cooled so as to solidify the molten metal, to thereby obtain the composite member (the composite solidified substance). It is noted that a process from introduction to cooling of the molten metal was performed in an Ar atmosphere (atmospheric pressure).

Porosity (%), thermal conductivity (W/K·m), a coefficient of thermal expansion (ppm/K), and an SiC content (volume ratio, %) of each obtained composite member were examined. Table 1 shows the results.

Porosity (%) in the composite member was found as follows. Initially, the obtained composite member was buried in a resin and fixed thereto such that SiC present in a region not impregnated with a metal component (pure magnesium or the magnesium alloy) does not become free. Any cross-section of the composite member buried in the resin was polished with a barrel polishing plate by using commercially available non-corrosive diamond paste and lubricant, and thereafter this cross-section was observed with an optical microscope (magnification: ×50). In this observed image, a region not smaller than 2 mm×3 mm was subjected to image processing with a commercially available image processing apparatus so as to find a total area of all pores present in the region above. A value of {(total area)/(area of the region)}×100 was calculated as porosity in this cross-section, and an average value of porosity of the cross-section for n=3 is shown in Table 1.

Thermal conductivity and a coefficient of thermal expansion of the composite member were measured by cutting a test piece from the obtained composite member and by using a commercially available measuring instrument. It is noted that a coefficient of thermal expansion was measured in a range from 30° C. to 150° C. In addition, a sample of which thermal characteristics could not be measured due to failure in obtaining a test piece for such reasons as insufficient impregnation after lapse of the infiltration time period is denoted as "Measurement Not Available" in Table 1.

The SiC content in the composite member was found as follows. Any cross-section of the composite member was observed with an optical microscope (magnification: ×50), this observed image was subjected to image processing with a commercially available image processing apparatus, a total area of all SiC present in this cross-section was found, a value obtained by converting this total area to a volume ratio was adopted as a volume ratio based on this cross-section, and an average value of the volume ratio of the cross-section for n=3 is shown in Table 1.

TABLE 1

| Sample No. | Base Material Composition | Raw Material SiC Mixture Ratio #120 | #600 #1000 | Oxidation Treatment Temperature (° C.) | Molten Metal Infiltration Temperature (° C.) | Molten Metal Infiltration Time Period (hour) | Thermal Conductivity (W/K · m) | Coefficient of Thermal Expansion 30-150° C. (ppm/K) | SiC Volume Ratio (%) | Oxide Film in Coated SiC (mass %) | Porosity (%) |
|---|---|---|---|---|---|---|---|---|---|---|---|
| I-1-1 | Mg | 8 | 2 | No Oxidation | 875 | 2 | 168 | 9.4 | 59 | 0.18 | 9.5 |
| I-1-2 | Mg | 8 | 2 | 600 | 875 | 2 | 216 | 8.6 | 60 | 0.21 | 6.2 |
| I-1-3 | Mg | 8 | 2 | 875 | 875 | 2 | 225 | 9.7 | 58 | 0.45 | 0.9 |
| I-1-4 | Mg | 8 | 2 | 1000 | 875 | 2 | 235 | 9.7 | 58 | 0.86 | 0.4 |
| I-1-5 | Mg | 8 | 2 | 875 | 750 | 2 | 163 | 9.3 | 58 | 0.45 | 12.1 |
| I-1-6 | AZ31 | 8 | 2 | 875 | 750 | 2 | 169 | 8.4 | 60 | 0.45 | 2.5 |
| I-1-7 | AZ91 | 8 | 2 | 875 | 750 | 2 | 128 | 8.1 | 59 | 0.45 | 2.9 |
| I-1-8 | Mg | 8 | 2 | 875 | 700 | 2 | Not Impregnated | | 58 | 0.45 | Measurement Not Available |
| I-1-9 | AZ31 | 8 | 2 | 875 | 700 | 2 | 151 | 8.8 | 58 | 0.45 | 11.2 |
| I-1-10 | AZ91 | 8 | 2 | 875 | 700 | 2 | 131 | 8.2 | 59 | 0.45 | 2.4 |
| I-1-11 | AZ31 | 8 | 2 | 875 | 875 | 2 | 174 | 7.9 | 61 | 0.45 | 2.7 |
| I-1-12 | AZ91 | 8 | 2 | 875 | 875 | 2 | 129 | 8.1 | 61 | 0.45 | 2.1 |
| I-1-13 | Mg | 8 | 2 | No Oxidation | 1000 | 2 | 220 | 9.2 | 65 | 0.18 | 5.0 |
| I-1-14 | Mg | 8 | 2 | 875 | 1000 | 2 | 223 | 9.1 | 58 | 0.45 | 4.7 |
| I-1-15 | AZ31 | 8 | 2 | 875 | 1000 | 2 | 173 | 8.8 | 58 | 0.45 | 0.8 |
| I-1-16 | AZ91 | 8 | 2 | 875 | 1000 | 2 | 157 | 7.9 | 59 | 0.45 | 0.6 |
| I-1-17 | Mg | 7 | $3^{\#10}$ | 875 | 875 | 2 | 228 | 7.8 | 70 | 0.66 | 0.8 |
| I-1-18 | Mg | 7 | $3^{\#10}$ | 875 | 825 | 2 | 234 | 7.6 | 69 | 0.66 | 0.6 |
| I-1-19 | Mg | 7 | $3^{\#10}$ | 875 | 775 | 2 | 216 | 8.2 | 70 | 0.66 | 0.9 |
| I-1-20 | Mg | 7 | $3^{\#10}$ | 875 | 725 | 2 | 223 | 7.7 | 70 | 0.66 | 1.2 |
| I-1-21 | Mg | 7 | $3^{\#10}$ | 875 | 675 | 2 | 208 | 7.8 | 69 | 0.66 | 8.5 |
| I-1-22 | Mg | 7 | $3^{\#10}$ | 875 | 675 | 6 | 224 | 7.6 | 69 | 0.66 | 1.4 |
| I-1-23 | Mg | 7 | $3^{\#10}$ | 1000 | 675 | 2 | 220 | 7.7 | 70 | 1.18 | 1.3 |
| I-1-24 | Mg | Sintered Body | | 875 | 875 | 2 | 238 | 4.6 | 80 | 0.46 | 1.1 |
| I-1-25 | Mg | Sintered Body | | 875 | 875 | 2 | 239 | 4.4 | 80 | 0.46 | 1.2 |

$x^{\#10}$Sample containing #1000 SiC powders; and
x: Sample containing #600 SiC powders (x = 2 or 3)

As shown in Table 1, it can be seen that the composite member of which porosity is lower than 3% is higher in thermal conductivity than others identical in composition of the base material. In addition, it can be seen that such a composite member can be manufactured by performing oxidation treatment at a heating temperature not lower than 700° C., employing coated SiC powders having an oxide film not lower than 0.4 mass % with respect to SiC formed, and adjusting as appropriate an infiltration temperature in accordance with composition of a base material. Moreover, it can be seen that the amount of oxide film can be increased to an amount exceeding 0.65 mass % by decreasing an average particle size of the raw material SiC powders, increasing an amount of use of small SiC powders, and raising a temperature for oxidation treatment. Then, it can be seen that, by setting the amount of oxide film to an amount exceeding 0.65 mass %, a composite member lower in porosity and higher in thermal conductivity than in a case where the amount of oxide film is set to 0.45 mass % can be manufactured even if the infiltration temperature is low.

Figure 2:
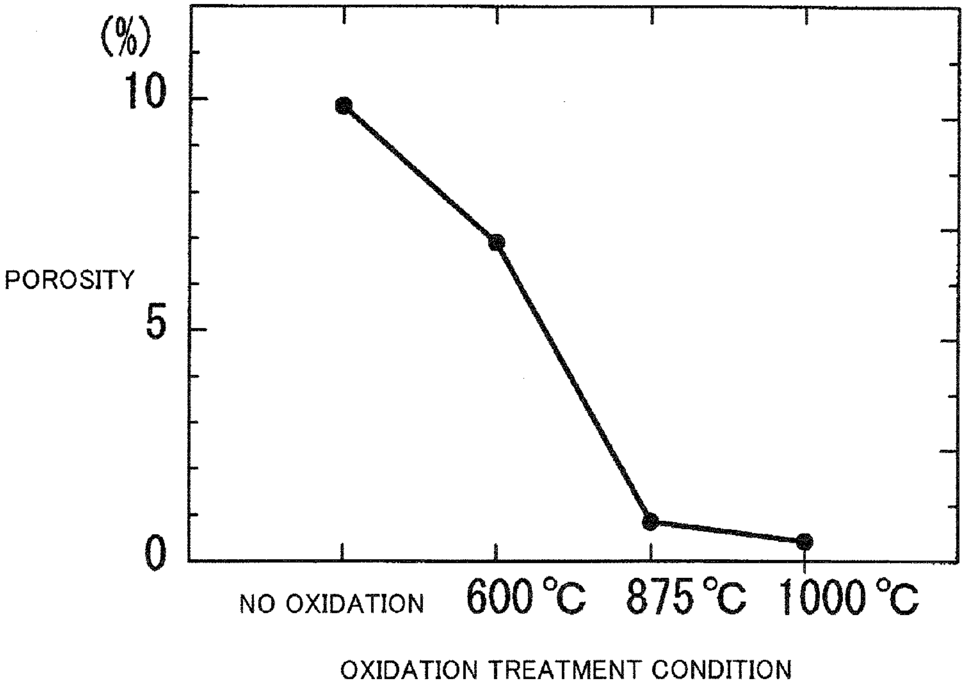
FIG. 2 is a graph showing relation between a heating temperature in subjecting raw material SiC to oxidation treatment and porosity of an obtained composite member, with regard to a sample in which SiC powders of #120:#600=8:2 were adopted as a raw material, among samples fabricated in Test Example I-1.

In the micrograph in FIG. 1, a portion that looks black represents pores, and a plurality of particulate substances that look rectangular represent SiC (to be understood similarly also in FIG. 3 which will be described later). As shown in FIG. 1, it can be seen that pores in samples Nos. I-1-3 and I-1-4 manufactured with the coated SiC powders were considerably decreased as compared with sample No. I-1-1 manufactured with untreated SiC powders. In particular, it can be seen that a large number of large pores are observed in sample No. I-1-1, whereas there are fewer large pores in sample No. I-1-3 (the amount of oxide film: 0.45 mass %). It can be seen that there are many pores also in sample No. I-1-2 (the amount of oxide film: 0.21 mass %) for which a heating temperature was set to a temperature lower than 700° C. In sample No. I-1-4 (the amount of oxide film: 0.86 mass %) for which the heating temperature for oxidation treatment was further raised, pores cannot substantially be observed. It can be seen from these photographs in FIG. 1 and the graph in FIG. 2 that pores can considerably be decreased if the heating temperature for oxidation treatment is not lower than 700° C. and in particular not lower than 800° C. and the amount of oxide film is not lower than 0.4 mass %. In addition, it can be seen that pores can sufficiently be decreased even though the amount of oxide film is not higher than 1 mass %.

Further, a cross-section of each sample of the composite member of which porosity was lower than 3%, manufactured with the coated SiC powders having the oxide film formed with the heating temperature being set to 700° C. or higher, was analyzed with an Auger electron spectroscope. Consequently, oxygen was observed in the SiC outer peripheral region in the central region (oxygen) of each sample, and concentration of this oxygen was higher than in the main region with respect to this SiC. This fact supports that the oxide film formed on raw material SiC and the molten metal reacted to each other and contact between SiC and the molten metal was promoted. It is noted that concentration of oxygen was compared by selecting SiC in the central region (oxygen) and by selecting any five measurement points in the outer peripheral region with respect to this SiC (a point at a distance by 150 nm outward from the contour line of SiC) and in the main region, and concentration of oxygen at all five points in the SiC outer peripheral region was higher than in the main region.

Furthermore, among composite members manufactured with the coated SiC powders on which the oxide film was formed with the heating temperature being set to 700° C. or higher, a composite member achieving high thermal conductivity not lower than 180 W/K·m was obtained and the tendency is such that thermal conductivity is improved as porosity is lower. In addition, the composite member of which thermal conductivity is not lower than 180 W/K·m and coefficient of thermal expansion is from 4 to 10 ppm/K is expected to suitably be made use of as a heat radiation member, because it has thermal characteristics required in a heat radiation member of a semiconductor element.

Additionally, it can be seen that porosity can be lowered by setting an infiltration temperature to 675° C. or higher, in manufacturing a composite member with the use of coated SiC powders. If the infiltration temperature was set to 1000° C. in a case where the metal component in the composite member was pure magnesium, porosity exceeded 3% in some cases. This may be because of generation of shrinkage cavities or gas holes, and it seems that improvement can be achieved by taking such measures as retaining a molten state for a sufficient period of time at a temperature not higher than 875° C. and performing dehydrogenation before the solidification step.

Test Example I-2

A composite solidified substance made of a composite of pure magnesium and SiC was subjected to pressurization treatment to thereby fabricate a composite member, and porosity thereof was examined.

In this test, a plurality of composite solidified substances were fabricated under the conditions similar to those for the composite solidified substance represented as sample No. I-1-1 fabricated in Test Example I-1 (a substance fabricated with the use of untreated SiC powders), and each composite solidified substance was subjected to the following pressurization treatment.

The fabricated composite solidified substance was subjected to pressurization treatment under such conditions as 1 to 5 ton/cm$^2$ and 10 minutes while it was held at a temperature from room temperature (30° C.) to 600° C., to thereby fabricate the composite member. Manufacturing conditions and porosity of each sample are shown in Table 2.

Porosity (%) of the obtained composite member was measured as in Test Example I-1. Table 2 shows the results. In addition, an SiC content in the obtained composite member was found as in Test Example I-1, and it ranged from 58 to 60 volume % in any sample.

Table 2

| | Raw Material SiC | | | | | Pressurization Treatment | | |
|---|---|---|---|---|---|---|---|---|
| Sample | Base Material | Mixture Ratio | | Oxidation Treatment | Molten Metal Infiltration | Temperature | Pressure | Porosity |
| No. | Composition | #120 | #600 | Temperature (° C.) | Temperature (° C.) | (° C.) | (t/cm$^2$) | (%) |
| I-1-1 | Mg | 8 | 2 | No Oxidation | 875 | — | — | 9.9 |
| I-2-1 | Mg | 8 | 2 | No Oxidation | 875 | 30 | 1 | 9.9 |
| I-2-2 | Mg | 8 | 2 | No Oxidation | 875 | 30 | 3 | 9.1 |
| I-2-3 | Mg | 8 | 2 | No Oxidation | 875 | 30 | 5 | 5.0 |
| I-2-4 | Mg | 8 | 2 | No Oxidation | 875 | 150 | 1 | 9.4 |
| I-2-5 | Mg | 8 | 2 | No Oxidation | 875 | 150 | 3 | 5.1 |
| I-2-6 | Mg | 8 | 2 | No Oxidation | 875 | 150 | 5 | 3.5 |
| I-2-7 | Mg | 8 | 2 | No Oxidation | 875 | 240 | 1 | 7.5 |
| I-2-8 | Mg | 8 | 2 | No Oxidation | 875 | 240 | 3 | 4.4 |
| I-2-9 | Mg | 8 | 2 | No Oxidation | 875 | 240 | 5 | 1.2 |
| I-2-10 | Mg | 8 | 2 | No Oxidation | 875 | 400 | 1 | 5.6 |
| I-2-11 | Mg | 8 | 2 | No Oxidation | 875 | 400 | 3 | 4.6 |
| I-2-12 | Mg | 8 | 2 | No Oxidation | 875 | 400 | 5 | 1.2 |

Table 2-continued

| Sample | Base Material | Raw Material SiC Mixture Ratio | | Oxidation Treatment | Molten Metal Infiltration | Pressurization Treatment | | |
|---|---|---|---|---|---|---|---|---|
| No. | Composition | #120 | #600 | Temperature (° C.) | Temperature (° C.) | Temperature (° C.) | Pressure (t/cm$^2$) | Porosity (%) |
| I-2-13 | Mg | 8 | 2 | No Oxidation | 875 | 500 | 1 | 4.3 |
| I-2-14 | Mg | 8 | 2 | No Oxidation | 875 | 500 | 3 | 3.3 |
| I-2-15 | Mg | 8 | 2 | No Oxidation | 875 | 500 | 5 | 0.7 |
| I-2-16 | Mg | 8 | 2 | No Oxidation | 875 | 600 | 5 | 0.6 |

Figure 3:
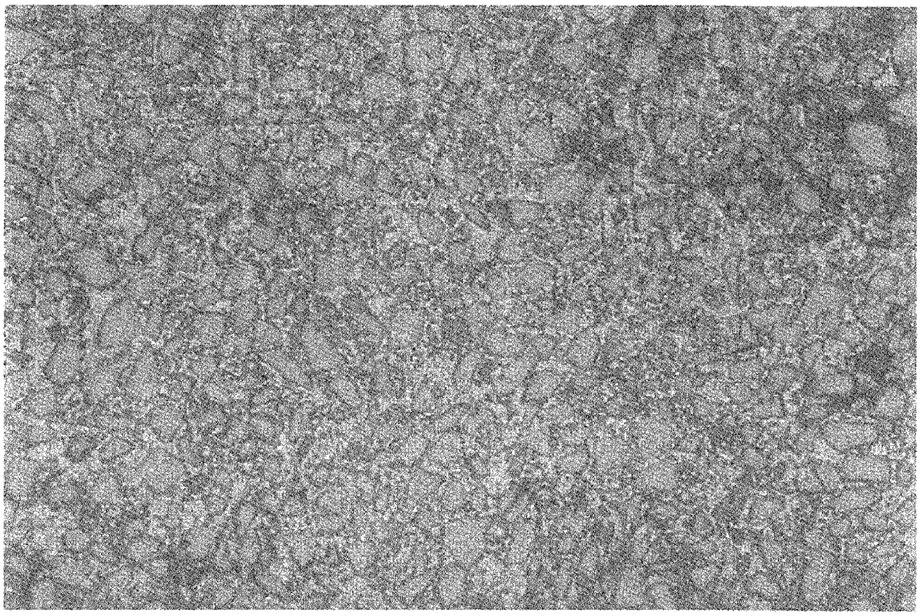
FIG. 3 is a micrograph (×50 magnification) of a composite member fabricated in a Test Example I-2, (I) showing a sample No. I-2-9 and (II) showing a sample No. I-2-16.
Figure 3:
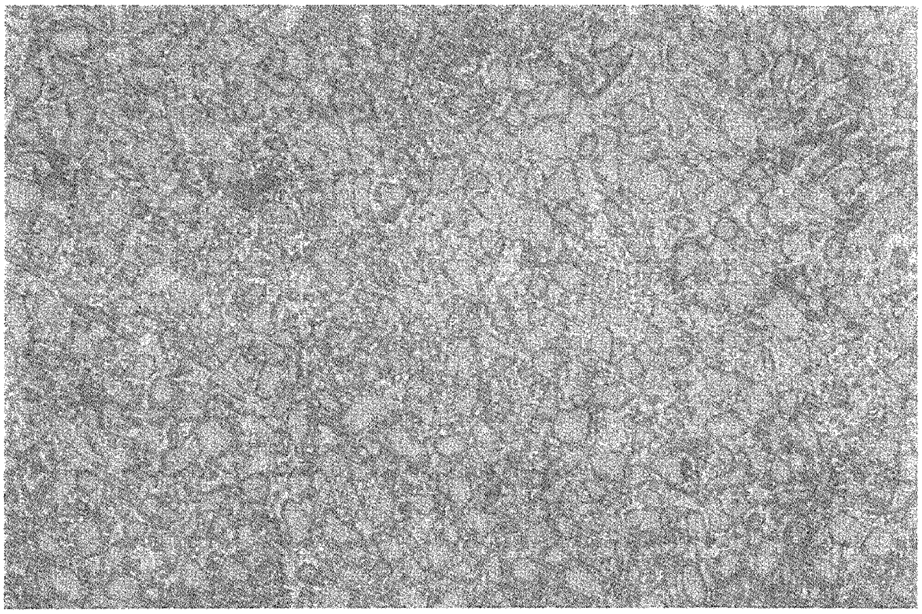

As shown in FIG. 3, it can be seen that large pores can be eliminated by performing pressurization treatment under a specific condition. Specifically, as shown in Table 2, it can be seen that porosity of the composite member significantly lowers by setting an applied pressure to 5 ton/cm$^2$ or higher at room temperature, by setting an applied pressure to 3 t/cm$^2$ or higher at a heating temperature of 150° C., and by setting an applied pressure to 1 t/cm$^2$ or higher at a heating temperature not lower than 240° C. In addition, it can be seen that porosity can effectively be lowered as the heating temperature at the time of pressurization is higher and the applied pressure is higher. The composite member low in porosity thus fabricated is considered to exhibit high thermal conduction characteristics as in Test Example I-1. It can be seen from this test that a composite member low in porosity is obtained by performing specific pressurization treatment after treatment of infiltration with the molten metal without subjecting raw material SiC to specific treatment. Moreover, it is expected that porosity can effectively be lowered if the composite solidified substance in which raw material SiC has been subjected to specific treatment is subjected to the specific pressurization treatment above.

Second Form

Formation of Network Portion

Embodiment II-1

Test Example II-1

A substrate (composite member) made of a composite material made of a composite of pure magnesium and SiC was fabricated and thermal characteristics thereof were examined.

An ingot (a commercially available product) of pure magnesium composed of 99.8 mass % or more Mg and an impurity and a commercially available SiC sintered body (relative density of 80%, 200 mm long×100 mm wide×5 mm thick) were prepared as raw materials.

The prepared SiC sintered body was subjected to oxidation treatment at 875° C.×2 hours so as to form an oxide film, so that wettability between molten pure magnesium and the SiC sintered body was enhanced. The step of oxidation treatment above may not be performed.

The composite member was formed by accommodating the SiC sintered body above in a cast, infiltrating the sintered body with molten pure magnesium, and solidifying pure magnesium.

The cast above is made of carbon, it is a box in a parallelepiped shape opening on one side, and it is integrally formed by combining a plurality of divided pieces. An internal space of this cast is made use of as a space for accommodating the sintered body. Here, the internal space of the cast was made to have a size conforming to the sintered body above, so that there was substantially no gap provided between the sintered body and the cast when the sintered body was accommodated in the cast. It is noted that an integrally molded cast may be made use of instead of a construction formed by combining divided pieces.

In addition, here, the sintered body above was accommodated in the cast after a commercially available release agent was applied to a portion of contact of an inner surface of the cast with the sintered body. Release of the composite member can be facilitated by applying the release agent. The step of applying this release agent may not be performed. This matter relating to the release agent is similarly applicable also to the first form described above and each form which will be described later.

The cast above has an ingot placement portion coupled to a periphery of an opening portion, on which the prepared ingot above is arranged. By heating this cast to a prescribed temperature, the ingot is molten. Heating of the cast is carried out by loading the cast in an atmosphere furnace capable of heating.

Here, the atmosphere furnace above was adjusted such that the infiltration temperature was set to 775° C., an Ar atmosphere was set, and a pressure of the atmosphere was set to an atmospheric pressure. Molten pure magnesium flowed into the internal space of the cast through the opening portion of the cast and the sintered body arranged in the internal space was infiltrated therewith. After infiltration, the cast was cooled to solidify pure magnesium. Here, a bottom portion side was positively cooled such that cooling was achieved in one direction from the bottom portion of the cast toward the opening portion. By carrying out cooling as such, internal defects can be reduced even in a large-sized composite member, and a high-quality composite member is obtained. In a case of a small-sized composite member, a high-quality composite member is obtained without carrying out cooling in one direction as described above.

Figure 4:
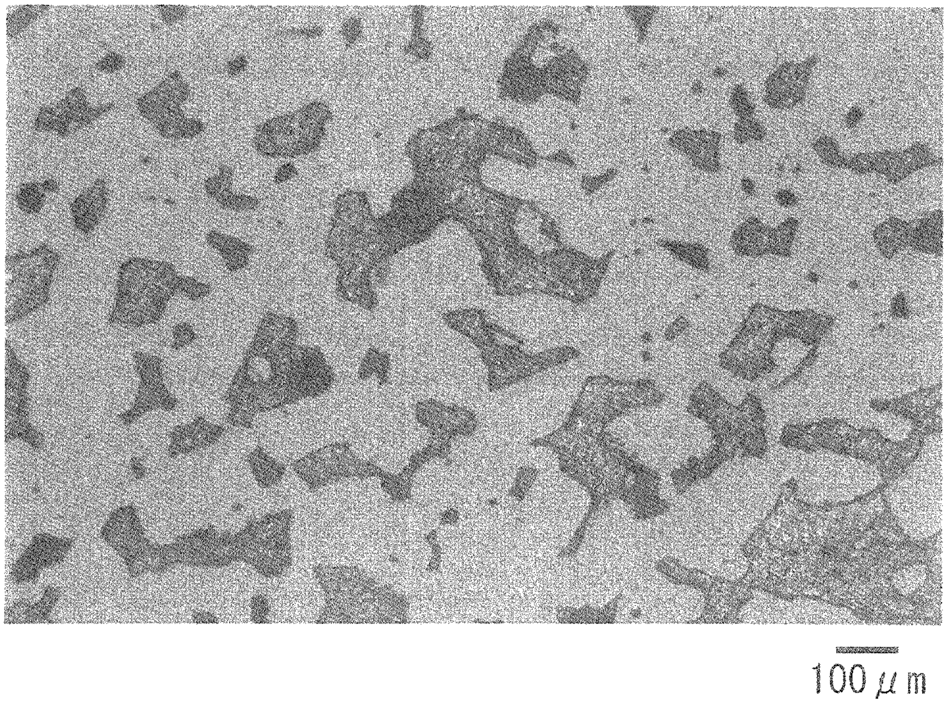
FIG. 4 is a micrograph (×50 or ×500 magnification) of a cross-section of a composite member in an Embodiment II-1, (I) showing an example where a network portion is thick (×50 magnification) and (II) showing an example where a network portion is thin (×500 magnification).
Figure 4:
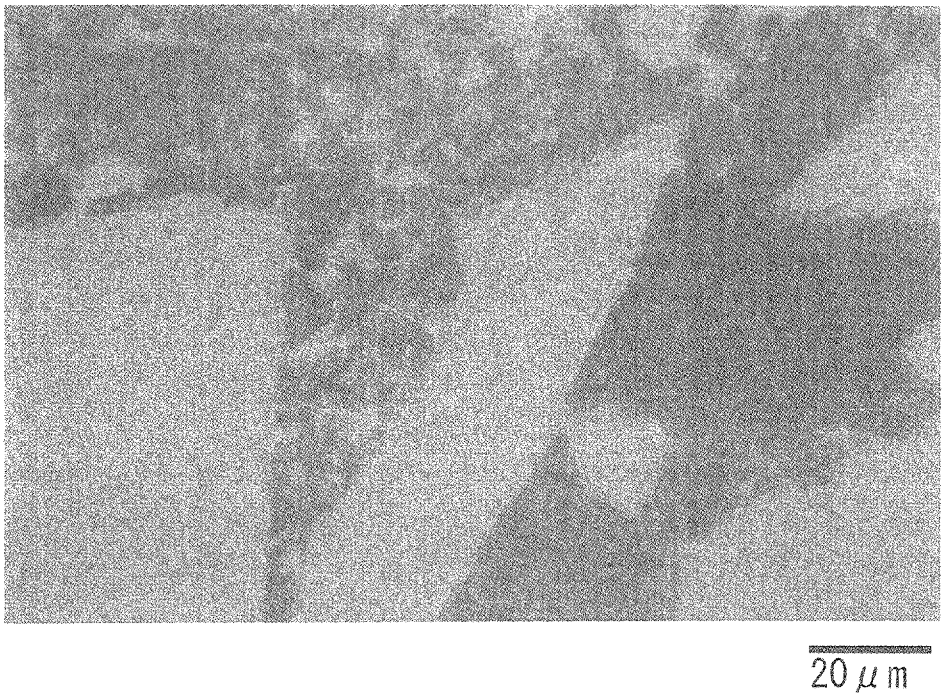

The composite member of 200 mm long×100 mm wide×5 mm thick was obtained with the use of the cast above. Components of the obtained composite member were examined with the use of an EDX apparatus. Then, the components were Mg and SiC and the remainder of inevitable impurities, that were the same as in the used raw materials. In addition, the obtained composite member was subjected to a CP (Cross-section Polisher) process to expose a cross-section, that was examined in SEM observation. Then, SiC was directly bonded to each other. Namely, such a porous body that a network portion was formed of SiC was obtained, that was the same as in the used raw material sintered body. In addition, the cross-section of the obtained composite member was observed with an optical microscope (×50 magnification or ×500 magnification), Then, it could be confirmed that a gap between SiC and SiC was infiltrated with pure magnesium as shown in FIGS. 4(I) and 4(II). A portion forming a continuous web shape in FIG. 4(I) represents SiC, while a portion clustered like a particle represents pure magnesium. It can be seen that this composite member has a thick network portion. A portion of light color in FIG. 4(II) represents SiC (including a large mass), while a portion of dark color represents pure magnesium. It can be seen that this composite member has a thin network portion.

An SiC content in each obtained composite member was measured. Then, the SiC content was 80 volume % in each composite member. The SiC content was found in such a manner that any cross-section of the composite member was observed with an optical microscope (×50 magnification), the observed image was subjected to image processing with a commercially available image analysis apparatus, a total area of SiC in this cross-section was found, a value obtained by converting this total area into a volume ratio was adopted as a volume ratio based on this cross-section (area ratio≈volume ratio), a volume ratio in the cross-section for n=3 was found, and an average value thereof was calculated.

composite member is expected to suitably be made use of as a constituent material for a heat radiation member of the semiconductor element above.

Test Example II-2

SiC aggregates were fabricated under various conditions, and the SiC aggregates were infiltrated with pure magnesium to thereby fabricate composite members. Thermal characteristics of the obtained composite members were examined.

An ingot (a commercially available product) of pure magnesium composed of 99.8 mass % or more Mg and an impurity and commercially available SiC powders (particle size from 10 to 170 μm, average particle size: 120 μm) were prepared as raw materials. Then, SiC aggregates (200 mm long×100 mm wide×5 mm thick) were fabricated under the conditions shown in Table 3 and infiltrated with molten pure magnesium under the conditions the same as in Test Example II-1, followed by solidification.

TABLE 3

| | | Network Portion Forming Method | | | | | | | SiC | | Rate of |
|---|---|---|---|---|---|---|---|---|---|---|---|
| | | | | Sintering | Network Portion | | | | Amount | Thermal | Thermal |
| Sample No. | Molding Method | Method | Atmosphere | Temperature ° C. | Presence/ Absence | Constituent Material | Thickness | Oxidation Treatment | Volume % | Conductivity W/mK | Expansion ppm/K |
| II-1 | CIP | — | — | — | Absent | — | — | Yes | 70.6 | 219 | 7.4 |
| II-2 | CIP | — | — | — | Absent | — | — | No | 70.7 | 201 | 7.3 |
| II-3 | CIP | — | — | — | Absent | — | — | Yes | 79.7 | 253 | 5.7 |
| II-4 | CIP | — | — | — | Absent | — | — | Yes | 86.3 | 264 | 4.9 |
| II-5 | CIP | Sintering | Vacuum | 1800 | Present | SiC | Thin | Yes | 80.3 | 270 | 4.4 |
| II-6 | CIP | Sintering | Vacuum | 1800 | Present | SiC | Thin | No | 79.7 | 241 | 4.3 |
| II-7 | CIP | Sintering | Vacuum | 2200 | Present | SiC | Thick | Yes | 79.8 | 301 | 4.0 |
| II-8 | CIP | Sintering | Vacuum | 2200 | Present | SiC | Thick | No | 79.9 | 274 | 4.0 |
| II-9 | CIP | Sintering | Vacuum | 2200 | Present | SiC | Thick | Yes | 85.7 | 318 | 3.7 |
| II-10 | Tapping | — | — | — | Absent | — | — | Yes | 59.8 | 207 | 9.4 |
| II-11 | Tapping | — | — | — | Absent | — | — | Yes | 64.7 | 211 | 8.5 |
| II-12 | Tapping | Sintering | Vacuum | 2200 | Present | SiC | Thick | Yes | 59.7 | 224 | 5.0 |
| II-13 | Tapping | Sintering | Vacuum | 1800 | Present | SiC | Thin | Yes | 59.8 | 219 | 7.1 |
| II-14 | Tapping | Sol-Gel | — | — | Present | SiC | Thin | Yes | 59.8 | 217 | 7.2 |
| II-15 | Tapping | Sintering | Vacuum | 2200 | Present | SiC | Thick | Yes | 64.6 | 232 | 4.6 |
| II-16 | Tapping | Sintering (Si) | Nitrogen | 1600 | Present | $Si_4N_3$ | Thick | Yes | 60.4 | 201 | 4.9 |
| II-17 | Tapping | Sintering (Si) | Nitrogen | 1600 | Present | $Si_4N_3$ | Thick | Yes | 64.7 | 205 | 4.5 |
| II-18 | Slip Casting | Sintering | Vacuum | 1800 | Present | SiC | Thin | Yes | 80.1 | 268 | 4.4 |
| II-19 | Dry Pressing | Sintering | Vacuum | 1800 | Present | SiC | Thin | Yes | 79.6 | 269 | 4.5 |
| II-20 | Wet Pressing | Sintering | Vacuum | 1800 | Present | SiC | Thin | Yes | 80.1 | 271 | 4.4 |
| II-21 | Doctor Blade | Sintering | Vacuum | 1800 | Present | SiC | Thin | Yes | 80.3 | 272 | 4.3 |
| II-22 | Slip Casting | — | — | — | Absent | — | — | Yes | 70.0 | 217 | 7.2 |
| II-23 | Dry Pressing | — | — | — | Absent | — | — | Yes | 70.2 | 220 | 7.5 |
| II-24 | Wet Pressing | — | — | — | Absent | — | — | Yes | 70.4 | 221 | 7.4 |
| II-25 | Doctor Blade | — | — | — | Absent | — | — | Yes | 70.1 | 219 | 7.3 |

Coefficient of thermal expansion α (ppm/K) and thermal conductivity κ (W/m·K) of each obtained composite member were measured. Then, the composite member having a thick network portion had coefficient of thermal expansion α: 4.0 ppm/K and thermal conductivity κ: 301 W/m·K, and the composite member having a thin network portion had coefficient of thermal expansion α: 4.4 ppm/K and thermal conductivity κ: 270 W/m·K. The coefficient of thermal expansion and the thermal conductivity were measured by cutting a test piece from the obtained composite member and by using a commercially available measuring instrument. The coefficient of thermal expansion was measured in a range from 30° C. to 150° C.

From the foregoing, the obtained composite member has excellent adaptability to a semiconductor element or peripherals thereof having a coefficient of thermal expansion around 4 ppm/K and also high thermal conductivity. Therefore, the Regarding the sample for which "tapping" was adopted as a molding method, a powder molded body was fabricated with the SiC powders above. Regarding the samples indicated with "Oxidation Treatment: Yes" among the samples above, an SiC aggregate was fabricated with the SiC powders including the oxide film, that were obtained by subjecting the SiC powders above to oxidation treatment at 1000° C.×2 hours.

Regarding the samples for which "CIP" or "dry pressing" was adopted as a molding method, a powder molded body was fabricated under known conditions, with the use of the SiC powders above. Regarding the samples for which "wet pressing" or "doctor blade" was adopted as a molding method, in addition to the SiC powders above, water was used in wet pressing and an organic solvent was used in the doctor blade method, to thereby fabricate a powder molded body under known conditions.

Regarding the samples for which "slip casting" was adopted as a molding method, slurry was fabricated by preparing SiC powders, a surfactant and water, setting a volume ratio between water and SiC powders to water:SiC powders≈5:5, and then adding the surfactant. Here, slurry including 20 mass % urea aqueous solution (with the entire slurry being assumed as 100 mass %) was prepared. Alternatively, slurry or the like including a commercially available polycarboxylic-acid-based aqueous solution may be made use of. The fabricated slurry was poured into the cast followed by air drying, to thereby fabricate a powder molded body.

The sample for which "sintering" was adopted as a method of forming a network portion was obtained by sintering the fabricated powder molded body above under the conditions in Table 3. The sample for which "sintering (Si)" was adopted as a method of forming a network portion was obtained by fabricating a powder molded body with the use of a powder mixture in which SiC powders and Si powders (average particle size: 0.1 μm) were mixed and by sintering this powder molded body under the conditions in Table 3.

Regarding the sample for which "sol-gel" was adopted as a method of forming a network portion, a solution of polycarbosilane was prepared, a fabricated powder molded body was infiltrated therewith, and thereafter it was heated to 800° C.

Components of each obtained composite member were examined with the use of an EDX apparatus. Then, the samples except for samples Nos. II-16 and II-17 contained the components of Mg and SiC and the remainder of inevitable impurities, that were the same as in the used raw materials. In samples Nos. II-16 and II-17, $Si_4N_3$ was present between SiC and SiC. In addition, the obtained composite member was observed with an SEM as in Test Example II-1. Then, in any of the sample sintered at a temperature not lower than 1800° C., the sample sintered in a nitrogen atmosphere, and the sample for which the sol-gel method was made use of, a network portion bonding SiC to each other was present and each sample had a porous body. On the other hand, the samples for which sintering was not performed or the sol-gel method was not adopted were all in such a state that SiC particles were dispersed randomly in a base material of pure magnesium.

An SiC content, coefficient of thermal expansion α (ppm/K) and thermal conductivity κ (W/m·K) of each obtained composite member were measured as in Test Example II-1. Table 3 shows the results.

As shown in Table 3, it can be seen that each sample of which SiC content exceeds 70 volume % is low in coefficient of thermal expansion and satisfies 4 ppm/K to 8 ppm/K. In addition, it can be seen that the sample having a network portion in spite of its SiC content being in a range from 50 volume % to 70 volume % is low in coefficient of thermal expansion and satisfies 4 ppm/K to 8 ppm/K. Moreover, it can be seen that the coefficient of thermal expansion becomes lower as the SiC content increases. Additionally, it can be seen that each sample satisfying a coefficient of thermal expansion in a range from 4 ppm/K to 8 ppm/K is high in thermal conductivity, that is, not lower than 180 W/m·K.

Further, the following can be seen from Table 3, based on comparison between the samples of which SiC content is substantially the same.

(1) A sample for which sintering was performed has a low coefficient of thermal expansion and high thermal conductivity.

(2) Thermal conductivity can be improved by making use of an SiC aggregate including an oxide film.

(3) A sample in which SiC is directly bonded to each other, that is, a sample having a network portion composed of SiC, is higher in thermal conductivity than a sample having a network portion composed of a non-metal inorganic material other than SiC.

Furthermore, it can be seen that the composite member of which SiC content exceeds 70 volume % is obtained by using any one of slip casting, pressure forming and the doctor blade method.

In addition, regarding the sample having a network portion, the sample having a thick network portion as shown in FIG. 4(I) and the sample having a thin network portion as shown in FIG. 4(II) were obtained. Then, the sample having the network portion was subjected to a CP process to expose a cross-section, that was observed with an SEM (×50 magnification here). In this cross-section, any line segment of 1 mm was taken with respect to an actual dimension of each sample, and the number of intersections between the contour line of the SiC aggregate in the composite member and the line segment above was counted. Here, an average for n=5 (n: the number of line segments) was calculated, the sample of which average number of intersections was not greater than 50 was defined as having a thick network portion, and the sample of which average number of intersections exceeded 50 was defined as having a thin network portion. Table 3 shows the results. It is noted that magnification of the cross-section can be adjusted as appropriate for facilitating observation.

As shown in Table 3, it can be seen that the network portion tends to be thick when the sintering temperature is not lower than 2000° C. For example, sample No. II-5 and sample No. II-7 manufactured under the same conditions except for difference in sintering temperature were compared with each other. Then, in sample No. II-5 for which the sintering temperature was lower than 2000° C., the number of intersections above was 224 (n=a value from 1 to 5: 130 to 320), and in sample No. II-7 for which the sintering temperature was not lower than 2000° C., the number of intersections above was 11 (n=a value from 1 to 5: 8 to 14).

In addition, as shown in Table 3, it can be seen that, if the SiC content is substantially the same, the sample having a thick network portion is lower in coefficient of thermal expansion and higher in thermal conductivity than the sample having a thin network portion and thus excellent in thermal characteristics. On the other hand, the sample having a thin network portion is excellent in mechanical characteristics. For example, comparing sample No. II-5 and sample No. II-7 above with each other, sample No. II-5 having a thin network portion had a coefficient of elasticity of 270 GPa and tensile strength of 180 MPa, whereas sample No. II-7 having a thick network portion had a coefficient of elasticity of 250 GPa and tensile strength of 60 MPa. It is noted that a coefficient of elasticity and tensile strength were measured with a commercially available measurement apparatus.

Moreover, as shown in Table 3, it can be seen that, in a case where an SiC aggregate containing Si is fabricated and sintered in a nitrogen atmosphere, the network portion tends to be thick even though the sintering temperature is lower than 2000° C.

The composite member satisfying a coefficient of thermal expansion from 4 ppm/K to 8 ppm/K in Test Example II-2 is not only excellent in adaptability to a semiconductor element or peripheral thereof having a coefficient of thermal expansion around 4 ppm/K but also high in thermal conductivity. Therefore, these composite members are also expected to suitably be made use of as a constituent material for a heat radiation member of the semiconductor element above.

Embodiment II-2

A composite member including a substrate composed of a composite material made of a composite of pure magnesium and SiC and a metal coating layer covering each of two opposing surfaces of the substrate was fabricated, and thermal characteristics of the obtained composite member were examined.

An ingot of pure magnesium as in Test Example II-1 in Embodiment II-1 and an SiC sintered body were prepared as raw materials. In addition, the SiC sintered body was subjected to oxidation treatment as in Test Example II-1 in Embodiment II-1. Moreover, a pair of plate-shaped spacers each having a size of 10 mm long×100 mm wide×0.5 mm thick and made of carbon was prepared.

Here, a cast having such a size as allowing arrangement of the spacer above between the SiC sintered body and the cast is made use of. Such a state that the SiC sintered body and the pair of spacers were accommodated in the cast to which a release agent had been applied as appropriate and the pair of spacers sandwiched the SiC sintered body was set. Being sandwiched between the spacers above, the sintered body is arranged in the cast in a stable manner, and a gap corresponding to a thickness of the spacer (a gap of 0.5 mm here) is provided between the SiC sintered body and the cast. This cast was loaded into an atmosphere furnace as in Embodiment II-1. Then, a composite of the SiC sintered body and molten pure magnesium was made under the conditions the same as in Embodiment II-1. In this composite step, molten pure magnesium flows into a gap between the cast and the SiC sintered body provided by the spacer, so that a metal coating layer made of pure magnesium was formed on each of two opposing surfaces of the substrate made of a composite.

Figure 5:
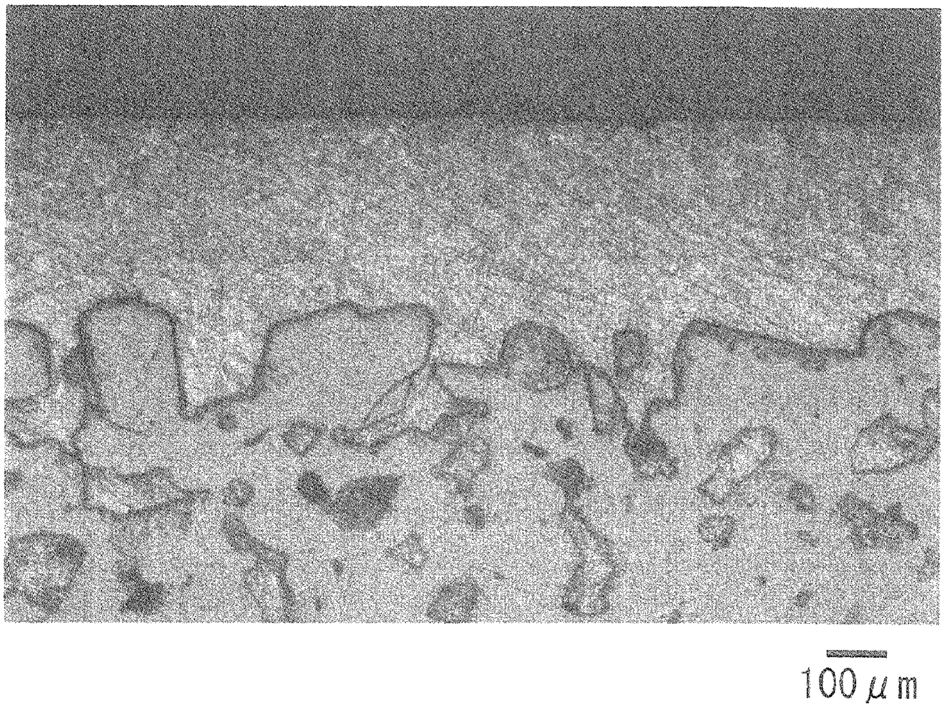
FIG. 5 is a micrograph (×50 magnification) of a cross-section of a composite member in an Embodiment II-2.

As described above, the composite member including the substrate composed of the composite material made of a composite of SiC and pure magnesium and the metal coating layer composed of pure magnesium on each of the two opposing surfaces of the substrate was obtained. The cross-section of the obtained composite member was observed with an optical microscope (×50 magnification). Then, it could be confirmed that SiC was in a web shape, that is, a network portion was formed, as shown in FIG. 5. In addition, it could be confirmed that the gap between SiC and SiC was infiltrated with pure magnesium and the metal coating layer composed of pure magnesium was provided on the surface of the substrate above. Composition of a constituent metal of this substrate and the metal coating layer was examined with an EDX apparatus, and it was found that the composition was the same (pure magnesium). Moreover, it could be confirmed from the observed image of the cross-section above that each metal coating layer had a texture continuous to pure magnesium in the substrate above. Further, the observed image of the cross-section above was used to measure a thickness of each metal coating layer, and it was approximately 0.5 mm (500 μm). It could be confirmed that this thickness was substantially identical to the thickness of the spacer above.

An SiC content in a portion where a composite of pure magnesium and SiC was made, that is, a portion other than the metal coating layer, in the obtained composite member, was measured, and it was 80 volume %. The SiC content was measured as in Embodiment II-1.

Moreover, coefficient of thermal expansion $\alpha$ (ppm/K) and thermal conductivity $\kappa$ (W/m·K) of the obtained composite member were measured. Then, coefficient of thermal expansion $\alpha$ was 5.1 ppm/K and thermal conductivity $\kappa$ was 250 W/m·K. The coefficient of thermal expansion and the thermal conductivity were measured as in Embodiment II-1.

From the foregoing, the obtained composite member is not only excellent in adaptability to a semiconductor element or peripherals thereof having a coefficient of thermal expansion around 4 ppm/K but also high in thermal conductivity. Therefore, the composite member is expected to suitably be made use of as a constituent material for a heat radiation member of the semiconductor element above. In addition, the composite member according to Embodiment II-2 can be plated with Ni through electroplating, as it includes the metal coating layers on respective opposing surfaces of a base member. Plating with Ni enhances solderability. Even in a case where the composite member is made use of in a semiconductor device for which solder is desired, the composite member can sufficiently adapt thereto. Further, in the composite member according to Embodiment II-2, a thickness or a region to be formed of the metal coating layer can readily be varied by selecting a thickness or a shape of a spacer as appropriate.

Though a construction in which metal coating layers are formed on respective opposing surfaces of a substrate made of a composite material has been described in Embodiment II-2 above, a metal coating layer may be formed only on any one surface. In this case, a spacer is preferably arranged only on one surface of an SiC aggregate.

Third Form

Formation of Metal Coating Layer

Test Example III-1

A composite member was fabricated with the use of a cast made of a specific material. Here, an ingot of pure magnesium composed of 99.8 mass % or more Mg and an impurity and particulate SiC powders (particle size from 10 to 170 μm, average particle size: 120 μm) were prepared as raw materials. All raw materials used were commercially available.

Figure 7:
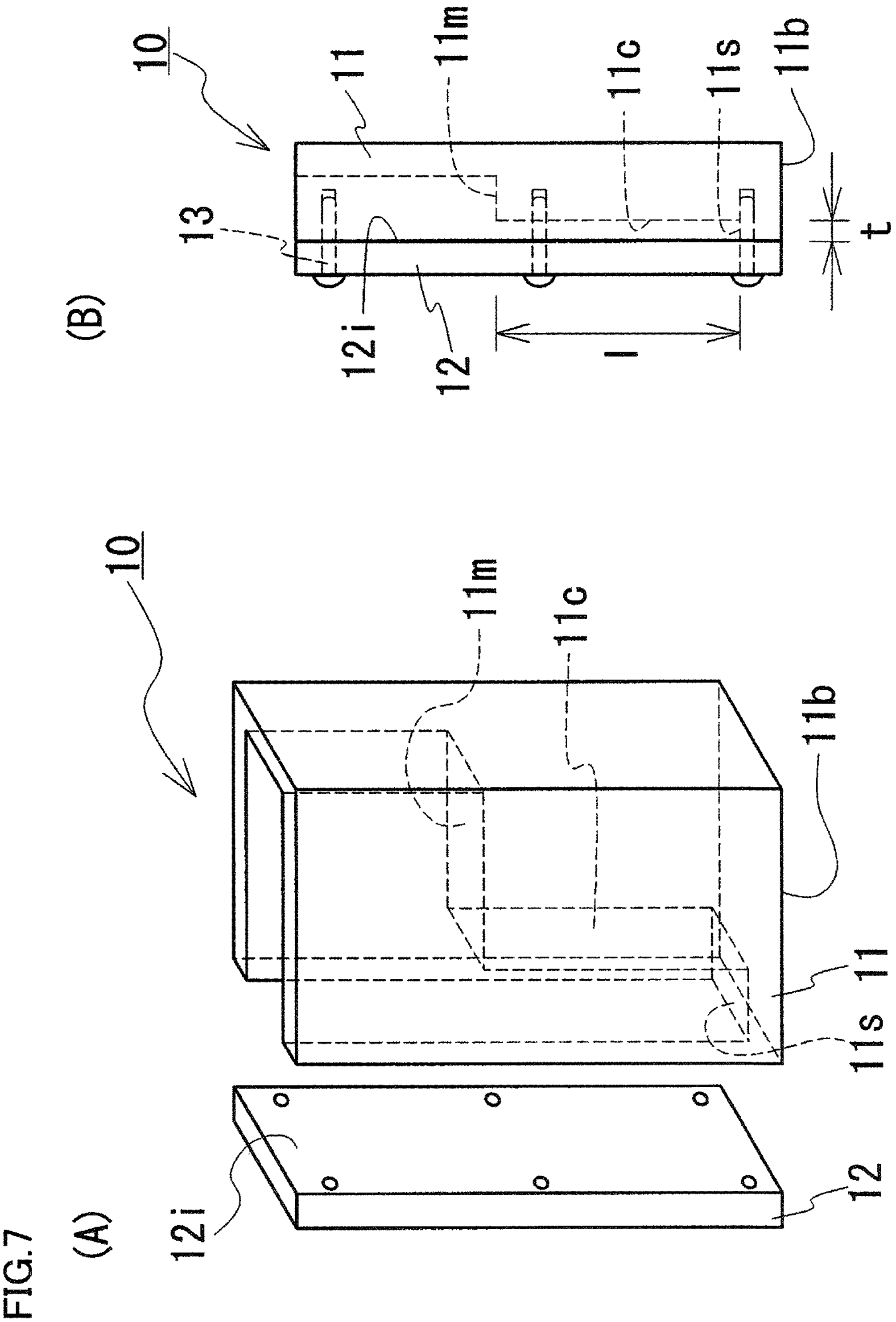
FIG. 7 is a schematic construction diagram of a cast used in Test Example III-1, (A) showing an exploded perspective view and (B) showing a front view.

A cast including a main body portion 11 and a lid portion 12 that are integrated by a screw 13 as shown in FIG. 7 was made use of as the cast. It is noted that FIG. 7(A) shows a lateral dimension of the main body portion in an exaggerated manner for the sake of illustration of an internal structure of the cast. A cast 10 is in a hollow prism shape with bottom and opens on one surface side, with lid portion 12 in a rectangular plate shape being fixed to main body portion 11. The inside of main body portion 11 has a stepped space. A space small in depth from an opening portion serves as a metal placement portion, while a space large in depth from the opening portion serves as a composite member formation portion. An ingot M (see FIG. 8) serving as a metal component of the substrate is arranged on one surface (a metal placement surface 11*m*) in parallel to a bottom surface 11*b* in the metal placement portion. The composite member formation portion is a space surrounded by one surface in parallel to bottom surface 11*b* (an SiC placement surface 11*s*), a coupling surface 11*c* coupling both surfaces 11*m* and 11*s* to each other, and an inner surface 12*i* of lid portion 12 (thickness t ($t_s$): 4.5 mm, width w: 100 mm, length l (magnitude in a direction of depth): 200 mm). This composite member formation space is filled with SiC powders, to thereby form an SiC aggregate S (see FIG. 8). Main body portion 11 and lid portion 12 are made of carbon ($\alpha_M$=4 (ppm/K)). Screw 13 is made of SUS304 (coefficient of thermal expansion $\alpha_N$: 17.3 ppm/K), and 10 mm of its length: 15 mm is buried in the cast ($t_N$=10 (mm)).

Lid portion 12 was fixed to main body portion 11 by screw 13 to assemble cast 10, and the composite member formation space was filled with SiC powders by tapping, to thereby fabricate the SiC aggregate ($\alpha_s$=3 (ppm/K)). Then, ingot M of pure magnesium was arranged on metal placement surface 11*m*, and cast 10 was heated to a temperature not lower than a melting point of the metal above (875° C. here), so as to melt the metal above (pure magnesium). Melting was carried out in an Ar atmosphere at an atmospheric pressure. As a result of this heating, screw 13 higher in coefficient of thermal expansion than SiC expanded more than main body portion 11 and lid portion 12, so that a small gap was produced between the SiC aggregate and cast 10 (inner surface 12*i* of lid portion 12) and molten metal (pure magnesium) flowed into this gap. After the heated state above was held for 2 hours so as to make a composite of the SiC aggregate and molten pure magnesium above, cooling was performed in the Ar atmosphere (water cooling here).

Figure 6:
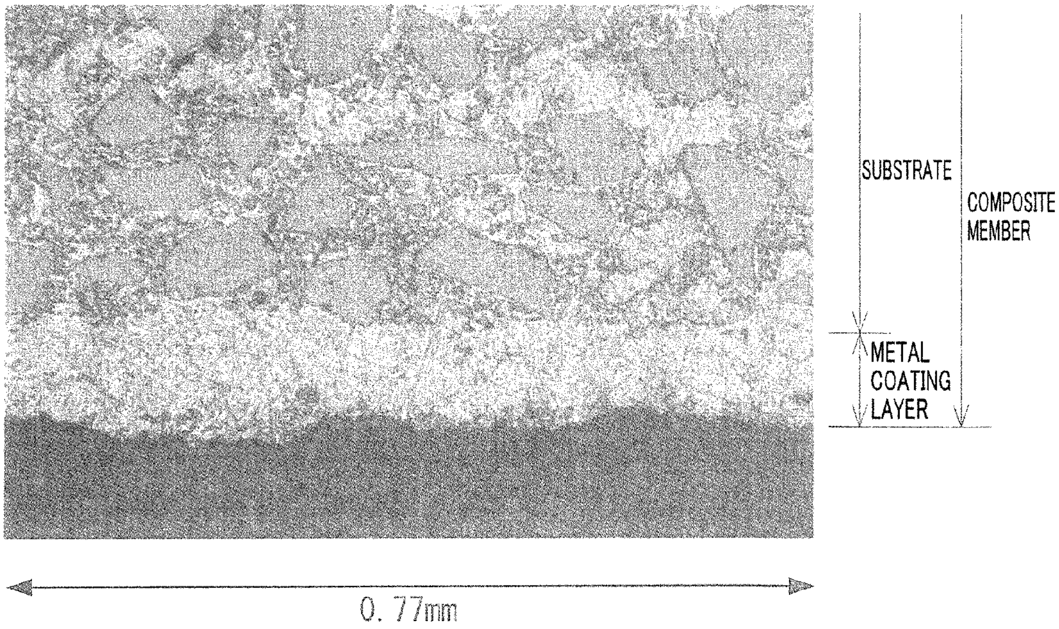
FIG. 6 is a micrograph (×100 magnification) of a composite member fabricated in a Test Example III-1.

In the micrograph in FIG. 6, a region of dark color on the lower side represents a background, and a region of light color on the upper side represents the composite member. In the composite member, a particulate substance represents SiC, a region where SiC particles are present represents the substrate, and a region where SiC particles are not present represents the metal coating layer. Through the step above, as shown in FIG. 6, a composite member including a metal coating layer composed of pure magnesium on one surface of the substrate containing pure magnesium as a base material metal, in which SiC particles are dispersed in this base material metal (SiC content: 65 volume %), was obtained. An SiC content was found in such a manner that any cross-section of the composite member was observed with an optical microscope (×50 magnification), the observed image was subjected to image processing with a commercially available image analysis apparatus, a total area of SiC in this cross-section was found, a value obtained by converting this total area into a volume ratio was adopted as a volume ratio based on this cross-section, a volume ratio in the cross-section for n=3 was found, and an average value thereof was calculated.

The surface of the obtained composite member was examined. Then, one surface side including a metal coating layer had less irregularities than the other surface side not including a metal coating layer and the surface was smooth. In addition, it can be seen that the base material metal of the substrate and the metal forming the metal coating layer in the obtained composite member have a continuous texture. Composition of a constituent metal of the base material metal and the metal coating layer above was examined with an EDX apparatus, and it was found that the composition was the same (pure magnesium). Moreover, a thickness of the metal coating layer was examined based on a photograph of the cross-section. Then, it was approximately 90 μm on average and the metal coating layer was formed uniformly on one surface of the substrate. This thickness of the metal coating layer was substantially the same as the result calculated in Equation (1) described above. Further, thermal conductivity and a coefficient of thermal expansion of the obtained composite member were measured with a commercially available measuring instrument, and they were 208 W/m·K and 8 ppm/K, respectively. Thermal conductivity and a coefficient of thermal expansion of a portion composed of a composite material were similarly measured, with the formed metal coating layer being removed, and then they were 210 W/m·K and 7.8 ppm/K, respectively.

The composite member above was plated with Ni through electroplating. Then, uniform Ni plating could be formed on the metal coating layer. In addition, corrosion resistance and solderability of a composite member including Ni plating and a composite member not plated with Ni were examined. Then, the composite member plated with Ni was superior in corrosion resistance and solderability.

A heating temperature of the cast is preferably set to a temperature at which the ingot is molten but it is not boiled, specifically not lower than 650° C. and not higher than 1000° C. In addition, pores may be reduced by subjecting the obtained composite member or the substrate to hot pressing (heating temperature: not lower than 300° C. and preferably not lower than 600° C., applied pressure: not lower than 1 ton/cm$^2$) or the like. Moreover, wettability between SiC and the molten metal (pure magnesium here) may be enhanced by forming an SiC aggregate with the use of coated SiC obtained by heating raw material SiC to 700° C. or higher to form an oxide layer satisfying a mass ratio to raw material SiC not lower than 0.4% and not higher than 1.5%. The heating temperature of the cast, hot pressing of the composite member or the substrate, and use of coated SiC described here are also applicable to Test Examples that follow.

Though SiC powders were made use of in the tests above, an SiC molded body may be made use of as in Test Examples which will be described later. Moreover, though an example where a metal coating layer is provided on one surface of the substrate has been described in the tests above, a construction may be such that metal coating layers are provided on two respective opposing surfaces of the substrate. In this case, preferably, the main body portion of the cast is further divided into two pieces to fabricate a divided piece including a coupling plate and a divided piece including an SiC mount surface, and the lid portion and both divided pieces are integrated by means of the screw.

Test Example III-2

A composite member was fabricated with the use of an SiC molded body. In this test, molded bodies (I) to (III) below were prepared.

(I) Molded Body Made with Slip Casting

Slurry was fabricated by preparing particulate SiC powders used in Test Example III-1 and additionally a surfactant and water, setting a volume ratio between water and the SiC powders to water:SiC powders≈5:5, and then adding the surfactant. Here, slurry of 20 mass % urea aqueous solution (with the entire slurry being assumed as 100 mass %) and slurry of commercially available polycarboxylic-acid-based aqueous solution were prepared. Each slurry was poured into the cast followed by air drying, to thereby fabricate a powder molded body.

(II) Molded Body Made with Pressure Forming

A powder molded body was obtained by preparing particulate SiC powders used in Test Example III-1, adding and mixing ammonium chloride as appropriate as a binder in a range from 1 to 10 mass %, filling the cast with this mixture, and applying pressure of 3 ton/cm$^2$. It is noted that the binder was emanated through decomposition and vaporization by heat generated during fabrication of the substrate.

(III) Sintered Molded Body (Sintered Body)

A sintered body A obtained by sintering the powder molded body fabricated in (I), (II) above in atmosphere at 1000° C.×2 hours and a sintered body B obtained by sintering the same in vacuum at 2000° C.×8 hours were prepared. In addition, commercially available SiC sintered bodies α and β were prepared. Sintered body B sintered in vacuum and commercially available SiC sintered bodies α and β were observed with an SEM. Then, presence of a network portion where SiC was directly bonded to each other was observed. As a result of similar observation of sintered body A sintered in atmosphere, presence of a network portion where SiC was bonded with an oxide layer being interposed was observed.

Figure 8:
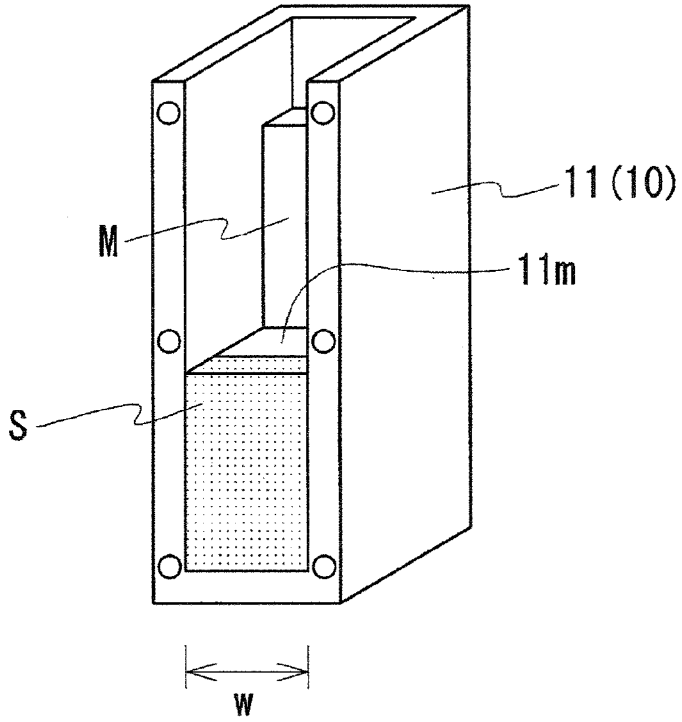
FIG. 8 is an illustrative diagram illustrating a state where a metal to form an SiC aggregate and a metal component of a substrate is arranged in the cast used in Test Example III-1.

Each prepared molded body above was slightly smaller in thickness than the composite member formation space in the cast having thickness t (5 mm here). In addition, a cast having a shape the same as shown in FIGS. 7 and 8 and including a screw made of carbon was prepared as the cast. Then, in this test, such a sample that each molded body alone was accommodated in the composite member formation space in this cast and such a sample that each molded body and a spacer were accommodated were prepared. In the sample that each molded body was accommodated in the composite member formation space in the cast above, a small gap is produced between the molded body and the cast (the inner surface of the lid portion). Meanwhile, a carbon sheet, a naphthalene plate, and a wire were prepared as the spacer. Carbon sheets and naphthalene plates having thicknesses of 50 μm, 100 μm, 200 μm, 500 μm, 1000 μm, and 1500 μm were prepared. Then, a pair of carbon sheets identical in thickness or a pair of naphthalene plates identical in thickness was arranged between the molded body and the cast so as to sandwich two opposing surfaces of the molded body, so that a gap corresponding to a thickness of each spacer was produced between one surface of the molded body above and the cast and between the other surface thereof and the cast. A wire having a diameter of 0.05 mm (50 μm) and made of SUS430 was prepared as the wire. The molded body was arranged in a central portion in a direction of thickness in the cast, and the wire above fixed the molded body to the cast such that a gap having a prescribed size is evenly provided between one surface of the two opposing surfaces of the molded body and the cast and between the other surface thereof and the cast (a size of a gap between one surface of the molded body and the cast: 50 μm, 100 μm, 200 μm, 500 μm, 1000 μm, and 1500 μm).

While the molded body or the molded body and the spacer was (were) accommodated in the cast as described above, the ingot of pure magnesium as in Test Example III-1 was arranged on the metal placement surface of the cast, the ingot above was molten under the conditions the same as in Test Example III-1 (Ar atmosphere, atmospheric pressure, 875° C.×2 hours), the molded body (SiC aggregate) was infiltrated with a molten metal (pure magnesium) for making a composite, and the molten metal above was poured into the gap above followed by cooling. It is noted that the naphthalene plate disappeared as a result of sublimation during heating of the cast. Alternatively, in a case where a spacer such as a carbon sheet is made use of, in order to prevent displacement of a position of arrangement of the spacer with respect to the molded body, the spacer may adhere to the molded body with the use of low-melting glass, low-melting salt, water glass, or the like.

Through the step above, the composite member (thickness of 5 mm) including the metal coating layers made of pure magnesium on the respective opposing surfaces of the substrate made of a composite of pure magnesium and SiC was obtained. In particular, the sample obtained by making use of the powder molded body was a substrate in which SiC was dispersed in pure magnesium.

Each obtained sample was observed as in Test Example III-1. Then, the metal coating layers were formed uniformly on the respective opposing surfaces of the substrate in any sample. In the sample in which the carbon sheet was made use of, the carbon sheet was visually recognized as remaining on the surface of the metal coating layer. In the sample in which the naphthalene plate was made use of, no foreign matter was recognized on the surface of the metal coating layer. In the sample in which the wire was made use of, a part of the wire was visually recognized in a part of the metal coating layer. Specifically, in the sample in which a gap provided between one surface of the molded body and the cast is substantially equal to the diameter of the wire (gap: 50 μm), a part of the wire remained on a pair of main surfaces each including the metal coating layer in the composite member and on a side surface orthogonal to the main surface. In the sample in which the gap above is greater than the diameter of the wire (gap: 100 μm, 200 μm, 500 μm, 1000 μm, and 1500 μm), though a part of the wire remained on a side surface of the composite member, it was recognized on neither of the main surfaces of the composite member and the wire was buried in the metal coating layer. A thickness of each metal coating layer was examined as in Test Example III-1. Then, the thickness in the sample not including the spacer was 200 μm on average (the sum of thicknesses of both metal coating layers: 0.4 mm on average). In any sample including the spacer, thicknesses of each metal coating layer provided on the main surface were 50 μm, 100 μm, 200 μm, 500 μm, 1000 μm, and 1500 μm on average (the sum of thicknesses of both metal coating layers: 0.1 mm, 0.2 mm, 0.4 mm, 1 mm, 2 mm, and 3 mm on average), and the thickness was substantially the same as the size of the gap provided between one surface of the molded body and the cast. In addition, a texture of the base material metal and the constituent metal of the metal coating layer was examined as in Test Example III-1, and it was found as a continuous texture. By making use of a spacer or the like, as compared with a case where a molded body smaller than a cast is merely made use of, a gap can reliably be provided between a molding plate and the cast, and a metal coating layer having a uniform thickness can be formed. Further, by changing arrangement of the spacer above or a state of fixing of the wire as appropriate, a composite member including a metal coating layer only on one surface of the substrate or on each of two opposing surfaces thereof can be formed in a simplified manner.

An SiC content in the substrate in each sample fabricated with the molded body in (I), (II), sintered bodies obtained by sintering these molded bodies, and a commercially available sintered body, thermal conductivity and a coefficient of thermal expansion of each sample, as well as thermal conductivity and a coefficient of thermal expansion of the substrate alone from which the metal coating layer had been removed were found as in Test Example III-1. Table 4 shows the results. As shown in Table 4, it can be seen that a composite member low in coefficient of thermal expansion and high in thermal conductivity is obtained when the sum of thicknesses of both metal coating layers is not greater than 2.5 mm and further not greater than 0.5 mm. In addition, it can be seen that, in a case of making use of a sintered body as the molded body, in particular, making use of a sintered body having a network portion where SiC is directly bonded to each other, a composite member low in coefficient of thermal expansion and high in thermal conductivity is obtained in spite of the SiC content being the same.

Through the step above, as in Test Example III-1, the composite member (thickness: 5 mm) including the metal coating layers made of pure magnesium on respective opposing surfaces of the substrate containing pure magnesium as a base material metal, in which SiC particles were dispersed in this base material metal (SiC content: 65 volume %), was obtained. In addition, each metal coating layer above had a thickness of 50 μm, 100 μm, 200 μm, 500 μm (0.5 mm), 1000 μm, and 1500 μm on average (the sum of thicknesses of both metal coating layers: 0.1 mm, 0.2 mm, 0.4 mm, 1 mm, 2 mm, and 3 mm on average), and the thickness was substantially the same as the thickness of the used naphthalene plate. Confirmation of a state of the composite member, measurement of a thickness of the metal coating layer, and measurement of the SiC content in the substrate were carried out as in Test Example III-1. In addition, thermal conductivity and a coefficient of thermal expansion of each sample and thermal conductivity and a coefficient of thermal expansion of the substrate alone from which the metal coating layer had been removed were found as in Test Example III-1. Table 4 shows the results.

TABLE 4

| Molded Body | Sintering Condition | SiC Amount in Base Material (Volume %) | Thermal Conductivity (W/m · K) Thickness of Metal Coating Layer (μm) 0 (No Coating) | 50 | 100 | 200 | 500 | 1000 | 1500 | Coefficient of Thermal Expansion (ppm/K) Thickness of Metal Coating Layer (μm) 0 (No Coating) | 50 | 100 | 200 | 500 | 1000 | 1500 |
|---|---|---|---|---|---|---|---|---|---|---|---|---|---|---|---|---|
| (I) | No Sintering | 70% | 220 | 218 | 217 | 210 | 205 | 195 | 181 | 7.5 | 7.5 | 7.6 | 7.9 | 8.7 | 10.3 | 12.8 |
| Slip Casting | Atmosphere 1000 ° C. | 70% | 215 | 204 | 203 | 201 | 196 | 188 | 180 | 7.4 | 7.5 | 7.6 | 7.8 | 8.5 | 10.1 | 12.5 |
| | Vacuum 2000 ° C. | 70% | 247 | 245 | 242 | 238 | 225 | 207 | 192 | 5.1 | 5.2 | 5.3 | 5.4 | 6 | 7.4 | 9.6 |
| (II) | No Sintering | 75% | 224 | 222 | 221 | 218 | 210 | 197 | 186 | 7.2 | 7.3 | 7.4 | 7.6 | 8.3 | 9.8 | 12.1 |
| Pressure Forming | Atmosphere 1000 ° C. | 75% | 219 | 208 | 207 | 205 | 199 | 190 | 181 | 7.1 | 7.2 | 7.3 | 7.5 | 8.2 | 9.7 | 12 |
| | Vacuum 2000 ° C. | 75% | 258 | 255 | 252 | 247 | 233 | 212 | 194 | 4.6 | 4.7 | 4.8 | 4.9 | 5.5 | 6.8 | 8.9 |
| Commercially Available Sintered Body α | — | 80% | 263 | 260 | 257 | 251 | 236 | 214 | 196 | 4.4 | 4.5 | 4.5 | 4.7 | 5.2 | 6.4 | 8.5 |
| Commercially Available Sintered Body β | — | 84% | 282 | 278 | 274 | 267 | 248 | 221 | 199 | 4.1 | 4.2 | 4.2 | 4.4 | 4.9 | 6 | 8 |
| Test Example III-3 Tapping | — | 65% | 212 | 211 | 210 | 208 | 201 | 191 | 182 | 7.8 | 7.9 | 8 | 8.2 | 9 | 10.6 | 13 |

Test Example III-3

An SiC aggregate was formed by tapping SiC powders, and a composite member was fabricated by making use of a spacer that can be removed by heating.

A plate made of naphthalene (thickness $t_n$: 50 μm, 100 μm, 200 μm, 500 μm (0.5 mm), 1000 μm, and 1500 μm, width $w_n$: 100 mm, length $l_n$: 200 mm) was prepared as a spacer. In addition, particulate SiC powders used in Test Example III-1 and an ingot of pure magnesium serving as a metal component of the substrate as well as a cast used in Test Example III-2 (thickness t: 5 mm) were prepared. The naphthalene plate was arranged in contact with the inner surface of the lid portion of the cast and the coupling surface and the cast was filled with the SiC powders by tapping in this state, so as to form the SiC aggregate in the composite member formation space of the cast, and such a state that the naphthalene plate was in contact with opposing surfaces of the SiC aggregate was set. Then, the ingot of pure magnesium was arranged on the metal placement surface and the cast was heated to a temperature not lower than a melting point of pure magnesium (approximately 650° C.). When the temperature attained to a temperature of sublimation of naphthalene during heating, naphthalene sublimed and it was removed from the composite member formation space. Thus, a gap was produced in a space where the naphthalene plate had been present. Namely, a gap was produced between the SiC aggregate and the cast. Heating was continued further to a prescribed temperature (875° C.) in this state so as to melt the ingot above under the conditions the same as in Test Example III-1 (Ar atmosphere, atmospheric pressure, 875° C.×2 hours), the SiC aggregate was infiltrated with the molten metal (pure magnesium) for making a composite, and the molten metal above was poured into the gap above followed by cooling.

Test Example III-4

A metal plate was arranged in the cast to fabricate a composite member.

An Al plate (a plate made of pure aluminum of JIS alloy number 1050, thickness $t_a$: 0.5 mm, width $w_a$: 100 mm, length $l_a$: 200 mm) was prepared as the metal plate. In addition, particulate SiC powders used in Test Example III-1 and an ingot of pure magnesium serving as a metal component of the substrate as well as a cast used in Test Example III-2 were prepared. The Al plate was arranged in contact with the inner surface of the lid portion of the cast or the coupling surface and the cast was filled with the SiC powders by tapping in this state, so as to form the SiC aggregate in the composite member formation space of the cast, and such a state that the Al plate was brought in contact with one surface of the SiC aggregate was established. Then, the ingot of pure magnesium was arranged on the metal placement surface of the cast, the ingot above was molten under the conditions the same as in Test Example III-1 (Ar atmosphere, atmospheric pressure, 875° C.×2 hours), the SiC aggregate was infiltrated with the molten metal (pure magnesium) for making a composite, and the Al plate was joined to the SiC aggregate with the use of the molten metal above followed by cooling.

Through the step above, the composite member including the metal coating layer made of a metal different in composition from the base material metal (pure aluminum here) on one surface of the substrate containing pure magnesium as a base material metal, in which SiC particles were dispersed in this base material metal (SiC content: 65 volume %), was obtained. In addition, the metal coating layer above had a thickness of 0.5 mm on average, and the thickness was substantially the same as the thickness of the used Al plate. Confirmation of a state of the composite member, measurement of a thickness of the metal coating layer, and measurement of the SiC content in the substrate were carried out as in Test Example III-1.

Test Example III-5

A metal plate was joined to a substrate made of a composite material with a hot pressing method, to fabricate a composite member.

In this test, an ingot of pure magnesium serving as the metal component of the substrate used in Test Example III-1 and a cast used in Test Example III-2 (it is noted that thickness t: 4 mm) as well as a commercially available SiC sintered body (thickness: 4.0 mm, width: 100 mm, length: 200 mm) were prepared. Then, the substrate made of the composite material was fabricated by arranging the SiC sintered body (SiC aggregate) above in the composite member formation space of the cast, arranging the ingot of pure magnesium on the metal placement surface of the cast, melting the ingot above under the conditions the same as in Test Example III-1 (Ar atmosphere, atmospheric pressure, 875° C.×2 hours), and infiltrating the SiC sintered body with the molten metal (pure magnesium) for making a composite. Through the step above, the substrate made of a composite of pure magnesium and SiC was obtained (SiC content: 84 volume %, thickness: 4.0 mm, width: 100 mm, length: 200 mm). The SiC content in the substrate was found as in Test Example III-1.

In addition, in this test, two Mg plates (MIS1), two Al plates (JIS alloy number: 1050), two Cu plates (JIS number: C1020), and two Ni plates (NAS Ni201), each of which is made of pure metal of which purity is not lower than 99% and has a thickness of 0.5 mm, a width of 100 mm and a length of 200 mm, were prepared as metal plates. Any metal plate is commercially available. A stack was prepared by sandwiching a fabricated substrate between a pair of metal plates identical in composition, this stack was arranged in a box-shaped pressure mold that can be heated, and this stack was heated by heating the pressure mold and then a punch was pressed against a surface of one metal plate exposed through an opening portion of the pressure mold above. Table 5 shows a heating temperature of the stack above, an applied pressure, and a joint atmosphere during heating and pressurization. In addition, a state of joint of the stack after heating and pressurization above was examined. Table 5 shows the results. Regarding the joint state above, the stack after heating and pressurization was cut in a direction of thickness, and such a state that the entire surface was joined without any gap between the substrate and the metal plate in the cut surface was evaluated as "○" and such a state that the metal plate was detached from the substrate and not joined was evaluated as "x".

TABLE 5

| Sample No. | Heating Temperature ° C. | Applied Pressure ton/cm$^2$ | Joint Atmosphere | Metal Plate Composition | | | |
|---|---|---|---|---|---|---|---|
| | | | | Mg | Al | Cu | Ni |
| III-1 | 300 | 0.5 | Atmosphere | x | x | x | x |
| III-2 | 300 | 1 | Atmosphere | x | x | x | x |
| III-3 | 300 | 3 | Atmosphere | x | x | x | x |
| III-4 | 300 | 5 | Atmosphere | x | x | x | x |
| III-5 | 300 | 0.5 | Ar | x | x | x | x |
| III-6 | 300 | 1 | Ar | x | x | x | x |
| III-7 | 300 | 3 | Ar | ○ | ○ | x | x |
| III-8 | 300 | 5 | Ar | ○ | ○ | x | x |
| III-9 | 350 | 0.5 | Atmosphere | x | x | x | x |
| III-10 | 350 | 1 | Atmosphere | x | x | x | x |
| III-11 | 350 | 3 | Atmosphere | x | x | x | x |
| III-12 | 350 | 5 | Atmosphere | x | x | x | x |
| III-13 | 350 | 0.5 | Ar | x | x | x | x |
| III-14 | 350 | 1 | Ar | x | x | x | x |
| III-15 | 350 | 3 | Ar | ○ | ○ | x | x |
| III-16 | 350 | 5 | Ar | ○ | ○ | x | x |
| III-17 | 400 | 0.5 | Atmosphere | x | x | x | x |
| III-18 | 400 | 1 | Atmosphere | x | x | x | x |
| III-19 | 400 | 3 | Atmosphere | x | x | x | x |
| III-20 | 400 | 5 | Atmosphere | ○ | ○ | x | x |
| III-21 | 400 | 0.5 | Ar | x | x | x | x |
| III-22 | 400 | 1 | Ar | x | x | x | x |
| III-23 | 400 | 3 | Ar | ○ | ○ | x | x |
| III-24 | 400 | 5 | Ar | ○ | ○ | x | x |
| III-25 | 500 | 0.5 | Atmosphere | ○ | ○ | x | x |
| III-26 | 500 | 1 | Atmosphere | ○ | ○ | x | x |
| III-27 | 500 | 3 | Atmosphere | ○ | ○ | x | x |
| III-28 | 500 | 5 | Atmosphere | ○ | ○ | x | x |
| III-29 | 500 | 0.5 | Ar | ○ | ○ | ○ | ○ |
| III-30 | 500 | 1 | Ar | ○ | ○ | ○ | ○ |
| III-31 | 500 | 3 | Ar | ○ | ○ | ○ | ○ |
| III-32 | 500 | 5 | Ar | ○ | ○ | ○ | ○ |
| III-33 | 600 | 0.5 | Atmosphere | ○ | ○ | x | x |
| III-34 | 600 | 1 | Atmosphere | ○ | ○ | x | x |
| III-35 | 600 | 3 | Atmosphere | ○ | ○ | ○ | ○ |
| III-36 | 600 | 5 | Atmosphere | ○ | ○ | ○ | ○ |
| III-37 | 600 | 0.5 | Ar | ○ | ○ | ○ | ○ |
| III-38 | 600 | 1 | Ar | ○ | ○ | ○ | ○ |
| III-39 | 600 | 3 | Ar | ○ | ○ | ○ | ○ |
| III-40 | 600 | 5 | Ar | ○ | ○ | ○ | ○ |
| III-41 | 645 | 0.5 | Atmosphere | ○ | ○ | ○ | ○ |
| III-42 | 645 | 1 | Atmosphere | ○ | ○ | ○ | ○ |
| III-43 | 645 | 3 | Atmosphere | ○ | ○ | ○ | ○ |
| III-44 | 645 | 5 | Atmosphere | ○ | ○ | ○ | ○ |
| III-45 | 645 | 0.5 | Ar | ○ | ○ | ○ | ○ |
| III-46 | 645 | 1 | Ar | ○ | ○ | ○ | ○ |
| III-47 | 645 | 3 | Ar | ○ | ○ | ○ | ○ |
| III-48 | 645 | 5 | Ar | ○ | ○ | ○ | ○ |

As shown in Table 5, it can be seen that metal plates made not only of a metal identical in type to the metal component of the substrate but also of a metal different in type can be joined to the substrate made of a composite material by performing heating and pressurization. In particular, it can be seen that a composite member including a metal coating layer is obtained by heating to a temperature not lower than 300° C. in a case where a metal plate is made of Mg, Al and an alloy thereof and by heating to a temperature not lower than 600° C. in a case where a metal plate is made of Cu, Ni and an alloy thereof. Moreover, it can be seen that the applied pressure is preferably not lower than 0.5 ton/cm$^2$. Further, in the sample where the substrate and the metal plate were joined to each other, the metal plate was firmly joined to the substrate as it plastically deformed. Additionally, it can be concluded from this test that, if heating and pressurization conditions are the same, a joint state varies depending on a joint atmosphere, and an Ar (argon) joint atmosphere facilitates joint as compared with an atmosphere. A thickness of each metal coating layer formed on each of the opposing surfaces of the substrate was measured as in Test Example III-1, and it was 0.5 mm on average (the sum of thicknesses of both metal coating layers: 1 mm, a thickness of the obtained composite member: 5 mm), which was substantially the same as the thickness of the used metal plate.

Furthermore, thermal conductivity and a coefficient of thermal expansion of the sample in which the metal coating layers were formed on respective opposing surfaces of the substrate were found as in Test Example III-1. Table 6 shows the results. As shown in Table 6, it can be seen that a composite member further higher in thermal conductivity is obtained by changing as appropriate composition of the metal coating layer.

TABLE 6

| Metal Coating Layer Composition | Thermal Conductivity (W/m · K) | Coefficient of Thermal Expansion (ppm/K) |
|---|---|---|
| Mg | 248 | 4.9 |
| Al | 272 | 5.2 |
| Cu | 299 | 5.4 |
| Ni | 234 | 5.6 |

Fourth Form

Large Composite Member

Embodiment IV-1

A composite member (substrate) made of a composite of pure magnesium and SiC was fabricated under various conditions, and a state of defect and thermal characteristics of the obtained composite member were examined.

An ingot of pure magnesium composed of 99.8 mass % or more Mg and an impurity and a commercially available SiC sintered body (relative density 80%, 200 mm long (long side)×100 mm wide (short side)×5 mm thick) were prepared as raw materials.

The prepared SiC sintered body was subjected to oxidation treatment at 875° C.×2 hours so as to form an oxide film, so that wettability with molten pure magnesium was enhanced. The step of oxidation treatment above may not be performed.

Figure 9:
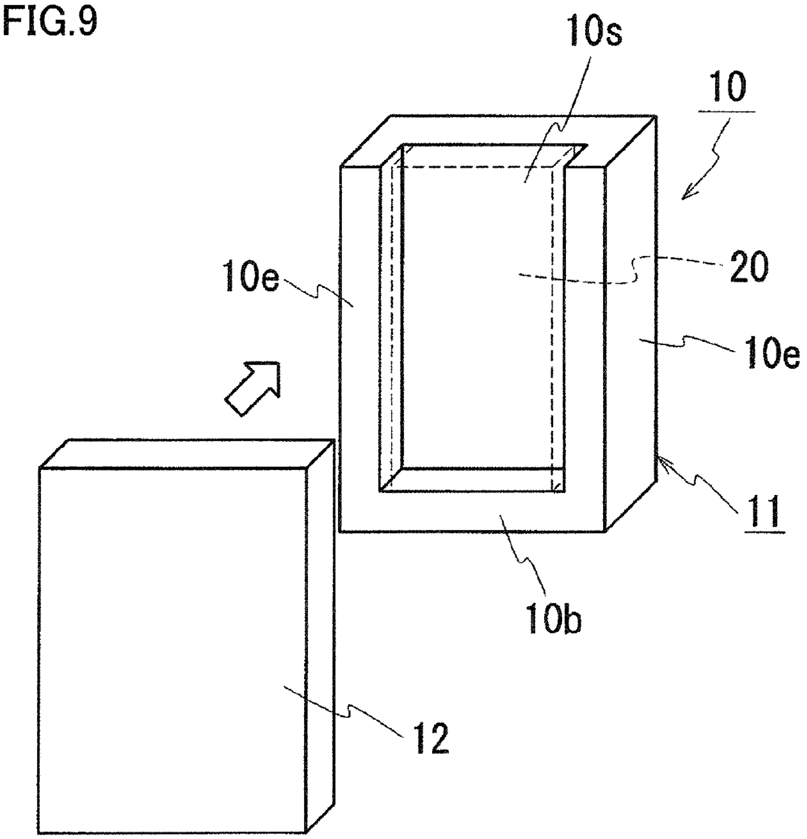
FIG. 9 is an exploded perspective view showing an overview of a cast used in fabricating a composite member in a fourth form.

The SiC sintered body above was accommodated in cast 10 shown in FIG. 9 and a sintered body 20 was infiltrated with molten pure magnesium, to fabricate an infiltrated plate.

Cast 10 above is a box in a vertically long parallelepiped shape opening on one side, and it includes main body portion 11 and lid portion 12 as shown in FIG. 9. Main body portion 11 includes a rectangular bottom surface portion 10*b*, a pair of rectangular end surface wall portions 10*e* erecting from bottom surface portion 10*b*, and a sidewall portion 10*s* erecting from bottom surface portion 10*b* and coupled to the pair of end surface wall portions 10*e*. Sidewall portion 10*s* is in a vertically long rectangular shape as shown in FIG. 9. Lid portion 12 is a rectangular plate body equal in vertical length to sidewall portion 10*s*, and it is arranged opposed to sidewall portion 10*s* and fixed to bottom surface portion 10*b* and the pair of end surface wall portions 10*e* with a bolt (not shown). As lid portion 12 is attached to main body portion 11, vertically long cast 10 opening on a side opposed to bottom surface portion 10*b* is constructed. Here, cast 10 is made of carbon. An internal space of this cast 10 is made use of as a space for accommodating sintered body 20. Here, the internal space of cast 10 has a size corresponding to the sintered body above, such that substantially no gap is provided between sintered body 20 and cast 10 when sintered body 20 is accommodated in cast 10. Lid portion 12 may be attached after sintered body 20 is arranged in main body portion 11, or sintered body 20 may be arranged after cast 10 is assembled. An integrally molded cast may be made use of, instead of a construction in which divided pieces are combined.

In addition, here, sintered body 20 was accommodated in cast 10 after a commercially available release agent had been applied to a portion of contact of an inner surface of cast 10 with the sintered body. Release of the composite member can be facilitated by applying the release agent. The step of applying this release agent may not be performed.

Figure 11:
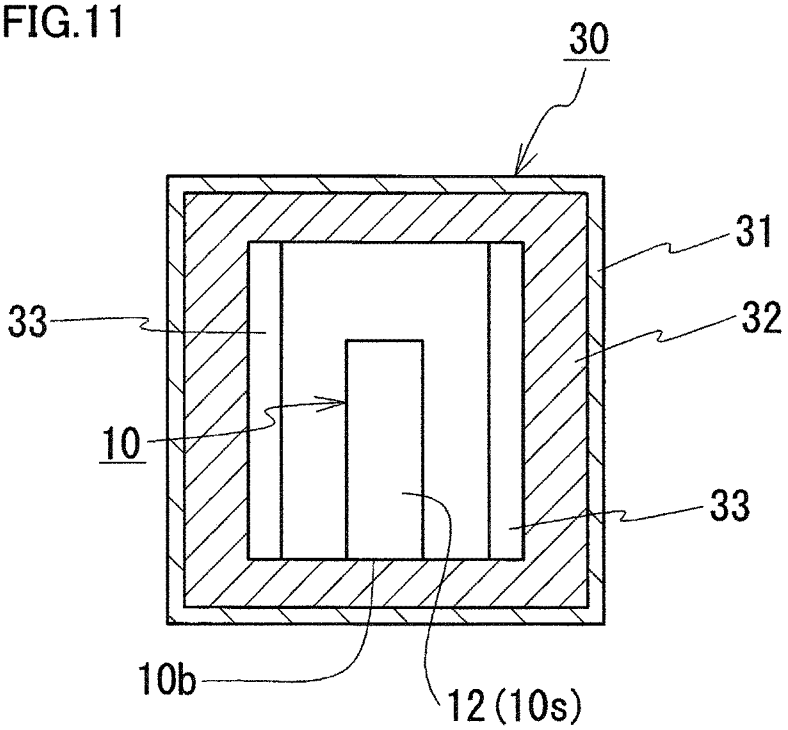
FIG. 11 is an illustrative diagram showing a state where the cast used for fabricating the composite member in the fourth form was loaded in an atmosphere furnace.

Cast 10 above has an ingot placement portion (not shown) coupled to a periphery of an opening portion, on which the prepared ingot above is arranged. By heating this cast 10 to a prescribed temperature, the ingot is molten. Heating of cast 10 is carried out by making use of an atmosphere furnace 30 shown in FIG. 11. Atmosphere furnace 30 includes a vessel 31 that can hermetically be sealed, a heat-insulating material 32 arranged on an inner surface of vessel 31, and a heater 33 arranged in a space surrounded by heat-insulating material 32. Vessel 31 includes a bottom surface portion, a sidewall portion erecting from the bottom surface portion, and an upper surface portion arranged opposed to the bottom surface portion and coupled to the sidewall portion. Heat-insulating material 32 is arranged along the bottom surface portion, the sidewall portion and the upper surface portion of vessel 31 above. Here, atmosphere furnace 30 is arranged such that the bottom surface portion thereof is located on a lower side in a vertical direction and the upper surface portion is located on an upper side in the vertical direction. In addition, here, cast 10 is loaded such that bottom surface portion 10*b* of cast 10 is in contact with the bottom surface portion of atmosphere furnace 30 above. Namely, cast 10 is loaded into atmosphere furnace 30 such that bottom surface portion 10*b* of cast 10 is located on the lower side in the vertical direction and the opening portion of cast 10 is located on the upper side in the vertical direction.

Here, atmosphere furnace 30 above was adjusted such that the infiltration temperature was set to 775° C., an Ar atmosphere was set, and a pressure in the atmosphere was set to an atmospheric pressure. Pure magnesium molten as a result of heating by heater 33 flowed into the internal space of cast 10 through the opening portion of cast 10 by its own weight and sintered body 20 arranged in the internal space is infiltrated therewith. The infiltrated plate is thus obtained.

Cast 10 in which the infiltrated plate was arranged was cooled with the following cooling methods (1) to (7) to solidify pure magnesium. Thus, a composite member having a size of 200 mm long×100 mm wide×5 mm thick was obtained. In addition, a temperature gradient or a cooling rate which will be described later was varied by adjusting as appropriate a thickness of a heat-insulating material, an amount of air sent by a fan, a temperature of water-cooled copper, or the like in the following cooling methods (2) to (7).

(1) Power of heater 33 of atmosphere furnace 30 was turned off to gradually cool cast 10 within furnace 30. Namely, cast 10 is cooled in a state shown in FIG. 11. With this cooling method, the infiltrated plate within the cast is cooled in a converging manner from its periphery toward the central portion.

(2) After power of heater 33 of atmosphere furnace 30 was turned off, heat-insulating material 32 at the bottom surface portion within furnace 30 was removed such that bottom surface portion 10*b* of cast 10 comes in direct contact with vessel 31 of furnace 30. Cast 10 is thus cooled within furnace 30.

(3) After power of heater 33 of atmosphere furnace 30 was turned off, heat-insulating material 32 at the bottom surface portion within furnace 30 was removed, a fan (not shown) was arranged outside furnace 30 in the vicinity of the bottom surface portion of furnace 30, and cast 10 within furnace 30 was cooled while air was sent from the fan toward the bottom surface portion of furnace 30. Namely, cast 10 was forcibly cooled by air cooling.

Figure 12:
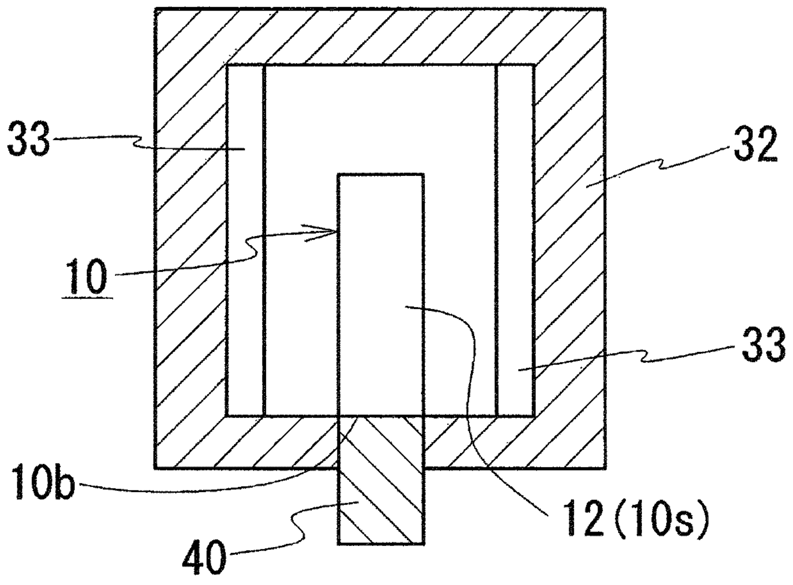
FIG. 12 is an illustrative diagram showing a state where the cast is cooled by water-cooled copper in the fourth form, (I) showing an example where a heat-insulating material is not arranged in contact with the cast and (II) showing an example where the cast is covered with the heat-insulating material.
Figure 12:
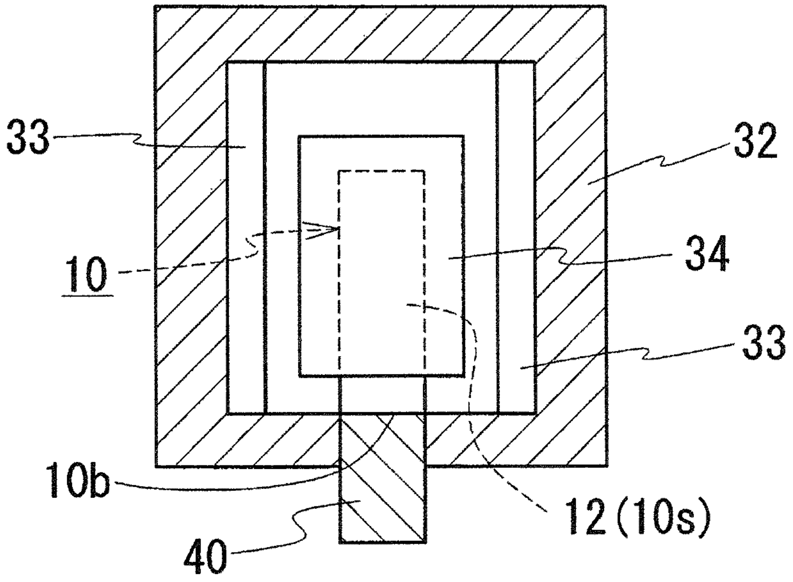

(4) After power of heater 33 of the atmosphere furnace was turned off, heat-insulating material 32 at the bottom surface portion within the furnace was partially removed and water-cooled copper 40 was attached such that water-cooled copper 40 was brought in contact with bottom surface portion 10*b* of cast 10 as shown in FIG. 12(I). Cast 10 is thus cooled in the furnace. Namely, cast 10 is forcibly cooled by liquid cooling. It is noted that FIG. 12 does not show the vessel. Water-cooled copper 40 is commercially available.

(5) After power of heater 33 of the atmosphere furnace was turned off, the end surface wall portion, sidewall portion 10*s*, lid portion 12, and an outer peripheral surface of the opening portion of cast 10 are covered with an heat-insulating material 34 as shown in FIG. 12(II). Namely, a portion other than the bottom surface portion of cast 10 is covered with heat-insulating material 34. In this state, cast 10 is cooled as in (1) to (4) above. FIG. 12(II) shows a state that cast 10 is covered with heat-insulating material 34 and bottom surface portion 10*b* of cast 10 is brought in contact with water-cooled copper 40.

(6) After power of heater 33 of the atmosphere furnace was turned off, cast 10 is taken out of the furnace, and the bottom surface portion of cast 10 is brought in contact with water-cooled copper 40, to thereby cool cast 10. By taking out cast 10 from the atmosphere furnace and making use of water-cooled copper 40, the cooling rate can be increased.

Figure 13:
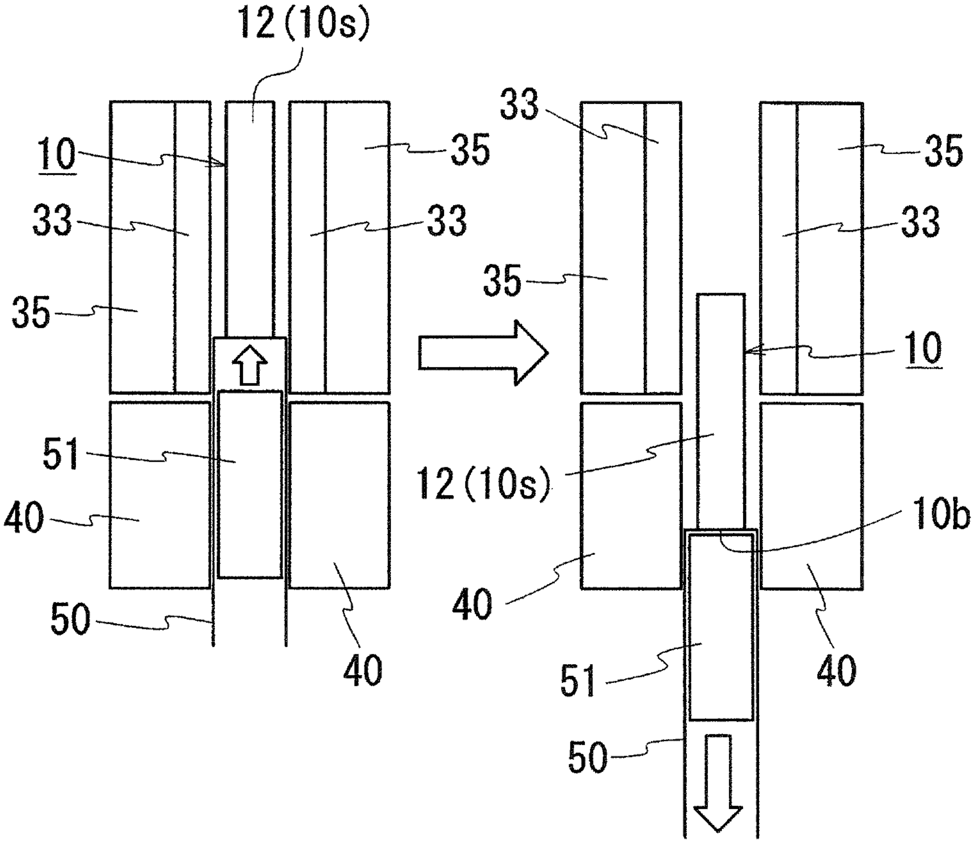
FIG. 13 is an illustrative diagram showing a state in the fourth form where the cast is moved from a high-temperature region to a low-temperature region for cooling.

(7) As shown in FIG. 13, an atmosphere furnace including in the atmosphere furnace (not shown), a high-temperature region including heater 33 and an heat-insulating material 35 covering an outer periphery thereof and a low-temperature region provided under the high-temperature region by water-cooled copper 40 is prepared. Heater 33 and heat-insulating material 35 as well as water-cooled copper 40 are arranged to surround cast 10. Bottom surface portion 10*b* of cast 10 is supported by a cylindrical support base 50 with bottom, and a movable portion 51 movable in a vertical direction by means of a drive portion (not shown) is arranged in support base 50. As a result of movement in the vertical direction of this movable portion 51, support base 50 can move in the vertical direction. Namely, cast 10 can move in the vertical direction by means of movable portion 51. Cooling is performed by using such an atmosphere furnace, driving movable portion 51 above, and moving cast 10 from the high-temperature region to the low-temperature region. Namely, cooling is performed by introduction from the bottom surface portion side of cast 10 arranged on the lower side in the vertical direction into the low-temperature region.

In cooling the infiltrated plate, a temperature gradient and a cooling rate were measured as follows, with regard to the cooling methods (1) to (7) described above. Table 7 shows the results. Then, the composite member was obtained by performing cooling in (1) to (7) described above, by using cast 10, atmosphere furnace 30 or the like achieving the temperature gradient and the cooling rate shown in Table 7.

Thermocouples were arranged at regular intervals in the internal space of vertically long cast 10, along a longitudinal direction thereof from the side of bottom surface portion 10*b* (the lower side in the vertical direction) toward the opening portion side (the upper side in the vertical direction). Specifically, the thermocouples (not shown) are installed on sidewall portion 10*s* (or lid portion 12) at 5 mm interval from the surface of bottom surface portion 10*b* on the inner surface of cast 10. The cast is loaded into the atmosphere furnace in an empty state where the inside of this cast 10 is not filled with pure magnesium or SiC. The thermocouple is commercially available.

<Temperature Gradient>

A portion where the thermocouple above was arranged was defined as a temperature measurement point. When the temperature at each temperature measurement point attained to 650° C., temperature difference: $\Delta T_P = T_u - T_d$ between two temperature measurement points $P_u$ and $P_d$ adjacent to this temperature measurement point $P_s$, that is, between a temperature $T_u$ at a temperature measurement point $P_u$ on the opening portion side (the upper side in the vertical direction) and a temperature $T_d$ at a temperature measurement point $P_d$ on the bottom surface portion side (the lower side in the vertical direction) with temperature measurement point $P_s$ lying therebetween, is calculated, and a value $(T_u - T_d)/l$ obtained by diving this temperature difference $T_u - T_d$ by a distance l (10 mm here) between two temperature measurement points $P_u$ and $P_d$ above is defined as the temperature gradient. Table 7 shows a minimum value among temperature gradients calculated for 40 temperature measurement points provided in cast 10. It is noted that the sample of which temperature gradient value is "negative" in Table 7 is a sample in which cooling proceeds from the upper side in the vertical direction (the opening portion side of the cast) toward the lower side in the vertical direction (the bottom surface portion side of the cast) in the infiltrated plate accommodated in the cast, and here it corresponds to the sample cooled in a converging manner from the periphery of the infiltrated plate toward the central portion. The sample of which temperature gradient value is positive is a sample in which cooling proceeds from the lower side in the vertical direction (the bottom surface portion side of the cast) toward the upper side in the vertical direction (the opening portion side of the cast) in the infiltrated plate accommodated in the cast, and here it corresponds to the sample cooled in one direction from the lower side in the vertical direction in the infiltrated plate toward the upper side in the vertical direction.

<Cooling Rate>

A portion where the thermocouple above was arranged was defined as a temperature measurement point. A time period t required for each temperature measurement point to decrease from a high temperature $T_H$: 680° C. to a low temperature $T_L$: 620° C. was counted, and a value: $(T_H - T_L)/t$ obtained by dividing difference $T_H - T_L$ between temperatures $T_H$, $T_L$ above by time period t above is defined as the cooling rate. Table 7 shows a minimum value among cooling rates calculated for 40 temperature measurement points provided in cast 10.

An area ratio (%), difference in dimension (μm), surface roughness Ra (μm), thermal conductivity κ (W/m·K), and coefficient of thermal expansion α (ppm/K) of a defect portion in the obtained composite member were measured. Table 7 shows the results.

The area ratio (%) of the defect portion was measured as follows. With a straight line passing through a center of gravity when the obtained composite member is two-dimensionally viewed (here, an intersection of diagonals of a rectangular surface of 200 mm×100 mm) being defined as a section line, the composite member was cut using ion beam machining and a cross-section in a direction of thickness (a cross-section having a cross-sectional area of 200 mm×5 mm here) is taken. In this cross-section, a region in a range extending over up to 10% of a length (200 mm here) of the section line above along the longitudinal direction of the section line above, with the center of gravity above serving as the center, is defined as a central region. Any 20 small regions of 1 mm×1 mm were selected in this central region (a region having a cross-sectional area: 40 mm×5 mm here) and a ratio of an area of the defect portion with respect to the area of each small region: an area ratio is calculated. The area of the defect portion is found by making use of an image of the cross-section above. Specifically, the image above is subjected to image analysis with the use of a commercially available image processing apparatus, a portion in each small region other than pure magnesium and SiC forming the composite member (mainly a void) is determined as the defect portion in the small region, and the total area thereof is found with the image processing apparatus above. Then, Table 7 shows a maximum value of the area ratio of 20 defect portions in each sample.

Regarding the difference in dimension, largest thickness and smallest thickness were measured in the image of the cross-section above (cross-sectional area: 200 mm×5 mm) of each sample, and difference between these largest thickness and smallest thickness was calculated. If this difference is not smaller than 200 μm (0.2 mm), it can be said that shrinkage at the surface is great and surface property is poor. If the difference is not greater than 50 μm (0.05 mm), it can be said that shrinkage at the surface is very small.

Surface roughness Ra was measured in compliance with JIS B 0601 (2001).

Coefficient of thermal expansion α and thermal conductivity κ were measured by cutting a test piece from the obtained composite member and by using a commercially available measuring instrument. Coefficient of thermal expansion α was measured in a range from 30° C. to 150° C.

Figure 10:
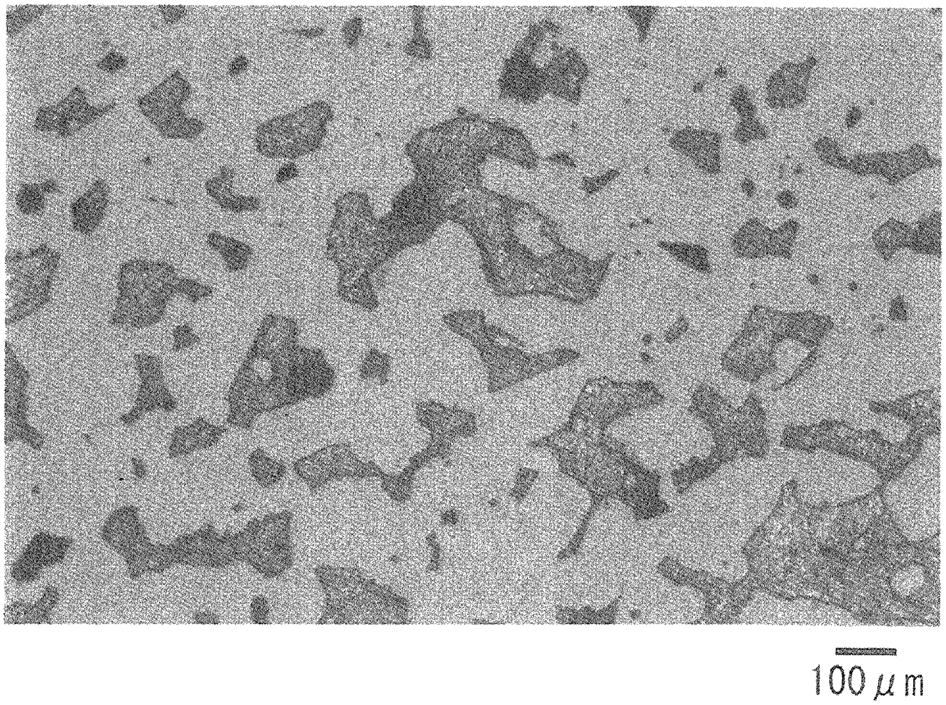
FIG. 10 is a micrograph (×50 magnification) of a cross-section of the composite member in the fourth form, (I) showing a composite member in an Embodiment IV-1 and (II) showing a composite member in an Embodiment IV-2.
Figure 10:
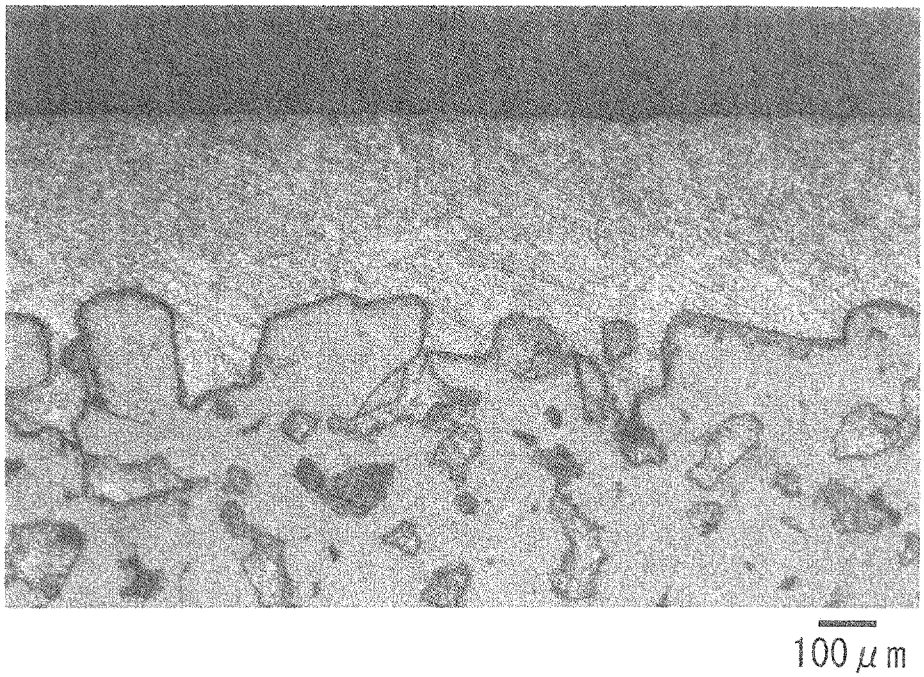

In addition, regarding the sample of which area ratio of the defect portion is not higher than 10% among the obtained composite members, a component of the composite member, a shape of SiC, an SiC content, and a composite state were examined. Components of the composite member were examined with the use of an EDX apparatus. Then, the components were Mg and SiC and the remainder of inevitable impurities, that were the same as in the used raw materials. In addition, the obtained composite member was subjected to a CP (Cross-section Polisher) process to expose a cross-section, that was examined in SEM observation. Then, SiC was directly bonded to each other. Namely, such a porous body that a network portion was formed of SiC was obtained, that was the same as in the used raw material sintered body. In addition, the cross-section of the sample was observed with an optical microscope (×50 magnification). Then, it could be confirmed that a gap between SiC and SiC was infiltrated with pure magnesium as shown in FIG. 10(I). A portion forming a continuous web shape in FIG. 10 represents SiC, while a portion clustered like a particle represents pure magnesium.

Regarding the SiC content above, any cross-section of the composite member was observed with an optical microscope (×50 magnification), the observed image was subjected to image processing with a commercially available image analysis apparatus, a total area of SiC in this cross-section was found, a value obtained by converting this total area into a volume ratio was adopted as a volume ratio based on this cross-section, a volume ratio in the cross-section for n=3 was found, and an average value thereof was calculated (area ratio≈volume ratio). Consequently, the SiC content was 80 volume %.

TABLE 7

| Sample No. | Cooling Rate (° C./min) | Temperature Gradient (° C./mm) | Area Ratio of Defect Portion (%) | Difference in Dimension (μm) | Surface Roughness (μm) | Thermal Conductivity (W/m · K) | Coefficient of Thermal Expansion (ppm/K) |
|---|---|---|---|---|---|---|---|
| IV-1 | 2.29 | 0.136 | 2.06 | 34 | 1.8 | 283 | 4.1 |
| IV-2 | 2.29 | 0.104 | 3.04 | 48 | 2.2 | 270 | 4.1 |
| IV-3 | 2.29 | 0.056 | 4.41 | 175 | 2.6 | 253 | 3.9 |
| IV-4 | 2.29 | 0.002 | 10.4 | 763 | 7.5 | 164 | 4.2 |
| IV-5 | 2.29 | −0.001 | 13.4 | 982 | 12.1 | 136 | 4.1 |
| IV-6 | 3.19 | 0.516 | 0.72 | 8 | 1.7 | 301 | 4 |
| IV-7 | 3.19 | 0.284 | 1.36 | 16 | 2 | 292 | 4.1 |
| IV-8 | 3.19 | 0.176 | 1.69 | 17 | 2 | 288 | 4.1 |
| IV-9 | 4.14 | 0.676 | 0.36 | 4 | 1.5 | 305 | 4.2 |
| IV-10 | 4.14 | 0.340 | 0.93 | 10 | 1.6 | 298 | 4.2 |
| IV-11 | 4.14 | 0.252 | 1.34 | 12 | 1.9 | 293 | 4 |
| IV-12 | 4.19 | 0.764 | 0.25 | 3 | 1.4 | 307 | 4 |
| IV-13 | 4.19 | 0.420 | 0.78 | 7 | 1.6 | 300 | 4.1 |
| IV-14 | 4.19 | 0.292 | 0.84 | 13 | 1.9 | 299 | 4.1 |
| IV-15 | 3.16 | 0.044 | 4.9 | 428 | 3.4 | 244 | 4 |
| IV-16 | 3.16 | 0.008 | 9.4 | 741 | 4.3 | 175 | 4.1 |
| IV-17 | 3.16 | −0.064 | 13.8 | 964 | 11.8 | 130 | 4.2 |
| IV-18 | 4.40 | 0.344 | 0.82 | 10 | 1.4 | 299 | 4.2 |
| IV-19 | 4.40 | 0.204 | 1.54 | 11 | 1.6 | 290 | 4 |
| IV-20 | 4.40 | 0.092 | 3.21 | 120 | 2.7 | 268 | 4.2 |
| IV-21 | 6.23 | 0.508 | 0.77 | 5 | 1.5 | 300 | 4 |
| IV-22 | 6.23 | 0.288 | 0.98 | 10 | 1.8 | 297 | 4.1 |
| IV-23 | 6.23 | 0.120 | 2.01 | 44 | 2.1 | 284 | 4.1 |
| IV-24 | 6.20 | 0.644 | 0.33 | 3 | 1.3 | 306 | 4 |
| IV-25 | 6.20 | 0.304 | 0.94 | 9 | 1.4 | 298 | 3.9 |
| IV-26 | 6.20 | 0.220 | 1.39 | 6 | 1.6 | 292 | 3.9 |
| IV-27 | 0.50 | 0.145 | 1.98 | 31 | 2.4 | 284 | 4 |
| IV-28 | 0.50 | 0.207 | 1.58 | 27 | 2.4 | 289 | 4.2 |
| IV-29 | 0.50 | 0.135 | 3.53 | 46 | 2.5 | 264 | 4.1 |
| IV-30 | 0.50 | 0.160 | 1.82 | 33 | 2.4 | 286 | 4.2 |
| IV-31 | 0.30 | 0.110 | 3.87 | 87 | 2.9 | 258 | 4.2 |
| IV-32 | 0.30 | 0.130 | 3.64 | 84 | 2.7 | 260 | 4.1 |
| IV-33 | 0.30 | 0.186 | 1.82 | 74 | 2.5 | 285 | 4 |
| IV-34 | 0.30 | 0.221 | 1.47 | 62 | 2.7 | 291 | 4.1 |
| IV-35 | 7.58 | 0.138 | 2.1 | 15 | 1.8 | 283 | 3.9 |
| IV-36 | 7.58 | 0.181 | 1.67 | 14 | 1.9 | 288 | 4 |

TABLE 7-continued

| Sample No. | Cooling Rate (° C./min) | Temperature Gradient (° C./mm) | Area Ratio of Defect Portion (%) | Difference in Dimension (μm) | Surface Roughness (μm) | Thermal Conductivity (W/m · K) | Coefficient of Thermal Expansion (ppm/K) |
|---|---|---|---|---|---|---|---|
| IV-37 | 6.23 | 0.608 | 0.45 | 4 | 1.2 | 304 | 4.1 |
| IV-38 | 73.50 | 1.832 | 0.12 | 1 | 0.8 | 308 | 4.1 |
| IV-39 | 73.50 | −0.304 | 13.1 | 982 | 13.2 | 139 | 3.9 |

As shown in Table 7, it can be seen that the composite member obtained by cooling the infiltrated plate in one direction from the side of the infiltrated plate opposite to the side of supply of molten magnesium, here, the composite member obtained by cooling the infiltrated plate in one direction from the lower side in the vertical direction toward the upper side in the vertical direction, is of high grade, without defects being present in a concentrated manner, in spite of being a large-sized plate member from which a circular region having a diameter exceeding 50 mm can be taken. In particular, all defects present in the composite member for which cooling in one direction above was performed were so small that it is difficult to visually recognize them (not larger than 0.1 mm) and a texture was uniform. In addition, it can be seen that the composite member obtained by performing cooling in one direction above includes not only few internal defects but also few surface defects, and it is excellent in dimension accuracy. Moreover, it can be seen that the composite member obtained by performing cooling in one direction above is very low in coefficient of thermal expansion around 4 ppm/K, it is excellent in adaptability to a semiconductor element or peripherals thereof having a coefficient of thermal expansion around 4 ppm/K and also in thermal conductivity, because there is also a sample having thermal conductivity not lower than 180 W/K·m and in particular not lower than 300 W/K·m.

In contrast, it can be seen that the composite member for which cooling in one direction above was not performed is high in the area ratio of the defect portion above, and defects (pores) are present locally. In addition, defects present in this composite member were large enough to visually be recognized. It is considered that this composite member was low in dimension accuracy and also low in thermal conduction characteristics because of presence of such a large defect.

Therefore, the composite member obtained by performing cooling in one direction above is expected to suitably be made use of as a constituent material for a heat radiation member of the semiconductor element above.

Further, as shown in Table 7, it can be seen that the area ratio of the defect portion can be made smaller by performing cooling such that at least one of the temperature gradient at each temperature measurement point not less than 0.01° C./mm and the cooling rate at each temperature measurement point not less than 0.5° C./min is satisfied. Furthermore, it can be seen that the area ratio of the defect portion tends to be smaller as the temperature gradient or the cooling rate is greater. Additionally, as shown in Table 7, it can be seen that the defect portions can be reduced as the temperature gradient is greater, in a case where the cooling rate is constant. Thus, it can be concluded that, by performing cooling in one direction above and increasing the temperature gradient or the cooling rate, a composite member where defects are locally present is less likely.

Though a commercially available SiC sintered body was employed in Embodiment IV-1 above, a composite member can be fabricated with the use of SiC powders. Specifically, a composite member including few defects is obtained in spite of its large size as in Embodiment IV-1, for example, by subjecting the SiC powders to oxidation treatment at 875° C.×2 hours, thereafter forming a powder molded body in the cast utilizing tapping, slip casting, or the like, infiltrating the powder molded body with molten pure magnesium as in Embodiment IV-1, and controlling a cooling condition during solidification as in Embodiment IV-1. The powder molded body above may be sintered as appropriate.

Embodiment IV-2

A composite member including a substrate composed of a composite material made of a composite of pure magnesium and SiC and a metal coating layer covering each of two opposing surfaces of the substrate was fabricated, and a state of defect and thermal characteristics of the obtained composite member were examined.

An ingot of pure magnesium as in Embodiment IV-1 and an SiC sintered body were prepared as raw materials. In addition, the SiC sintered body was subjected to oxidation treatment as in Embodiment IV-1. Moreover, a pair of plate-shaped spacers of 10 mm long×100 mm wide×0.5 mm thick and made of carbon was prepared.

Here, cast 10 shown in FIG. 9 used in Embodiment IV-1, that is, a cast having such a size as allowing arrangement of the spacer above between the SiC sintered body and the cast, is made use of. Sintered body 20 and the pair of spacers (not shown) are accommodated in cast 10 to which a release agent has been applied as appropriate, and such a state that sintered body 20 is sandwiched by the pair of spacers is set. Being sandwiched between the spacers above, sintered body 20 is arranged in the cast in a stable manner, and a gap corresponding to the thickness of the spacer (0.5 mm here) is provided between a surface of sintered body 20 and sidewall portion 10*s* of cast 10 and between a back surface of sintered body 20 and lid portion 12 of cast 10. This cast 10 was loaded into an atmosphere furnace as in Embodiment IV-1. Then, a composite of sintered body 20 and molten pure magnesium was made under the conditions the same as in Embodiment IV-1, to thereby fabricate the infiltrated plate. In this embodiment, simultaneously with formation of the infiltrated plate, molten pure magnesium flows into the gap between the sintered body and the cast provided by the spacer as described above, so that a layer composed of pure magnesium is formed on each of the two opposing surfaces of the infiltrated plate.

Here, the infiltrated plate above was cooled in one direction from the lower side thereof in the vertical direction toward the upper side in the vertical direction so as to solidify pure magnesium, by making use of water-cooled copper or the like for achieving the temperature gradient and the cooling rate as in sample No. IV-38 in Embodiment IV-1. Through the step above, the composite member (200 mm long×100 mm wide×6 mm thick) was obtained.

The cross-section of the obtained composite member was observed with an optical microscope (×50 magnification). Then, as shown in FIG. 10(II), it could be confirmed that the substrate made of a composite material in which the gap between SiC and SiC was infiltrated with pure magnesium and the metal coating layer made of pure magnesium on the surface of this substrate were included. Composition of the constituent metal of this substrate and the metal coating layer was examined with the use of an EDX apparatus, and the composition was identical (pure magnesium). In addition, it could be confirmed from the observed image of the cross-section above that each metal coating layer had a texture continuous to pure magnesium in the substrate above. Moreover, a thickness of each metal coating layer was measured with the use of the observed image of the cross-section above, and it was approximately 0.5 mm (500 μm). It could thus be confirmed that this thickness was substantially the same as the thickness of the spacer above.

The SiC content in the portion where a composite of pure magnesium and SiC was made, that is, a portion except for the metal coating layer, in the obtained composite member was measured, and it was 80 volume %. The SiC content was measured as in Embodiment IV-1.

An area ratio (%) of the defect portion, difference in dimension (μm), and surface roughness Ra (μm) of the obtained composite member were measured. Then, the area ratio was 0.11%, the difference in dimension was 1 μm, and surface roughness Ra was 0.8 μm. It is noted that the difference in dimension was measured, without excluding a thickness of the metal coating layer. In addition, regarding surface roughness Ra, the surface of the metal coating layer was measured.

Coefficient of thermal expansion $\alpha$ (ppm/K) and thermal conductivity $\kappa$ (W/m·K) of the obtained composite member were measured as in Embodiment IV-1, and coefficient of thermal expansion $\alpha$ was 5.1 ppm/K and thermal conductivity $\kappa$ was 250 W/m·K.

From the foregoing, it can be seen that a composite member of high grade and excellent also in surface property, without large defects being locally present, is obtained in spite of its large size from which a circular region having a diameter exceeding 50 mm can be taken and in spite of having a metal coating layer, by cooling the infiltrated plate in one direction from the lower side thereof in the vertical direction toward the upper side in the vertical direction as in Embodiment IV-1. In addition, this composite member is also expected to suitably be made use of as a constituent material for a heat radiation member of a semiconductor element, because it is excellent in adaptability to a semiconductor element or peripherals thereof having a coefficient of thermal expansion around 4 ppm/K and also excellent in heat radiation characteristics. In particular, the composite member according to Embodiment IV-2 can be plated with Ni through electroplating, because it includes the metal coating layers on respective opposing surfaces of the substrate. Plating with Ni enhances solderability. Even in use in a semiconductor device for which application of solder is desired, the composite member can sufficiently adapt thereto. Further, since the surface of the substrate itself is smooth as described above, the surface of the metal coating layer is also smooth and hence plating can be formed to a uniform thickness.

In the composite member according to Embodiment IV-2, a thickness or a region to be formed of the metal coating layer can readily be varied by selecting a thickness or a shape of a plate-shaped spacer or the number of used spacers as appropriate. For example, a composite member including a metal coating layer only on one surface of the substrate is obtained by arranging a spacer only on one surface of the molded body (sintered body).

The present invention is not limited to the embodiments described above and it can be modified as appropriate without departing the gist of the present invention. For example, an SiC content in a composite member, a size, a shape, presence/absence of a network portion, a constituent material for the network portion, composition of a metal component (for example, composition of a magnesium alloy), a size of the composite member, a thickness of a metal coating layer, composition of the metal coating layer (a metal plate), a condition for making a composite, or the like can be varied as appropriate.

INDUSTRIAL APPLICABILITY

The composite member according to the present invention can suitably be made use of for a heat spreader of a semiconductor element, because it has excellent adaptability in coefficient of thermal expansion to the semiconductor element and peripherals thereof and has high thermal conductivity. The composite member manufacturing method according to the present invention can suitably be made use of for manufacturing the composite member above.

DESCRIPTION OF THE REFERENCE SIGNS

10 cast; 10*b* bottom surface portion; 10*e* end surface wall portion; 10*s* sidewall portion; 11 main body portion; 11*b* bottom surface; 11*m* metal placement surface; 11*s* SiC placement surface; 11*c* coupling surface; 12 lid portion; 12*i* inner surface; 13 screw; 20 sintered body (molded body); 30 atmosphere furnace; 31 vessel; 32, 34, 35 heat-insulating material; 33 heater; 40 water-cooled copper; 50 support base; 51 movable portion; M ingot; and S SiC aggregate.

The invention claimed is:

1. A heat radiation member formed from a composite member made of a composite of magnesium or a magnesium alloy and SiC, wherein:

said composite member contains more than 70 volume % of said SiC, said composite member has a coefficient of thermal expansion not lower than 3.7 ppm/K and not higher than 8 ppm/K, said composite member has porosity not higher than 8.5%, said composite member has thermal conductivity not lower than 180 W/m·K, said SiC has a network portion bonding said SiC to each other, and with any line segment having a length of 1 mm with respect to an actual dimension of said composite member being taken in a cross-section of said composite member, the number of intersections between said line segment and a contour line of an SiC aggregate constituted of said SiC and said network portion exceeds 50.

2. A semiconductor device, comprising:

the heat radiation member according to claim 1; and a semiconductor element mounted on the heat radiation member.

* * * * *